(12) United States Patent
Golko et al.

(10) Patent No.: US 10,090,619 B2
(45) Date of Patent: Oct. 2, 2018

(54) DUAL ORIENTATION CONNECTOR WITH EXTERNAL CONTACTS

(71) Applicant: Apple Inc., Cupertino, CA (US)

(72) Inventors: Albert J. Golko, Saratoga, CA (US);
Mathias W. Schmidt, Mountain View, CA (US); Eric S. Jol, San Jose, CA (US); Jahan Minoo, San Jose, CA (US); Ian Spraggs, San Francisco, CA (US); Cameron Frazier, San Carlos, CA (US); Fletcher Rothkopf, Los Altos, CA (US); Jonathan Aase, Redwood City, CA (US); Wendell Sander, Cupertino, CA (US); Jeffrey J. Terlizzi, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/839,704

(22) Filed: Dec. 12, 2017

(65) Prior Publication Data
US 2018/0145452 A1    May 24, 2018

Related U.S. Application Data

(63) Continuation of application No. 15/292,092, filed on Oct. 12, 2016, now Pat. No. 9,871,319, which is a
(Continued)

(51) Int. Cl.
*H01R 13/627* (2006.01)
*H05K 9/00* (2006.01)
(Continued)

(52) U.S. Cl.
CPC ....... *H01R 13/6273* (2013.01); *H01R 13/516* (2013.01); *H01R 13/58* (2013.01);
(Continued)

(58) Field of Classification Search
CPC ... H01R 13/6273; H01R 13/62; H01R 13/516
(Continued)

(56) References Cited

U.S. PATENT DOCUMENTS 2,380,994 A    8/1945 Pummill
2,564,029 A    8/1951 Peterson
(Continued)

FOREIGN PATENT DOCUMENTS

AU    2012101657    12/2012
AU    2012101658    12/2012
(Continued)

OTHER PUBLICATIONS

"1394b IEEE Standard for a High-Performance Serial Bus—Amendment 2.", IEEE Standard; [IEEE Standard]. IEEE, Piscataway. NJ. USA, Retrieved from the Internet:URL:http://ieeexplore.ieee.org/servlet/opacpunumber=8239>p. 24. paragraph, Mar. 6, 2003, 1-369 (of-record in parent application).
(Continued)

*Primary Examiner* — Alexander Gilman
(74) *Attorney, Agent, or Firm* — Kilpatrick Townsend & Stockton LLP

(57) ABSTRACT

A dual orientation connector having a connector tab with first and second major opposing sides and a plurality of electrical contacts carried by the connector tab. The plurality of contacts includes a first set of external contacts formed at the first major side and a second set of external contacts formed at the second major side. The first plurality of contacts are symmetrically spaced with the second plurality of contacts and the connector tab is shaped to have 180 degree symmetry so that it can be inserted and operatively coupled to a corresponding receptacle connector in either of two insertion orientations.

20 Claims, 39 Drawing Sheets

Related U.S. Application Data continuation of application No. 14/615,240, filed on Feb. 5, 2015, now Pat. No. 9,478,905, which is a continuation of application No. 13/700,441, filed as application No. PCT/US2011/038452 on May 27, 2011, now Pat. No. 8,998,632.

(60) Provisional application No. 61/349,737, filed on May 28, 2010, provisional application No. 61/353,126, filed on Jun. 9, 2010, provisional application No. 61/356,499, filed on Jun. 18, 2010, provisional application No. 61/407,363, filed on Oct. 27, 2010, provisional application No. 61/436,490, filed on Jan. 26, 2011, provisional application No. 61/436,545, filed on Jan. 26, 2011.

(51) Int. Cl.

| | | |
|---|---|---|
| *H01R 13/62* | (2006.01) | |
| *H01R 13/516* | (2006.01) | |
| *H01R 13/642* | (2006.01) | |
| *H01R 13/648* | (2006.01) | |
| *H01R 29/00* | (2006.01) | |
| *H01R 24/60* | (2011.01) | |
| *H01R 13/658* | (2011.01) | |
| *H01R 24/58* | (2011.01) | |
| *H01R 13/58* | (2006.01) | |
| *H01R 107/00* | (2006.01) | |

(52) U.S. Cl.
CPC ............ *H01R 13/62* (2013.01); *H01R 13/642* (2013.01); *H01R 13/6485* (2013.01); *H01R 13/658* (2013.01); *H01R 24/58* (2013.01); *H01R 24/60* (2013.01); *H01R 29/00* (2013.01); *H05K 9/0007* (2013.01); *H01R 2107/00* (2013.01); *H01R 2201/06* (2013.01)

(58) Field of Classification Search
USPC ......................................................... 439/345
See application file for complete search history.

(56) References Cited

U.S. PATENT DOCUMENTS

| | | | |
|---|---|---|---|
| 2,564,550 | A | 8/1951 | Tichenor |
| 2,792,557 | A | 5/1957 | Dowick |
| 2,892,990 | A | 6/1959 | Werndl |
| 3,760,335 | A | 9/1973 | Roberts |
| 3,793,614 | A | 2/1974 | Tachick et al. |
| 3,795,037 | A | 3/1974 | Luttmer |
| 4,361,375 | A | 11/1982 | Bailey et al. |
| 4,461,529 | A | 7/1984 | Fariss |
| 4,468,612 | A | 8/1984 | Starr |
| 4,558,912 | A | 12/1985 | Coller |
| 4,621,882 | A | 11/1986 | Krumme |
| 4,711,506 | A | 12/1987 | Tanaka |
| 4,792,986 | A | 12/1988 | Garner et al. |
| 4,968,929 | A | 11/1990 | Hauck et al. |
| 5,040,994 | A | 8/1991 | Nakamoto et al. |
| 5,256,074 | A | 10/1993 | Tan et al. |
| 5,295,843 | A | 3/1994 | Davis et al. |
| 5,380,179 | A | 1/1995 | Nishimura et al. |
| 5,380,225 | A | 1/1995 | Inaoka |
| 5,387,110 | A | 2/1995 | Kantner |
| 5,413,442 | A | 5/1995 | Grey |
| 5,442,243 | A * | 8/1995 | Bailey ................ B60R 25/20 307/10.5 |
| 5,511,985 | A | 4/1996 | Noschese et al. |
| 5,518,421 | A | 5/1996 | Davis |
| 5,554,042 | A | 9/1996 | Denninger |
| 5,594,284 | A * | 1/1997 | Hill ................... B60R 25/04 180/287 |
| 5,785,557 | A | 7/1998 | Davis |
| 5,959,848 | A | 9/1999 | Groves et al. |
| 5,967,723 | A | 10/1999 | Duran |
| 5,967,833 | A | 10/1999 | Cachina |
| 6,012,105 | A | 1/2000 | Rubbmark et al. |
| 6,073,201 | A | 6/2000 | Jolley et al. |
| 6,074,225 | A | 6/2000 | Wu et al. |
| 6,086,421 | A | 7/2000 | Wu et al. |
| 6,113,427 | A | 9/2000 | Wu |
| 6,145,037 | A | 11/2000 | Sakakibara |
| 6,176,723 | B1 | 1/2001 | Sakata et al. |
| 6,179,627 | B1 | 1/2001 | Daly et al. |
| 6,231,396 | B1 | 5/2001 | Huang |
| 6,322,394 | B1 | 11/2001 | Katoh et al. |
| 6,334,160 | B1 | 12/2001 | Emmert et al. |
| 6,364,699 | B1 | 4/2002 | Hwang et al. |
| 6,368,146 | B2 | 4/2002 | Abbott |
| 6,410,857 | B1 | 6/2002 | Gonya |
| 6,452,402 | B1 | 9/2002 | Kerai |
| 6,460,094 | B1 | 10/2002 | Hanson et al. |
| 6,482,028 | B2 | 11/2002 | Kumamoto et al. |
| 6,482,045 | B2 | 11/2002 | Arai |
| 6,488,520 | B1 | 12/2002 | Hayes et al. |
| 6,530,793 | B2 | 3/2003 | Eichhorn et al. |
| 6,671,814 | B1 | 12/2003 | Kubo et al. |
| 6,692,311 | B1 | 2/2004 | Kamei et al. |
| 6,716,058 | B2 | 4/2004 | Youn |
| 6,718,417 | B1 | 4/2004 | Bachrach |
| 6,776,665 | B2 | 8/2004 | Huang |
| 6,786,763 | B2 | 9/2004 | Wu |
| 6,836,814 | B2 | 12/2004 | Takaoka et al. |
| 6,846,202 | B1 | 1/2005 | Schmidt et al. |
| 6,869,320 | B2 | 3/2005 | Haas et al. |
| 6,902,432 | B2 | 6/2005 | Morikawa et al. |
| 6,908,340 | B1 | 6/2005 | Shafer |
| 6,948,965 | B2 | 9/2005 | Kumamoto et al. |
| 6,948,983 | B1 | 9/2005 | Peng |
| 6,948,984 | B2 | 9/2005 | Chen et al. |
| 6,962,510 | B1 * | 11/2005 | Chen .................. H01R 12/712 439/660 |
| 6,964,582 | B2 | 11/2005 | Zhuang et al. |
| 6,973,658 | B2 | 12/2005 | Nguyen |
| 6,981,887 | B1 | 1/2006 | Mese et al. |
| 6,994,575 | B1 | 2/2006 | Clark et al. |
| 7,021,971 | B2 | 4/2006 | Chou et al. |
| 7,039,731 | B2 | 5/2006 | Hasegawa |
| 7,040,919 | B2 | 5/2006 | Yao |
| 7,058,075 | B1 | 6/2006 | Wong et al. |
| 7,074,052 | B1 | 7/2006 | Ni et al. |
| 7,094,086 | B2 | 8/2006 | Teicher |
| 7,094,089 | B2 | 8/2006 | Andre et al. |
| 7,104,848 | B1 | 9/2006 | Chou et al. |
| 7,123,022 | B2 | 10/2006 | Parker et al. |
| 7,160,125 | B1 | 1/2007 | Teicher |
| 7,175,444 | B2 | 2/2007 | Lang et al. |
| 7,192,313 | B2 | 3/2007 | Sai |
| 7,198,522 | B1 | 4/2007 | Ho et al. |
| 7,216,191 | B2 | 5/2007 | Sagues et al. |
| 7,249,978 | B1 | 7/2007 | Ni |
| 7,277,966 | B2 | 10/2007 | Hanson et al. |
| 7,293,122 | B1 | 11/2007 | Schubert et al. |
| 7,352,289 | B1 | 4/2008 | Harris |
| 7,361,059 | B2 | 4/2008 | Harkabi et al. |
| 7,363,947 | B2 | 4/2008 | Teicher |
| 7,364,445 | B1 | 4/2008 | Ni et al. |
| 7,387,539 | B2 | 6/2008 | Trenne |
| 7,392,946 | B2 | 7/2008 | Hellström et al. |
| 7,396,257 | B2 * | 7/2008 | Takahashi ............ G06F 21/85 439/620.21 |
| 7,407,416 | B1 | 8/2008 | Rogers et al. |
| 7,435,107 | B2 | 10/2008 | Masumoto et al. |
| 7,440,286 | B2 | 10/2008 | Hiew et al. |
| 7,442,091 | B2 | 10/2008 | Salomon et al. |
| 7,458,825 | B2 | 12/2008 | Atsmon et al. |
| 7,463,042 | B2 | 12/2008 | Pereira |
| 7,496,671 | B2 | 2/2009 | Engel et al. |
| 7,500,861 | B2 | 3/2009 | Harkabi et al. |
| 7,537,471 | B2 | 5/2009 | Teicher |
| 7,549,896 | B2 | 6/2009 | Zhang et al. |
| 7,553,172 | B2 | 6/2009 | Chiu et al. |

(56) References Cited

U.S. PATENT DOCUMENTS

| | | | |
|---|---|---|---|
| 7,559,805 B1 * | 7/2009 | Yi | H01R 13/6658 439/660 |
| 7,572,153 B2 * | 8/2009 | Trenne | H01R 13/642 439/218 |
| 7,589,536 B2 | 9/2009 | Terlizzi et al. | |
| 7,591,657 B2 | 9/2009 | Teicher | |
| 7,594,827 B2 | 9/2009 | Takamoto et al. | |
| 7,644,250 B2 | 1/2010 | Zimmerman et al. | |
| 7,695,318 B1 * | 4/2010 | Wang | H01R 13/65802 439/607.01 |
| 7,706,573 B1 | 4/2010 | Motamedi et al. | |
| 7,716,400 B2 | 5/2010 | Raines | |
| 7,717,717 B1 * | 5/2010 | Lai | H01R 13/64 439/66 |
| 7,722,409 B2 | 5/2010 | Takamoto et al. | |
| 7,727,027 B2 | 6/2010 | Chiang et al. | |
| 7,740,498 B1 | 6/2010 | Orsley | |
| 7,841,894 B2 * | 11/2010 | Gong | H01R 12/712 439/540.1 |
| 7,863,906 B2 | 1/2011 | Terlizzi et al. | |
| 7,865,629 B1 | 1/2011 | Tantos et al. | |
| 7,872,873 B2 | 1/2011 | Hiew et al. | |
| 7,890,284 B2 | 2/2011 | Patterson et al. | |
| 7,892,014 B2 | 2/2011 | Amidon et al. | |
| 7,892,033 B2 | 2/2011 | Huang et al. | |
| 7,918,685 B1 | 4/2011 | Kruckenberg | |
| 7,969,702 B2 | 6/2011 | Herrmann | |
| 7,993,006 B2 | 8/2011 | D'Alessio et al. | |
| 8,007,309 B2 | 8/2011 | Fan | |
| 8,062,073 B1 * | 11/2011 | Szczesny | G02B 6/4246 439/660 |
| 8,109,795 B2 | 2/2012 | Lin et al. | |
| 8,162,696 B2 | 4/2012 | Elbaz et al. | |
| 8,246,388 B2 | 8/2012 | Chen et al. | |
| 8,277,258 B1 | 10/2012 | Huang et al. | |
| 8,282,417 B2 | 10/2012 | Xiao | |
| 8,287,299 B2 | 10/2012 | Ray et al. | |
| 8,342,863 B2 | 1/2013 | Kondo et al. | |
| 8,461,465 B2 | 6/2013 | Golko et al. | |
| 8,478,912 B2 | 7/2013 | Liu et al. | |
| 8,478,913 B2 | 7/2013 | Terlizzi et al. | |
| 8,517,751 B1 | 8/2013 | Golko et al. | |
| 8,517,766 B2 | 8/2013 | Golko et al. | |
| 8,535,075 B1 | 9/2013 | Golko et al. | |
| 8,545,269 B2 | 10/2013 | Ore-Yang | |
| 8,545,275 B2 | 10/2013 | Wang et al. | |
| 8,561,879 B2 | 10/2013 | Jol et al. | |
| 8,573,995 B2 | 11/2013 | Golka et al. | |
| 8,647,156 B2 | 2/2014 | Golko et al. | |
| 8,686,600 B2 | 4/2014 | Terlizzi et al. | |
| 8,688,876 B1 | 4/2014 | Fritchman et al. | |
| 8,708,745 B2 | 4/2014 | Golko et al. | |
| 8,762,605 B2 | 6/2014 | Terlizzi et al. | |
| RE45,050 E | 7/2014 | Terlizzi et al. | |
| 8,777,666 B2 | 7/2014 | Golko et al. | |
| 8,806,067 B2 | 8/2014 | Terlizzi et al. | |
| 8,882,524 B2 | 11/2014 | Golko et al. | |
| 8,911,260 B2 | 12/2014 | Golko et al. | |
| 8,931,962 B2 | 1/2015 | Jol et al. | |
| RE45,492 E | 4/2015 | Terlizzi et al. | |
| 8,998,632 B2 * | 4/2015 | Golko | H01R 13/516 439/345 |
| 9,054,477 B2 | 6/2015 | Brickner et al. | |
| 9,059,531 B2 | 6/2015 | Schmidt et al. | |
| 9,093,803 B2 | 7/2015 | Soohoo et al. | |
| 9,106,031 B2 | 8/2015 | Golko et al. | |
| 9,112,327 B2 | 8/2015 | Sarwar et al. | |
| 9,118,990 B2 | 8/2015 | Hankey et al. | |
| 9,142,926 B2 | 9/2015 | Tsai | |
| 9,153,895 B2 | 10/2015 | Kao et al. | |
| 9,160,115 B2 | 10/2015 | Kao et al. | |
| 9,160,129 B2 | 10/2015 | Brickner et al. | |
| 9,293,876 B2 | 3/2016 | Terlizzi et al. | |
| 9,478,905 B2 | 10/2016 | Golko et al. | |
| 9,871,319 B2 * | 1/2018 | Golko | H01R 13/6273 |
| 9,979,139 B2 * | 5/2018 | Golko | H01R 13/6691 |
| 2001/0046809 A1 | 11/2001 | Chiran et al. | |
| 2002/0081880 A1 | 6/2002 | Eichhorn et al. | |
| 2003/0012677 A1 | 1/2003 | Senini | |
| 2003/0016509 A1 * | 1/2003 | Tsukamoto | H01R 12/592 361/760 |
| 2003/0068033 A1 | 4/2003 | Kiko | |
| 2003/0207606 A1 | 11/2003 | Ho | |
| 2003/0220988 A1 | 11/2003 | Hymel | |
| 2004/0023560 A1 | 2/2004 | Swoboda | |
| 2004/0051860 A1 | 3/2004 | Honda et al. | |
| 2004/0229515 A1 | 11/2004 | Kaneda et al. | |
| 2004/0259423 A1 | 12/2004 | Elbaz et al. | |
| 2005/0013436 A1 | 1/2005 | Tanaka | |
| 2005/0014418 A1 | 1/2005 | Ji et al. | |
| 2005/0015525 A1 | 1/2005 | Cahill et al. | |
| 2005/0021890 A1 | 1/2005 | Baker et al. | |
| 2005/0032426 A1 | 2/2005 | Tanaka | |
| 2005/0042930 A1 * | 2/2005 | Harkabi | H01R 27/00 439/660 |
| 2005/0079738 A1 * | 4/2005 | Ahn | H01R 13/447 439/1 |
| 2005/0085136 A1 | 4/2005 | Zhang et al. | |
| 2005/0097212 A1 | 5/2005 | Engel et al. | |
| 2005/0124217 A1 | 6/2005 | Zhuang et al. | |
| 2005/0124218 A1 | 6/2005 | Chen et al. | |
| 2005/0124219 A1 | 6/2005 | Chen et al. | |
| 2005/0202727 A1 * | 9/2005 | Andre | H01R 12/7088 439/660 |
| 2005/0246477 A1 | 11/2005 | Adams et al. | |
| 2005/0251589 A1 | 11/2005 | Wang | |
| 2006/0013553 A1 | 1/2006 | Imai et al. | |
| 2006/0019545 A1 * | 1/2006 | Moriyama | H01R 13/26 439/660 |
| 2006/0024997 A1 | 2/2006 | Teicher | |
| 2006/0040549 A1 * | 2/2006 | Yao | H01R 29/00 439/502 |
| 2006/0047861 A1 | 3/2006 | Hung et al. | |
| 2006/0047982 A1 | 3/2006 | Lo et al. | |
| 2006/0148019 A1 | 7/2006 | Huang et al. | |
| 2006/0156415 A1 | 7/2006 | Rubinstein et al. | |
| 2006/0216991 A1 * | 9/2006 | Boutros | H01R 13/6275 439/358 |
| 2006/0250764 A1 | 11/2006 | Howarth et al. | |
| 2006/0289201 A1 | 12/2006 | Kim et al. | |
| 2006/0294272 A1 | 12/2006 | Chou et al. | |
| 2007/0001691 A1 | 1/2007 | Pereira | |
| 2007/0010115 A1 | 1/2007 | Teicher | |
| 2007/0010116 A1 | 1/2007 | Teicher | |
| 2007/0037452 A1 | 2/2007 | Martin et al. | |
| 2007/0049100 A1 | 3/2007 | Tsai | |
| 2007/0058155 A1 | 3/2007 | Booker | |
| 2007/0072442 A1 | 3/2007 | DiFonzo et al. | |
| 2007/0082634 A1 | 4/2007 | Thijssen et al. | |
| 2007/0082701 A1 | 4/2007 | Seil et al. | |
| 2007/0178771 A1 | 8/2007 | Goetz et al. | |
| 2007/0201170 A1 | 8/2007 | Hooper | |
| 2007/0202725 A1 * | 8/2007 | Teicher | H01R 27/00 439/173 |
| 2007/0243726 A1 | 10/2007 | Trenne | |
| 2007/0245058 A1 | 10/2007 | Wurzburg et al. | |
| 2007/0287302 A1 | 12/2007 | Lindberg et al. | |
| 2008/0032562 A1 | 2/2008 | McHugh et al. | |
| 2008/0067248 A1 | 3/2008 | Hiew et al. | |
| 2008/0090465 A1 | 4/2008 | Matsumoto et al. | |
| 2008/0119076 A1 * | 5/2008 | Teicher | H01R 13/64 439/171 |
| 2008/0119291 A1 | 5/2008 | Takamoto et al. | |
| 2008/0156885 A1 | 7/2008 | Landau et al. | |
| 2008/0164934 A1 | 7/2008 | Hankey et al. | |
| 2008/0167828 A1 | 7/2008 | Terlizzi et al. | |
| 2008/0200069 A1 | 8/2008 | Hankey et al. | |
| 2008/0274633 A1 | 11/2008 | Teicher | |
| 2008/0309313 A1 | 12/2008 | Farrar et al. | |
| 2008/0320190 A1 | 12/2008 | Lydon et al. | |
| 2009/0004923 A1 | 1/2009 | Tang et al. | |
| 2009/0011621 A1 | 1/2009 | Trenne | |

(56) References Cited

U.S. PATENT DOCUMENTS

| | | |
|---|---|---|
| 2009/0061678 A1 | 3/2009 | Minoo et al. |
| 2009/0108848 A1 | 4/2009 | Lundquist et al. |
| 2009/0117768 A1 | 5/2009 | Liao |
| 2009/0132076 A1 | 5/2009 | Holden et al. |
| 2009/0149049 A1 | 6/2009 | Harkabi et al. |
| 2009/0156027 A1 | 6/2009 | Chen |
| 2009/0180243 A1 | 7/2009 | Lynch et al. |
| 2009/0193180 A1 | 7/2009 | Ito |
| 2009/0267613 A1 | 10/2009 | Terlizzi et al. |
| 2009/0268743 A1 | 10/2009 | Chang et al. |
| 2009/0273764 A1 | 11/2009 | D'Alessio et al. |
| 2009/0291576 A1 | 11/2009 | Johansson et al. |
| 2010/0009575 A1 | 1/2010 | Croojimans et al. |
| 2010/0062656 A1 | 3/2010 | Lynch et al. |
| 2010/0075604 A1 | 3/2010 | Lydon et al. |
| 2010/0080563 A1 | 4/2010 | DiFonzo et al. |
| 2010/0081337 A1 | 4/2010 | Dorogusker et al. |
| 2010/0087096 A1 | 4/2010 | Sloey et al. |
| 2010/0104126 A1 | 4/2010 | Greene |
| 2010/0115817 A1 | 5/2010 | Faifer |
| 2010/0118932 A1 | 5/2010 | Luo et al. |
| 2010/0171465 A1 | 7/2010 | Seal et al. |
| 2010/0173533 A1 | 7/2010 | Yang et al. |
| 2010/0180063 A1 | 7/2010 | Ananny et al. |
| 2010/0221936 A1 | 9/2010 | Zhao et al. |
| 2010/0235546 A1 | 9/2010 | Terlizzi et al. |
| 2010/0248544 A1* | 9/2010 | Xu .................. H01R 13/6658 439/607.04 |
| 2010/0254602 A1 | 10/2010 | Yoshino |
| 2010/0254662 A1 | 10/2010 | He et al. |
| 2010/0262744 A1 | 10/2010 | Deva et al. |
| 2010/0267261 A1* | 10/2010 | Lin .................. H01R 13/6461 439/218 |
| 2010/0267262 A1 | 10/2010 | Lin et al. |
| 2010/0279554 A1 | 11/2010 | Steijner |
| 2011/0055407 A1 | 3/2011 | Lydon et al. |
| 2011/0093624 A1 | 4/2011 | Crumlin et al. |
| 2011/0126005 A1 | 5/2011 | Carpenter et al. |
| 2011/0136381 A1 | 6/2011 | Cho |
| 2011/0159719 A1 | 6/2011 | Takahashi et al. |
| 2011/0167176 A1 | 7/2011 | Yew et al. |
| 2011/0201213 A1 | 8/2011 | Dabov et al. |
| 2011/0250786 A1 | 10/2011 | Reid |
| 2011/0263141 A1 | 10/2011 | Ko |
| 2011/0288818 A1 | 11/2011 | Thierman et al. |
| 2011/0294354 A1* | 12/2011 | Chen .................. H01R 12/724 439/660 |
| 2011/0312200 A1 | 12/2011 | Wang et al. |
| 2011/0317835 A1 | 12/2011 | Laird et al. |
| 2012/0028495 A1 | 2/2012 | Su et al. |
| 2012/0047368 A1 | 2/2012 | Chinn et al. |
| 2012/0149244 A1 | 6/2012 | Zheng et al. |
| 2012/0270419 A1 | 10/2012 | Shahoian et al. |
| 2013/0075149 A1 | 3/2013 | Golko et al. |
| 2013/0078869 A1 | 3/2013 | Golko et al. |
| 2013/0089291 A1 | 4/2013 | Jol et al. |
| 2013/0095701 A1 | 4/2013 | Golko et al. |
| 2013/0095702 A1 | 4/2013 | Golko et al. |
| 2013/0115817 A1 | 5/2013 | Terlizzi et al. |
| 2013/0115821 A1* | 5/2013 | Golko .................. H01R 13/516 439/638 |
| 2013/0117470 A1 | 5/2013 | Terlizzi et al. |
| 2013/0122754 A1 | 5/2013 | Golko et al. |
| 2013/0149911 A1 | 6/2013 | Golko et al. |
| 2013/0217253 A1 | 8/2013 | Golko et al. |
| 2013/0244489 A1 | 9/2013 | Terlizzi et al. |
| 2013/0244491 A1 | 9/2013 | Sarwar et al. |
| 2013/0244492 A1 | 9/2013 | Golko et al. |
| 2013/0286523 A1 | 10/2013 | Mullins et al. |
| 2013/0337698 A1 | 12/2013 | Little et al. |
| 2014/0004741 A1 | 1/2014 | Jol et al. |
| 2014/0057496 A1* | 2/2014 | Siahaan .................. H01R 13/504 439/660 |
| 2014/0068933 A1* | 3/2014 | Brickner .................. B24B 41/06 29/874 |
| 2014/0069709 A1* | 3/2014 | Schmidt .................. H01R 13/6581 174/520 |
| 2014/0073170 A1* | 3/2014 | Golko .................. H01R 13/6275 439/350 |
| 2014/0073183 A1* | 3/2014 | Golko .................. H01R 13/6594 439/607.34 |
| 2014/0073193 A1 | 3/2014 | SooHoo et al. |
| 2014/0075067 A1 | 3/2014 | Mullins et al. |
| 2014/0170907 A1 | 6/2014 | Golko et al. |
| 2014/0181328 A1 | 6/2014 | Terlizzi et al. |
| 2014/0206209 A1* | 7/2014 | Kamei .................. H01R 24/60 439/81 |
| 2014/0235095 A1 | 8/2014 | Jones et al. |
| 2014/0294656 A1* | 10/2014 | Brickner .................. H01R 43/18 419/28 |
| 2014/0329416 A1* | 11/2014 | Golko .................. H01R 29/00 439/676 |
| 2014/0335729 A1 | 11/2014 | Little et al. |
| 2015/0155657 A1 | 6/2015 | Golko et al. |
| 2017/0033496 A1 | 2/2017 | Golko et al. |

FOREIGN PATENT DOCUMENTS

| | | |
|---|---|---|
| AU | 2012101661 | 12/2012 |
| AU | 2011257975 | 10/2014 |
| CN | 1049302 | 2/2000 |
| CN | 1397804 | 2/2003 |
| CN | 1767271 | 5/2006 |
| CN | 1830122 | 9/2006 |
| CN | 1878370 | 12/2006 |
| CN | 1905286 | 1/2007 |
| CN | 101015096 | 8/2007 |
| CN | 101116227 | 1/2008 |
| CN | 100474709 | 4/2009 |
| CN | 201256225 | 6/2009 |
| CN | 201402871 | 2/2010 |
| CN | 201509210 | 6/2010 |
| CN | 101782888 | 7/2010 |
| CN | 101783466 | 7/2010 |
| CN | 201533091 | 7/2010 |
| CN | 201946773 | 8/2011 |
| CN | 102934296 | 2/2013 |
| CN | 103081252 | 5/2013 |
| CN | 103094783 | 5/2013 |
| CN | 103124011 | 5/2013 |
| CN | 103140995 | 6/2013 |
| CN | 203218514 | 9/2013 |
| CN | 203277900 | 11/2013 |
| CN | 103682785 | 3/2014 |
| CN | 103682898 | 3/2014 |
| CN | 103931060 | 7/2014 |
| CN | 103947056 | 7/2014 |
| CN | 103682785 | 12/2014 |
| CN | 105703112 | 6/2016 |
| DE | 19609571 | 5/1997 |
| DE | 202004012084 | 11/2004 |
| DE | 202004021354 | 9/2007 |
| DE | 202012010662 | 4/2013 |
| DE | 202012010672 | 4/2013 |
| DE | 202012010673 | 4/2013 |
| DE | 102012220231 | 5/2013 |
| DE | 102012220256 | 5/2013 |
| DE | 202012011666 | 5/2013 |
| DE | 102013207407 | 3/2014 |
| EP | 0081372 | 6/1983 |
| EP | 1684391 | 7/2006 |
| EP | 1717910 | 11/2006 |
| EP | 2034423 | 3/2009 |
| EP | 2037294 | 3/2009 |
| EP | 2169774 | 3/2010 |
| EP | 2373131 | 10/2011 |
| EP | 2590274 | 5/2013 |
| FR | 2138961 A1 | 1/1973 |
| GB | 2496738 | 5/2013 |
| GB | 2496962 | 6/2014 |
| GB | 2510490 | 7/2015 |

(56) References Cited

FOREIGN PATENT DOCUMENTS

| | | |
|---|---|---|
| HK | 1179054 | 9/2013 |
| IN | 10183CHENP2012 | 12/2014 |
| JP | 2078171 | 3/1990 |
| JP | 06155974 | 6/1994 |
| JP | 06231821 | 8/1994 |
| JP | H06231821 | 8/1994 |
| JP | 06250103 | 9/1994 |
| JP | 08321360 | 12/1996 |
| JP | 2001223057 | 8/2001 |
| JP | 2003217728 A1 | 7/2003 |
| JP | 2004079491 A1 | 3/2004 |
| JP | 2004319371 | 11/2004 |
| JP | 2006309771 | 11/2006 |
| JP | 2008041656 | 2/2008 |
| JP | 2008508694 | 3/2008 |
| JP | 2008210674 | 9/2008 |
| JP | 2009117128 | 5/2009 |
| JP | 2010067459 | 3/2010 |
| JP | 2003217728 | 8/2011 |
| JP | 5771752 | 7/2015 |
| KR | 1020060123435 | 12/2006 |
| KR | 1020070039956 | 4/2007 |
| KR | 1020090056918 | 6/2009 |
| KR | 1020110061283 | 6/2011 |
| KR | 1020110065543 | 6/2011 |
| KR | 1020130031893 | 3/2013 |
| KR | 101521691 | 5/2015 |
| KR | 101522628 | 5/2015 |
| MX | 328570 | 3/2015 |
| RU | 2544839 | 3/2015 |
| RU | 2562914 | 9/2015 |
| TH | 131487 | 2/2014 |
| TH | 149513 | 5/2016 |
| TW | 176423 | 1/1992 |
| TW | 451527 | 8/2001 |
| TW | 200534675 | 10/2005 |
| TW | 1717910 A2 | 11/2006 |
| TW | M318831 | 9/2007 |
| TW | M327102 | 2/2008 |
| TW | M350153 | 2/2009 |
| TW | M376988 | 3/2010 |
| TW | 201021329 | 6/2010 |
| TW | 201101601 | 1/2011 |
| TW | 201214899 | 4/2012 |
| TW | 201329721 | 7/2013 |
| TW | 201332232 | 8/2013 |
| TW | I452784 | 9/2014 |
| TW | 201445836 | 12/2014 |
| VN | 39250 | 9/2014 |
| WO | 0208872 | 1/2002 |
| WO | 2002008872 | 1/2002 |
| WO | 2004097995 A1 | 11/2004 |
| WO | 2005013436 | 2/2005 |
| WO | 2005124932 | 12/2005 |
| WO | 2006013553 | 2/2006 |
| WO | 2006074348 | 7/2006 |
| WO | 2007058155 | 5/2007 |
| WO | 2007090069 | 8/2007 |
| WO | 2008065659 | 6/2008 |
| WO | 2009069969 | 6/2009 |
| WO | 2009140992 | 11/2009 |
| WO | 2010039656 | 4/2010 |
| WO | 2010141147 | 12/2010 |
| WO | 2011043488 | 4/2011 |
| WO | 2011150402 | 12/2011 |
| WO | 2011150403 | 12/2011 |
| WO | 2011156653 | 12/2011 |
| WO | 2011160138 | 12/2011 |
| WO | 2011163256 | 12/2011 |
| WO | 2011160138 A3 | 3/2012 |
| WO | 2012086145 | 6/2012 |
| WO | 2012103383 | 8/2012 |
| WO | 2012103393 | 8/2012 |
| WO | 2012103383 | 10/2012 |
| WO | 2011150403 | 2/2013 |
| WO | 2013070753 | 5/2013 |
| WO | 2013070767 | 5/2013 |
| WO | 2013081704 | 6/2013 |
| WO | 2013082175 | 6/2013 |
| WO | 2013070753 | 10/2013 |
| WO | 2013082175 | 11/2013 |
| WO | 2014039114 | 3/2014 |

OTHER PUBLICATIONS

"An Overview of Current Display Interfaces", http://isvpatch.external.hp.com/H P PTF2/drvl ib/docs/DisplayInterfacesOverview.pdf, Nov. 2007, p. 12 (of-record in parent application).

12191619.1 , "Extended European Search Report received for EP Application No. 12191619.1", dated Jul. 10, 2013, 13 Pages (of-record in parent application).

U.S. Appl. No. 13/232,978 , "Office Action", dated May 7, 2012, 18 pages (of-record in parent application).

U.S. Appl. No. 13/232,978 , "Office Action", dated Nov. 6, 2012, 31 pages (of-record in parent application).

U.S. Appl. No. 13/232,989 , "Office Action", dated Feb. 24, 2012, 10 pages (of-record in parent application).

U.S. Appl. No. 13/232,989 , "Office Action", dated May 25, 2012, 21 pages (of-record in parent application).

U.S. Appl. No. 13/607,366 , "Non Final Office Action", dated Jul. 11, 2013, 7 pages (of-record in parent application).

U.S. Appl. No. 13/607,366 , "Notice of Allowance", dated Oct. 31, 2013, 9 pages (of-record in parent application).

U.S. Appl. No. 13/607,426 , "Non-Final Office Action", dated Nov. 14, 2013, 16 pages (of-record in parent application).

U.S. Appl. No. 13/607,430 , "Non-Final Office Action", dated Nov. 26, 2014, 20 pages (of-record in parent application).

U.S. Appl. No. 13/607,430 , "Notice of Allowance", dated Apr. 29, 2015, 7 pages (of-record in parent application).

U.S. Appl. No. 13/607,550 , "Non-Final Office Action", dated Aug. 14, 2015, 14 pages (of-record in parent application).

U.S. Appl. No. 13/607,550 , "Notice of Allowance", dated Dec. 18, 2015, 7 pages (of-record in parent application).

U.S. Appl. No. 13/607,566 , "Non-Final Office Action", dated Dec. 6, 2013, 9 pages (of-record in parent application).

U.S. Appl. No. 13/610,631 , "Notice of Allowance", dated Mar. 17, 2015, 8 pages (of-record in parent application).

U.S. Appl. No. 13/610,777 , "Non-Final Office Action", dated Jan. 26, 2015, 7 pages (of-record in parent application).

U.S. Appl. No. 13/610,777 , "Notice of Allowance", dated May 13, 2015, 8 pages (of-record in parent application).

U.S. Appl. No. 13/650,062 , "Final Office Action", dated Apr. 6, 2015, 7 pages (of-record in parent application).

U.S. Appl. No. 13/650,062 , "Non-Final Office Action", dated Jan. 12, 2015, 19 pages (of-record in parent application).

U.S. Appl. No. 13/650,062 , "Notice of Allowance", dated Jun. 12, 2015, 22 pages (of-record in parent application).

U.S. Appl. No. 13/679,637 , "Final Office Action", dated Sep. 5, 2013, 22 pages (of-record in parent application).

U.S. Appl. No. 13/679,637 , "Non-Final Office Action", dated Apr. 22, 2013, 21 pages (of-record in parent application).

U.S. Appl. No. 13/679,637 , "Notice of Allowance", dated Jul. 8, 2014, 4 pages (of-record in parent application).

U.S. Appl. No. 13/679,637 , "Notice of Allowance", dated Dec. 17, 2013, 7 pages (of-record in parent application).

U.S. Appl. No. 13/679,637 , "Supplemental Notice of Allowance", dated Jul. 8, 2014, 4 pages (of-record in parent application).

U.S. Appl. No. 13/679,991 , "Non-Final Office Action", dated Apr. 5, 2013, 9 pages (of-record in parent application).

U.S. Appl. No. 13/679,991 , "Notice of Allowance", dated Jul. 10, 2013, 8 pages (of-record in parent application).

U.S. Appl. No. 13/679,992 , "Non-Final Office Action", dated Apr. 9, 2013, 9 pages (of-record in parent application).

U.S. Appl. No. 13/679,992 , "Notice of Allowance", dated Jun. 11, 2013, 6 pages (of-record in parent application).

U.S. Appl. No. 13/679,996 , "Notice of Allowance", dated Apr. 12, 2013, 16 pages (of-record in parent application).

(56) References Cited

OTHER PUBLICATIONS

U.S. Appl. No. 13/679,999, "Final Office Action", dated Nov. 12, 2013, 13 pages (of-record in parent application).
U.S. Appl. No. 13/700,441, "Final Office Action", dated Aug. 21, 2014, 9 pages (of-record in parent application).
U.S. Appl. No. 13/700,441, "Non-Final Office Action", dated Apr. 10, 2014, 16 pages (of-record in parent application).
U.S. Appl. No. 13/700,441, "Notice of Allowance", dated Nov. 10, 2014, 6 Pages (of-record in parent application).
U.S. Appl. No. 13/704,236, "Non-Final Office Action", dated May 19, 2014, 9 pages (of-record in parent application).
U.S. Appl. No. 13/704,236, "Notice of Allowance", dated Sep. 17, 2014, 9 pages (of-record in parent application).
U.S. Appl. No. 13/720,822, "Notice of Allowance", dated Apr. 8, 2013, 12 pages (of-record in parent application).
U.S. Appl. No. 13/721,522, "Non Final Office action", dated May 22, 2013, 11 pages (of-record in parent application).
U.S. Appl. No. 13/721,522, "Notice of Allowance", dated Nov. 14, 2013, 11 pages (of-record in parent application).
U.S. Appl. No. 13/738,932, "Notice of Allowance", dated May 1, 2013, 13 pages (of-record in parent application).
U.S. Appl. No. 13/761,001, "Notice of Allowance", dated Sep. 10, 2013, 6 pages (of-record in parent application).
U.S. Appl. No. 13/875,637, "Non-Final Office Action", dated Dec. 26, 2014, 11 pages (of-record in parent application).
U.S. Appl. No. 13/875,637, "Notice of Allowance", dated Feb. 11, 2015, 7 pages (of-record in parent application).
U.S. Appl. No. 14/160,528, "Notice of Allowance", dated Feb. 9, 2016, 7 pages (of-record in parent application).
U.S. Appl. No. 14/192,555, "Final Office Action", dated Oct. 8, 2015, 33 pages (of-record in parent application).
U.S. Appl. No. 14/192,555, "Non-Final Office Action", dated Jun. 6, 2016, 31 pages (of-record in parent application).
U.S. Appl. No. 14/192,555, "Non-Final Office Action", dated Apr. 28, 2015, 33 pages (of-record in parent application).
U.S. Appl. No. 14/192,555, "Non-Final Office Action", dated Dec. 1, 2014, 34 pages (of-record in parent application).
U.S. Appl. No. 14/357,200, "Non-Final Office Action", dated Nov. 9, 2015, 11 pages (of-record in parent application).
U.S. Appl. No. 14/615,240, "Non-Final Office Action", dated Feb. 1, 2016, 13 pages (of-record in parent application).
U.S. Appl. No. 14/615,240, "Notice of Allowance", dated Jun. 21, 2016, 7 pages (of-record in parent application).
U.S. Appl. No. 14/807,604, "Notice of Allowance", dated Mar. 15, 2016, 5 pages (of-record in parent application).
U.S. Appl. No. 15/292,092, "Non-Final Office Action", dated Apr. 28, 2017, 11 pages (of-record in parent application).
U.S. Appl. No. 15/292,092, "Notice of Allowance", dated Sep. 21, 2017, 7 pages (of-record in parent application).
AU2011257975, "Examination Report", dated Dec. 16, 2013, 6 pages (of-record in parent application).
AU2011257975, "Notice of Acceptance", dated Sep. 27, 2014, 3 pages (of-record in parent application).
AU2012101657, "Innovation Patent Examination Report No. 1", dated Dec. 14, 2012, 4 pages (of-record in parent application).
AU2012101661, "Office Action Response", dated Mar. 6, 2013, 7 Pages (of-record in parent application).
AU2014256357, "Examination Report", dated Mar. 3, 2015, 2 pages (of-record in parent application).
AU2014256357, "Notice of Acceptance", dated May 19, 2015, 3 pages (of-record in parent application).
AU2015230752, "First Examiner Report", dated Apr. 1, 2016, 2 pages (of-record in parent application).
AU2015230752, "Notice of Acceptance", dated Sep. 15, 2016, 2 pages (of-record in parent application).
CA2,794,877, "Notice of Allowance", dated Sep. 2, 2015, 1 page (of-record in parent application).
CA2,794,877, "Office Action", dated Nov. 8, 2013, 3 Pages (of-record in parent application).
CA2,794,877, "Office Action", dated Sep. 23, 2014, 3 pages (of-record in parent application).
CA2,800,738, "Notice of Allowance", dated Sep. 29, 2015, 1 page (of-record in parent application).
CA2,800,738, "Office Action", dated May 8, 2014, 2 pages (of-record in parent application).
CA2,800,738, "Office Action", dated Dec. 2, 2014, 2 pages (of-record in parent application).
CA2,911,731, "Notice of Allowance", dated Feb. 22, 2016, 1 page (of-record in parent application).
CN201180034957.2, "Office Action", dated Dec. 22, 2014, 17 pages (of-record in parent application).
CN201180034957.2, "Office Action", dated Aug. 28, 2015, 7 pages (of-record in parent application).
CN201180034957.2, "Office Action", dated Feb. 18, 2013, Pages (of-record in parent application).
CN201210442307.8, "Notice of Decision to Grant", dated Nov. 12, 2015, 2 pages (of-record in parent application).
CN201210442307.8, "Office Action", dated Sep. 4, 2014, 12 pages (of-record in parent application).
CN201210442307.8, "Office Action", dated May 11, 2015, 5 pages (of-record in parent application).
CN201220584711.4, "Office Action", dated Mar. 15, 2013, 4 Pages (of-record in parent application).
CN201280056035.6, "Office Action", dated Jan. 29, 2016, 16 pages (of-record in parent application).
CN201280056035.6, "Office Action", dated Sep. 23, 2016, 7 pages (of-record in parent application).
CN201280056344.3, "Office Action", dated Sep. 25, 2015, 17 pages (of-record in parent application).
CN201310711187.1, "Office Action", dated Jul. 14, 2014, 5 pages (of-record in parent application).
EP11723214.0, "Office Action", dated Jul. 4, 2016, 5 pages (of-record in parent application).
EP11723214.0, "Office Action", dated May 24, 2017, 7 pages (of-record in parent application).
EP12191580.5, "Extended European Search Report Received", dated Dec. 11, 2013, 10 pages (of-record in parent application).
EP12191580.5, "Office Action", dated Jan. 28, 2016, 4 pages (of-record in parent application).
EP12191580.5, "Partial European Search Report", dated Aug. 21, 2013, 6 pages (of-record in parent application).
EP12191619.1, "Extended European Search Report", dated Jul. 10, 2013, 13 pages (of-record in parent application).
EP12191619.1, "Partial European Search Report", dated Feb. 20, 2013, 8 pages (of-record in parent application).
EP12769210.1, "Office Action", dated Sep. 27, 2016, 8 pages (of-record in parent application).
EP12806227.0, "Office Action", dated Jun. 6, 2016, 10 pages (of-record in parent application).
EP13165082.2, "Extended European Search Report Received", dated Sep. 24, 2013, 7 Pages (of-record in parent application).
EP13165270.3, "Extended European Search Report", dated Nov. 28, 2014, 12 pages (of-record in parent application).
EP13165892.4, "Extended European Search Report Received", dated Dec. 20, 2013, 15 Pages (of-record in parent application).
EP13195854.8, "European Search Report", dated Mar. 12, 2014, 7 pages (of-record in parent application).
EP14152776.2, "Extended European Search Report", dated Mar. 11, 2014, 9 pages (of-record in parent application).
EP14152776.2, "Office Action", dated Mar. 3, 2015, 5 pages (of-record in parent application).
GB1220045.7, "Combined search & Examination Report", dated Mar. 15, 2013, 7 pages (of-record in parent application).
GB1220073.9, "Notice of Acceptance", dated May 20, 2014, 2 pages (of-record in parent application).
GB1220073.9, "Office Action", dated Jan. 16, 2014, 3 pages (of-record in parent application).
GB1220073.9, "Office Action", dated Mar. 22, 2013, 6 pages (of-record in parent application).
GB1322782.2, "Office Action", dated Oct. 14, 2014, 4 Pages (of-record in parent application).

(56) References Cited

OTHER PUBLICATIONS

GB1322782.2 , "Office Action", dated Jan. 21, 2015, 5 pages (of-record in parent application).
GB1322782.2 , "Office Action", dated May 30, 2014, 6 pages (of-record in parent application).
JP2013-512061 , "Notice of Decision to Grant", dated Jan. 5, 2016, 3 pages (of-record in parent application).
JP2013-512061 , "Office Action", dated Dec. 24, 2014, 4 pages (of-record in parent application).
JP2014-540217 , "Office Action", dated Jun. 19, 2015, 3 pages (of-record in parent application).
JP2014-540217 , "Office Action", dated Mar. 2, 2015, 4 pages (of-record in parent application).
KR10-2012-0125748 , "Notice of Allowance", dated Apr. 23, 2015, 2 pages (of-record in parent application).
KR10-2012-0125748 , "Office Action", dated Aug. 28, 2014, 6 pages (of-record in parent application).
KR10-2012-0125748 , "Office Action", dated Jan. 21, 2014, 6 pages (of-record in parent application).
KR10-2012-7034333 , "Notice of Allowance", dated May 1, 2015, 3 pages (of-record in parent application).
KR10-2012-7034333 , "Office Action", dated Nov. 26, 2014, 3 pages (of-record in parent application).
KR10-2012-7034333 , "Office Action", dated Apr. 29, 2014, 4 pages (of-record in parent application).
KR10-2014-7016946 , "Notice of Decision to Grant", dated Jan. 22, 2016, 2 pages (of-record in parent application).
KR10-2014-7016946 , "Office Action", dated Jun. 2, 2015, 6 pages (of-record in parent application).
KR10-2014-7016946 , "Office Action", dated May 21, 2015, 6 pages (of-record in parent application).
KR10-2014-7017708 , "Office Action", dated Jul. 1, 2015, 9 pages (of-record in parent application).
Levy , "Flipper USB product advertisement, press releases, and news articles", available online at : http://www.flipperusb.com, Jun. 25, 2010, 1 page (of-record in parent application).
MX/A/2012/013857 , "Notice of Allowance", dated Jan. 27, 2015, 1 page (of-record in parent application).
MX/A/2012/013857 , "Office Action", dated Aug. 28, 2014, 2 pages (of-record in parent application).
MX/A/2012/013857 , "Office Action", dated Mar. 12, 2014, 2 pages (of-record in parent application).
MX/A/2014/005449 , "Notice of Allowance", dated Jun. 8, 2015, 1 page (of-record in parent application).
MX/A/2015/001922 , "Notice of Allowance", dated Aug. 29, 2016, 2 pages (of-record in parent application).
MX/A/2015/001922 , "Notice of Allowance", dated Sep. 12, 2016, 2 pages (of-record in parent application).
MX/A/2015/001922 , "Office Action", dated Mar. 11, 2016, 2 pages (of-record in parent application).
PCT/CN2012/081257 , "International Search Report and Written Opinion", dated Jun. 20, 2013, 11 pages (of-record in parent application).
PCT/US2011/038451 , "International Preliminary Report on Patentability", dated Dec. 13, 2012, 8 Pages (of-record in parent application).
PCT/US2011/038451 , "International Search Report and Written Opinion Recived", 13 pages (of-record in parent application).
PCT/US2011/038452 , "International Preliminary Report on Patentability", dated Dec. 13, 2012, 19 pages (of-record in parent application).
PCT/US2011/038452 , "International Search Report and Written Opinion", dated Oct. 26, 2011, 27 pages (of-record in parent application).
PCT/US2011/038452 , "Invitation to Pay Additional Fees/Partial Search Report Received", 162 pages (of-record in parent application).
PCT/US2011/039870 , dated Oct. 4, 2011, 27 pages (of-record in parent application).
PCT/US2011/041127 , "International Search Report and Written Opinion", dated Dec. 29, 2011, 17 pages (of-record in parent application).
PCT/US2011/041286 , "International Search Report and Written Opinion", dated Oct. 20, 2011, 18 pages (of-record in parent application).
PCT/US2011/041290 , "International Search Report and Written Opinion", dated Nov. 21, 2011, 21 pages (of-record in parent application).
PCT/US2012/022795 , "International Search Report and Written Opinion", dated Aug. 31, 2012, 22 (of-record in parent application).
PCT/US2012/022795 , "Invitation to Pay Additional Fees and Partial Search Report", dated May 16, 2012, 7 pages (of-record in parent application).
PCT/US2012/054318 , "International Search Report and Written Opinion", dated Oct. 25, 2012, 47 pages (of-record in parent application).
PCT/US2012/063928 , "International Preliminary Report on Patentability", dated May 22, 2014, 13 pages (of-record in parent application).
PCT/US2012/063928 , "International Preliminary Report on Patentability", dated May 22, 2014, 14 pages (of-record in parent application).
PCT/US2012/063928 , "International Search Report and Written Opinion", dated Sep. 9, 2013, 19 pages (of-record in parent application).
PCT/US2012/063928 , "Invitation to Pay Additional Fees and Partial Search Report", dated Mar. 22, 2013, 8 Pages (of-record in parent application).
PCT/US2012/063944 , "International Search Report and Written Opinion", dated Apr. 18, 2013, 23 pages (of-record in parent application).
PCT/US2012/063944 , "Invitation to Pay Additional Fees and Partial Search Report", dated Feb. 20, 2013, 23 pages (of-record in parent application).
PCT/US2012/066881 , "International Search Report and Written Opinion", dated Sep. 9, 2013, 19 pages (of-record in parent application).
PCT/US2012/066881 , "Partial Search Report for International PCT", dated Mar. 25, 2013, 8 pages (of-record in parent application).
PCT/US2012/66881 , "Invitation to Pay Additional Fees and Partial Search Report", dated Mar. 25, 2013, 8 Pages (of-record in parent application).
PCT/US2013/03008 , "International Search Report and Written Opinion for International PCT Application No.", dated Aug. 15, 2013, 12 pages (of-record in parent application).
PCT/US2013/037233 , "International Search Report & Written Opinion", dated Oct. 1, 2013, 11 pages (of-record in parent application).
PCT/US2013/037938 , "International Search Report & Written Opinion", dated Sep. 13, 2013, 17 pages (of-record in parent application).
PCT/US2013/038008 , "International Search Report & Written Opinion", dated Aug. 15, 2013, 12 pages (of-record in parent application).
PCT/US2013020582 , "International Search Report & Written Opinion", dated Apr. 16, 2013, 14 pages (of-record in parent application).
PCT/US2014/012535 , "International Search Report and Written Opinion", dated Nov. 6, 2014, 18 pages (of-record in parent application).
PCT/US2014/012535 , "Invitation to Pay Additional Fees and partial Search Report", dated Apr. 4, 2014, 7 pages (of-record in parent application).
RU2012157740 , "Office Action", dated Mar. 21, 2014, 5 pages (of-record in parent application).
RU2014123026 , "Office Action", dated Apr. 7, 2015, 8 pages (of-record in parent application).
SG11201401609U , "Notice of Decision to Grant", dated Jul. 26, 2016, 4 pages (of-record in parent application).
TW100118944 , "Notice of Allowance", dated Jul. 30, 2014, (of-record in parent application).

(56) References Cited

OTHER PUBLICATIONS

TW100118944, "Office Action", dated Sep. 16, 2013, 23 pages (of-record in parent application).
TW101141386, "Notice of Decision to Grant", dated Jun. 3, 2016, 2 pages (of-record in parent application).
TW101141386, "Office Action", dated Aug. 3, 2015, 21 pages (of-record in parent application).
TW101145138, "Office Action", dated Sep. 9, 2014, 14 Pages (of-record in parent application).
TW101145138, "Office Action", dated Jan. 30, 2015, 26 pages (of-record in parent application).
TW103128703, "Notice of Allowance", dated Nov. 28, 2016, 3 pages (of-record in parent application).
TW103128703, "Office Action", dated Mar. 10, 2016, 17 pages (of-record in parent application).
Venuti, "Introducing HDMI 1.4 Specification Features", HDMI LLC, http://www.hdmi.org/download/press_kit!PressBriefing_HDMI1_4_Finai_0831 09.pdf, pp. 29-30, 2009 (of-record in parent application).
VN1-2012-03874, "Notice of Allowance", dated Jul. 14, 2016, 1 page (of-record in parent application).
VN1-2014-01747, "Office Action", dated Oct. 21, 2016, 1 page (of-record in parent application).

\* cited by examiner

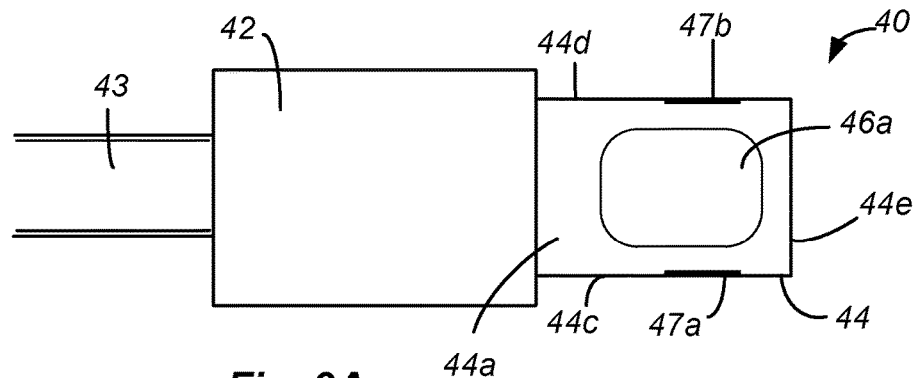
*Fig. 3A*
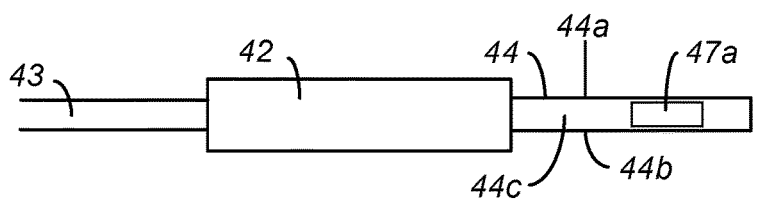
*Fig. 3B*
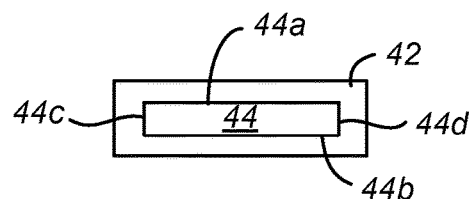
*Fig. 3C*
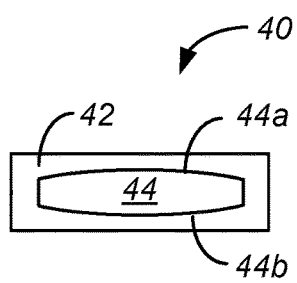 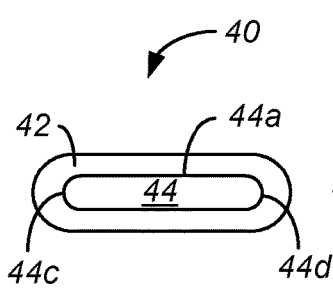 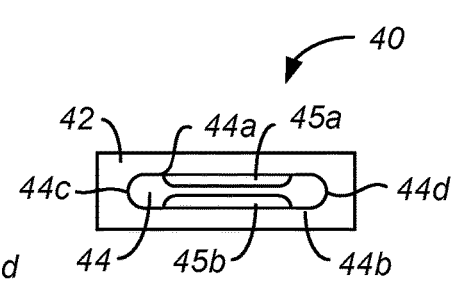
*Fig. 4A*  *Fig. 4B*  *Fig. 4C*

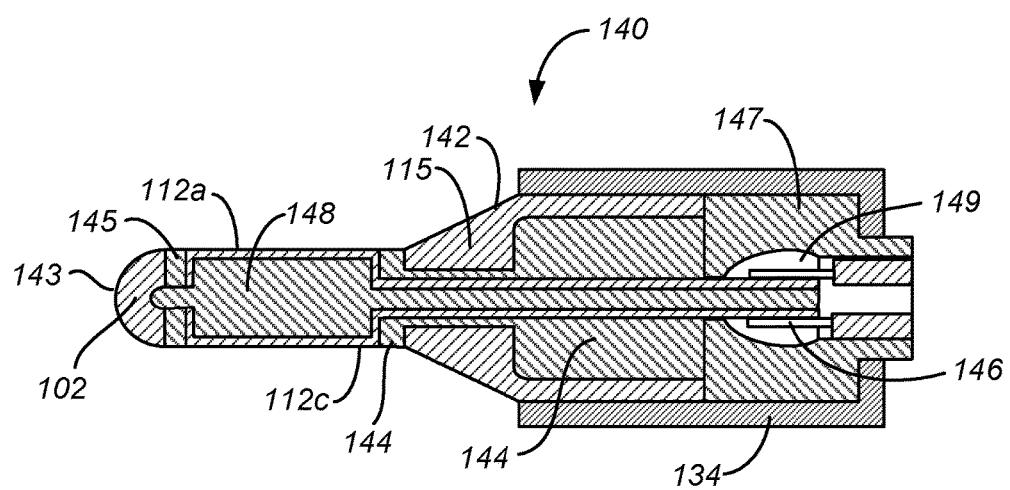
*Fig. 18*
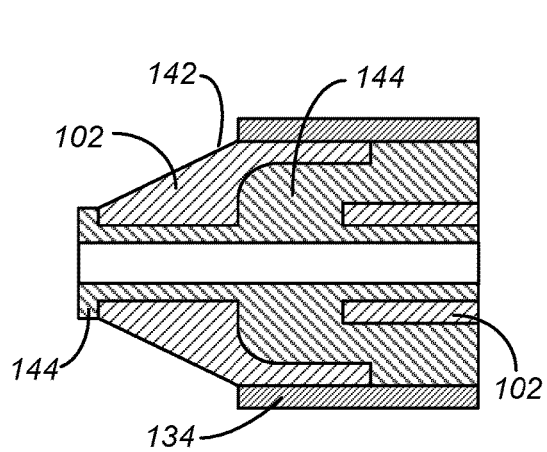 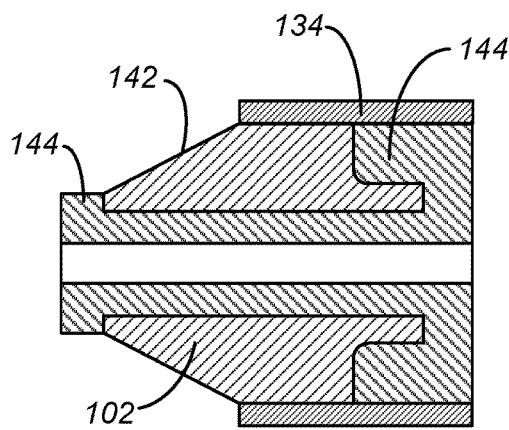
*Fig. 19A*                *Fig. 19B*

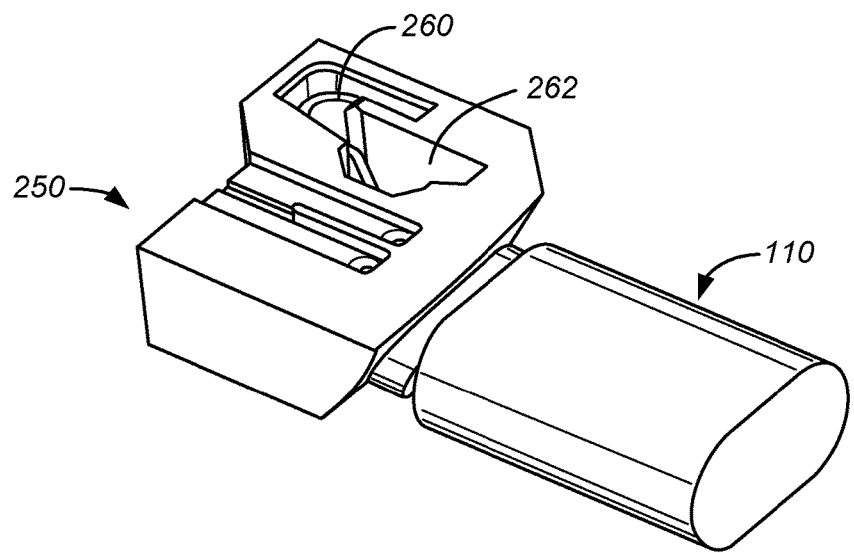
Fig. 29
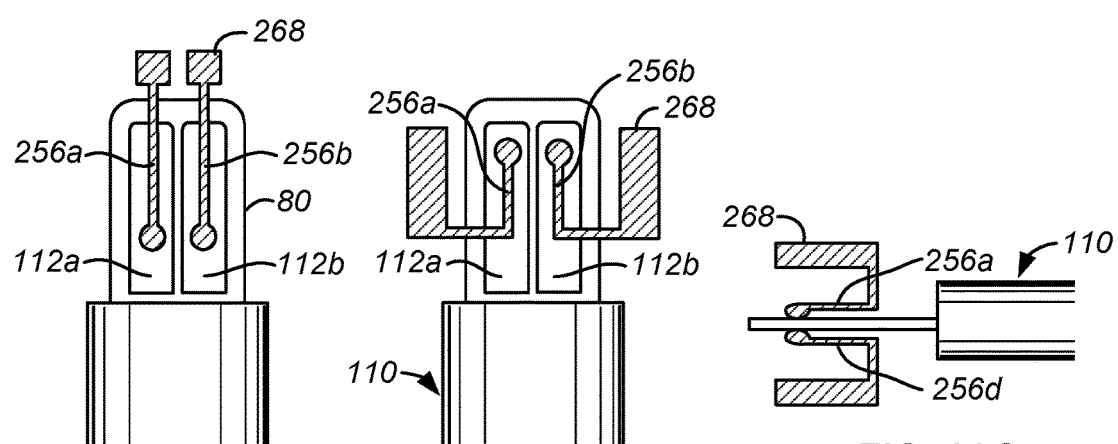
FIG. 30A  FIG. 30B  FIG. 30C

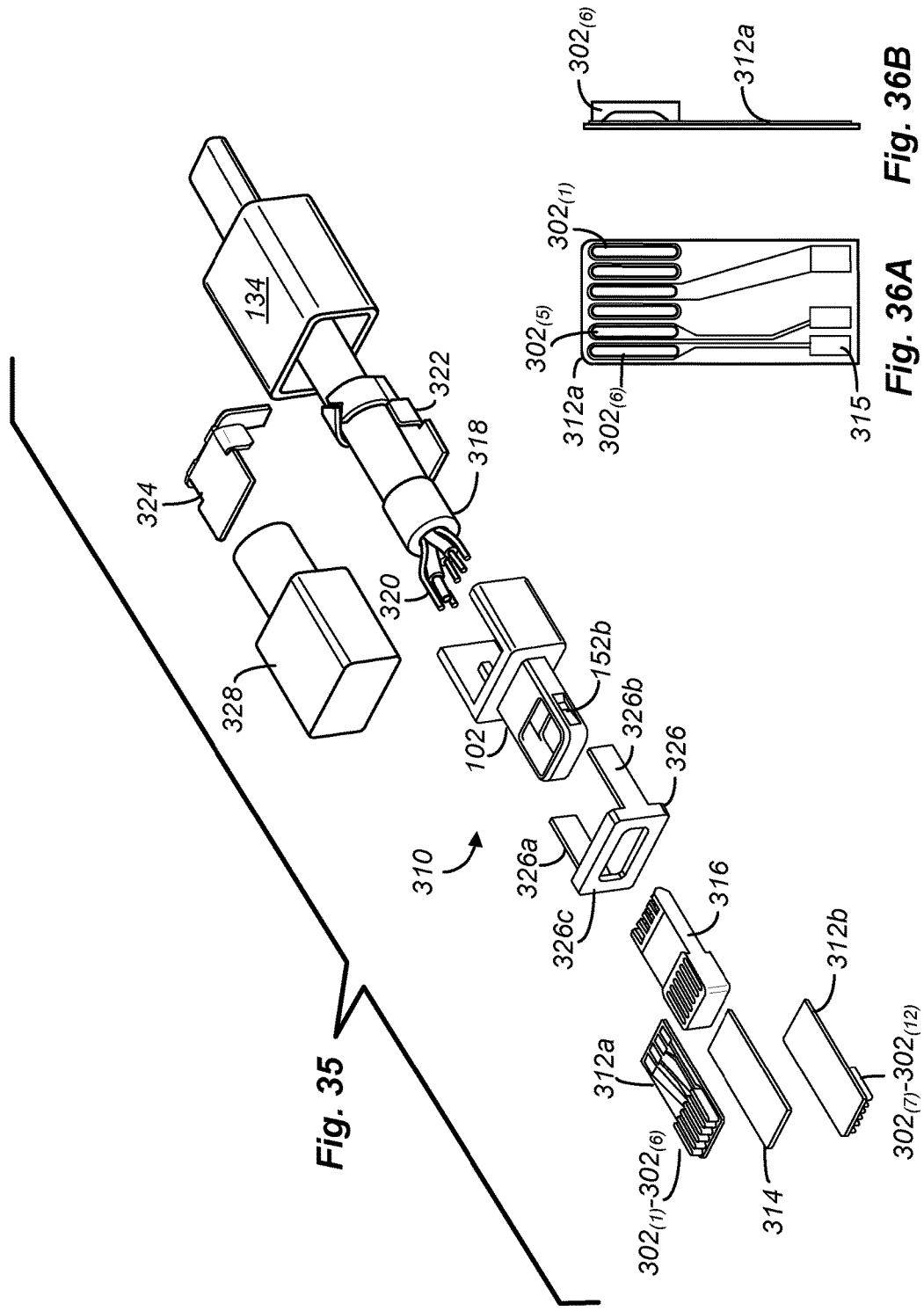

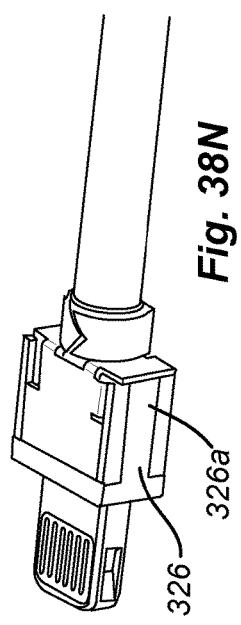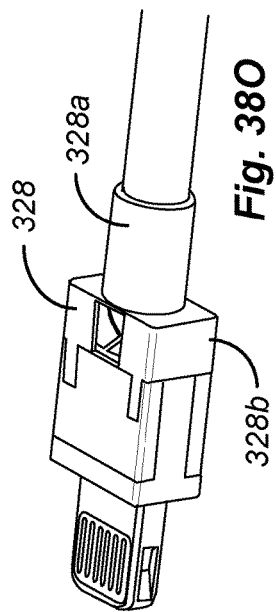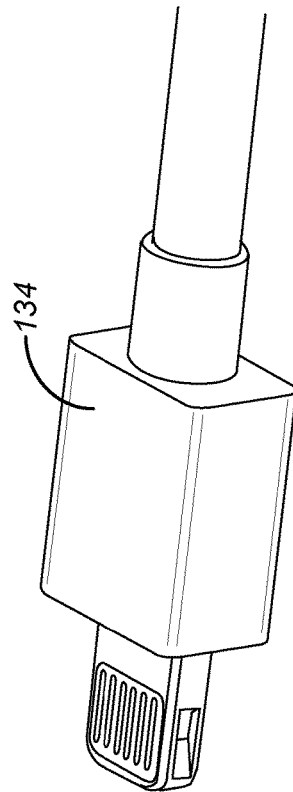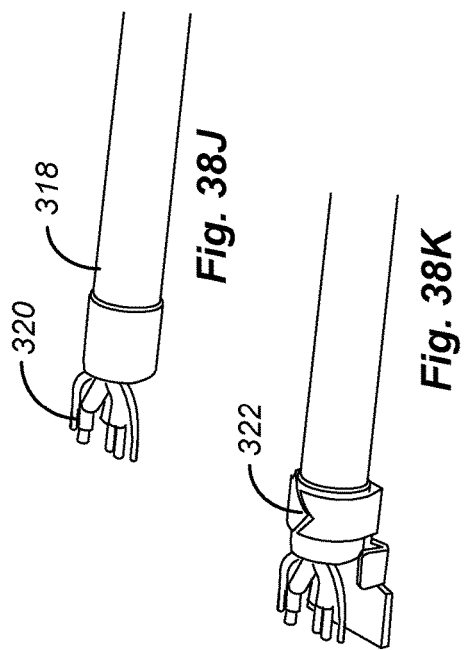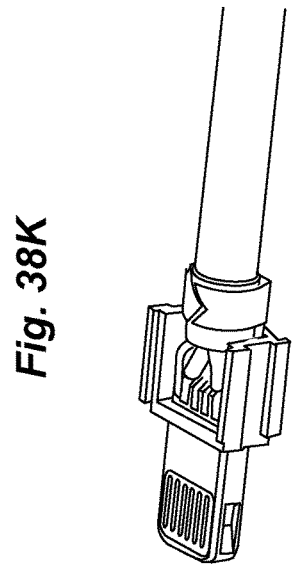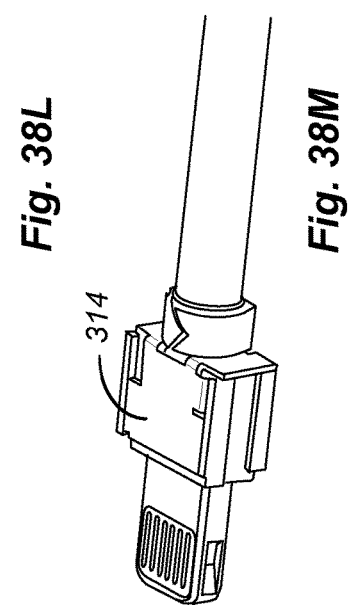

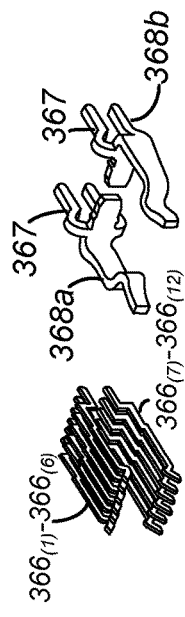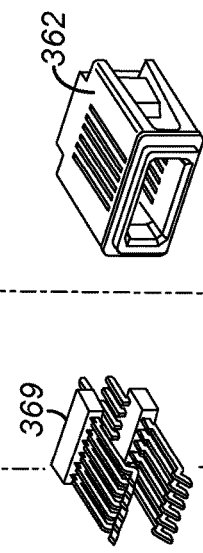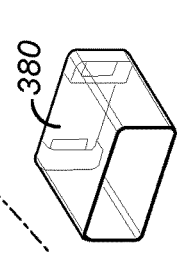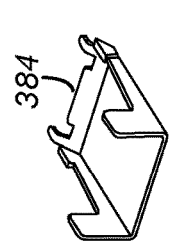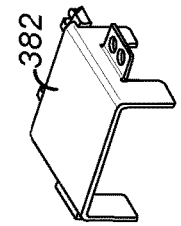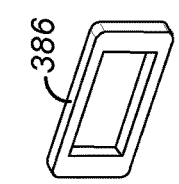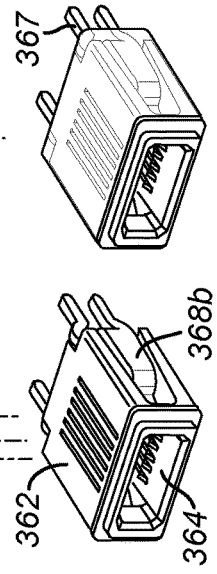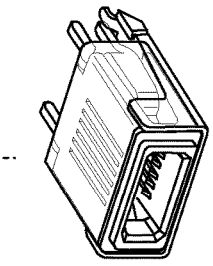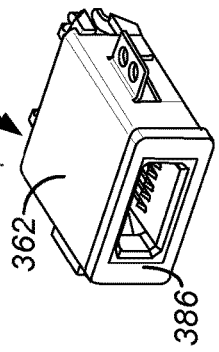

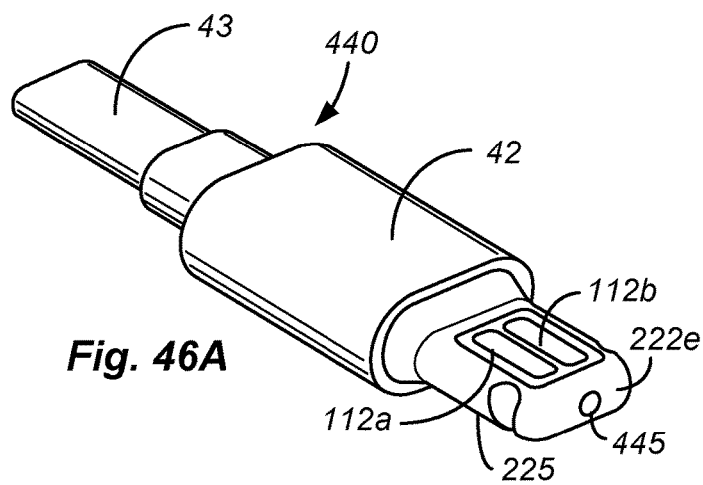
Fig. 46A
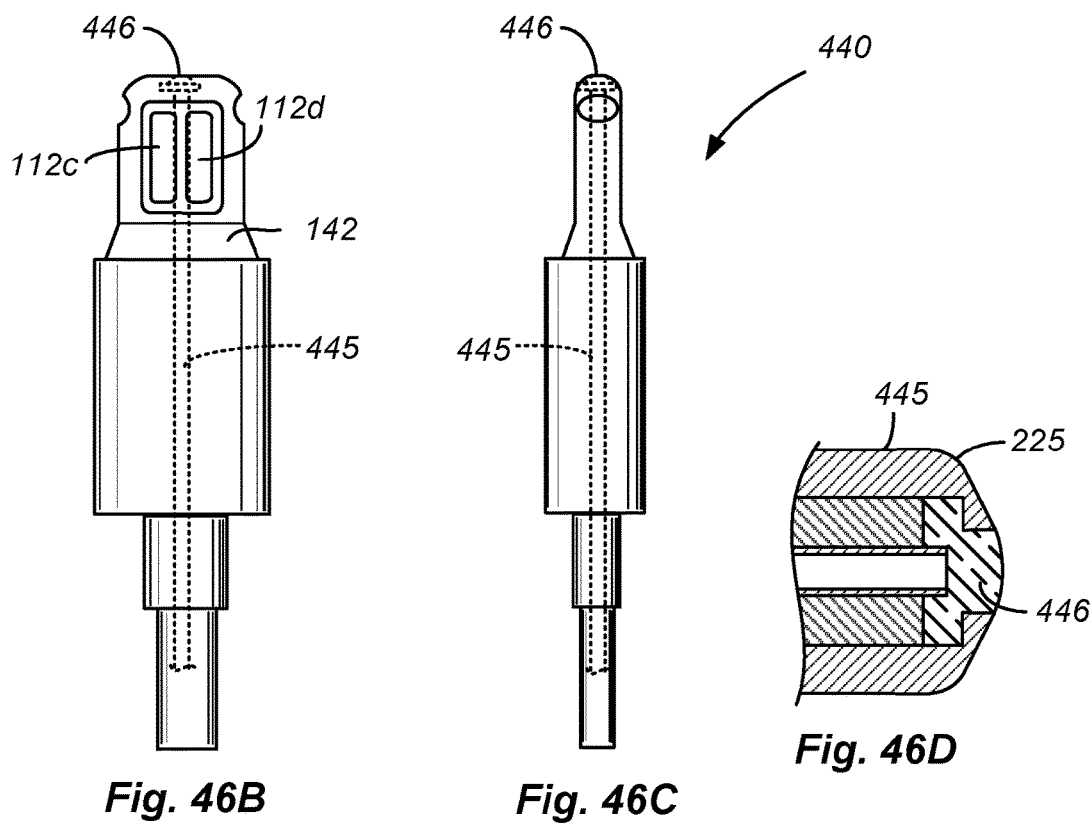
Fig. 46B  Fig. 46C  Fig. 46D

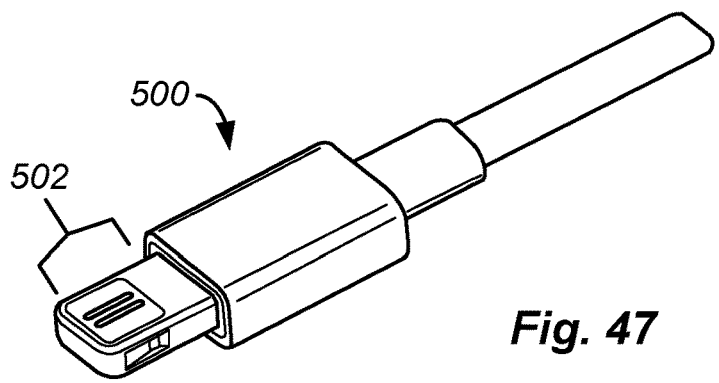
Fig. 47
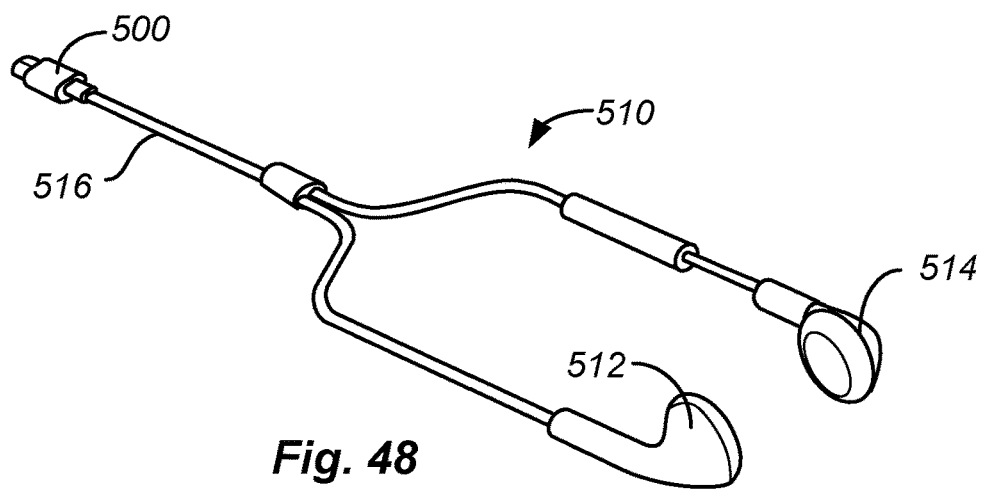
Fig. 48
Fig. 49A
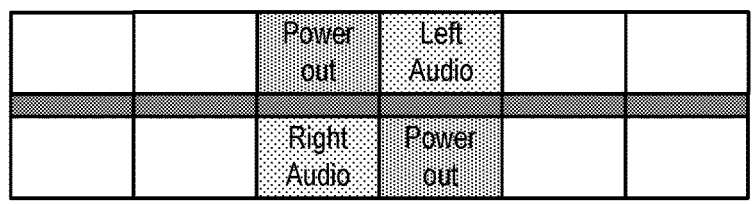
Fig. 49B
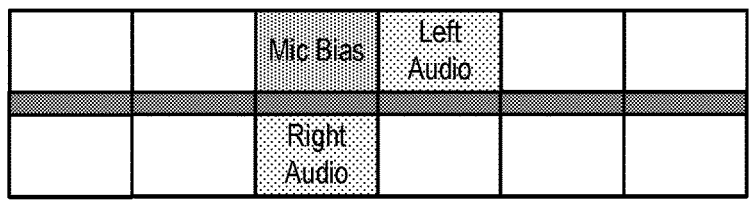

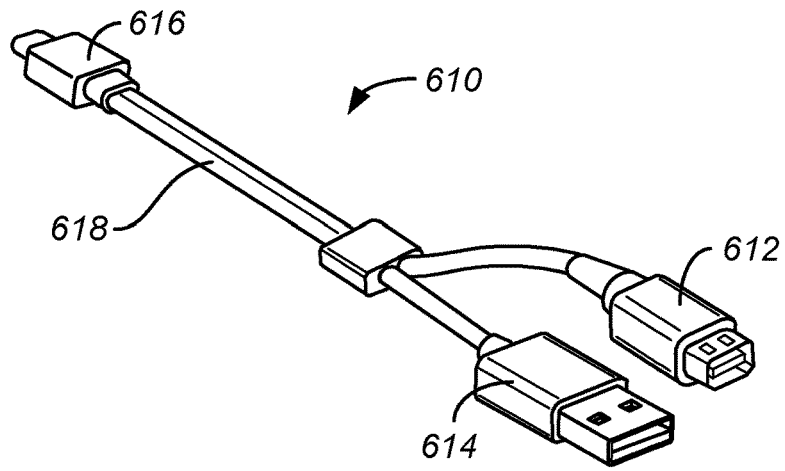
*Fig. 55*
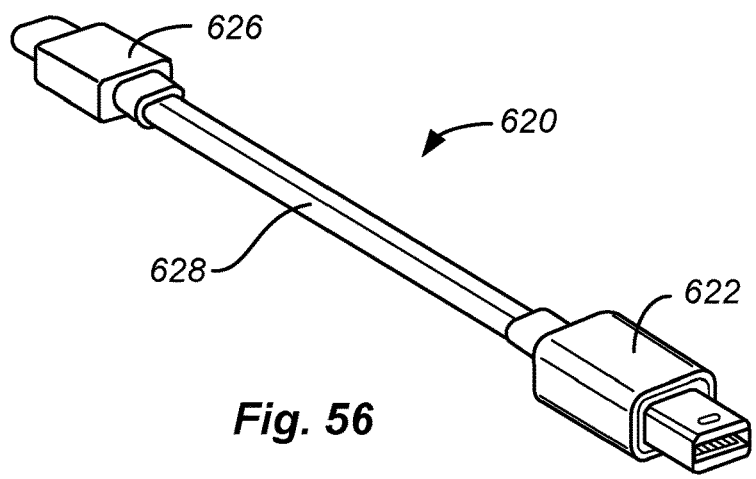
*Fig. 56*
| HS_In+ | HS_In- | Power | Left Audio | USB D- | USB D+ |
|---|---|---|---|---|---|
| | | Right Audio | Power | HS_Out+ | HS_Out- |
*Fig. 57*

| | | Power | Left Audio | USB D- | USB D+ |
|---|---|---|---|---|---|
| uart- | uart+ | Right Audio | Power | | |

DUAL ORIENTATION CONNECTOR WITH EXTERNAL CONTACTS

CROSS-REFERENCES TO RELATED APPLICATIONS

This application is a continuation of U.S. Non-Provisional application Ser. No. 15/292,092, filed Oct. 12, 2016; which claims priority to U.S. Non-Provisional application Ser. No. 14/615,240, filed Feb. 5, 2015 (now U.S. Pat. No. 9,478, 905); which claims priority to U.S. Non-Provisional application Ser. No. 13/700,441, filed Nov. 27, 2012 (now U.S. Pat. No. 8,998,632); which claims priority to U.S. National Stage Application of PCT/US2011/038452, filed May 27, 2011; which claims the benefit of U.S. Provisional Patent Application Nos. 61/349,737, filed May 28, 2010; 61/353, 126, filed Jun. 9, 2010; 61/356,499, filed Jun. 18, 2010; 61/407,363, filed Oct. 27, 2010; 61/436,490, filed Jan. 26, 2011; and 61/436,545, filed Jan. 26, 2011. The disclosures of each of which are herein incorporated by reference in their entirety for all purposes.

BACKGROUND OF THE INVENTION

The present invention relates generally to input/output electrical connectors such as audio connectors and data connectors.

Standard audio connectors or plugs are available in three sizes according to the outside diameter of the plug: a 6.35 mm (¼") plug, a 3.5 mm (⅛") miniature plug and a 2.5 mm (3/32") subminiature plug. The plugs include multiple conductive regions that extend along the length of the connectors in distinct portions of the plug such as the tip, sleeve and one or more middle portions between the tip and sleeve resulting in the connectors often being referred to as TRS (tip, ring and sleeve) connectors.

FIGS. 1A and 1B illustrate examples of audio plugs 10 and 20 having three and four conductive portions, respectfully. As shown in FIG. 1A, plug 10 includes a conductive tip 12, a conductive sleeve 16 and a conductive ring 14 electrically isolated from the tip 12 and the sleeve 16 by insulating rings 17 and 18. The three conductive portions 12, 14, 16 are for left and right audio channels and a ground connection. Plug 20, shown in FIG. 1B, includes four conductive portions: a conductive tip 22, a conductive sleeve 26 and two conductive rings 24, 25 and is thus sometime referred to as a TRRS (tip, ring, ring, sleeve) connector. The four conductive portions are electrically isolated by insulating rings 27, 28 and 29 and are typically used for left and right audio, microphone and ground signals. As evident from FIGS. 1A and 1B, each of audio plugs 10 and 20 are orientation agnostic. That is, the conductive portions completely encircle the connector forming 360 degree contacts such that there is no distinct top, bottom or side to the plug portion of the connectors.

When plugs 10 and 20 are 3.5 mm miniature connectors, the outer diameter of conductive sleeve 16, 26 and conductive rings 14, 24, 25 is 3.5 mm and the insertion length of the connector is 14 mm. For 2.5 mm subminiature connectors, the outer diameter of the conductive sleeve is 2.5 mm and the insertion length of the connector is 11 mm long. Such TRS and TRRS connectors are used in many commercially available MP3 players and smart phones as well as other electronic devices. Electronic devices such as MP3 players and smart phones are continuously being designed to be thinner and smaller and/or to include video displays with screens that are pushed out as close to the outer edge of the devices as possible. The diameter and length of current 3.5 mm and even 2.5 mm audio connectors are limiting factors in making such devices smaller and thinner and in allowing the displays to be larger for a given form factor.

Many standard data connectors are also only available in sizes that are limiting factors in making portable electronic devices smaller. Additionally, and in contrast to the TRS connectors discussed above, many standard data connectors require that they be mated with a corresponding connector in a single, specific orientation. Such connectors can be referred to as polarized connectors. As an example of a polarized connector, FIGS. 2A and 2B depict a micro-USB connector 30, the smallest of the currently available USB connectors. Connector 30 includes a body 32 and a metallic shell 34 that extends from body 32 and can be inserted into a corresponding receptacle connector. As shown in FIGS. 2A, 2B, shell 34 has angled corners 35 formed at one of its bottom plates. Similarly, the receptacle connector (not shown) with which connector 30 mates has an insertion opening with matching angled features that prevents shell 34 from being inserted into the receptacle connector the wrong way. That is, it can only be inserted one way—in an orientation where the angled portions of shell 34 align with the matching angled portions in the receptacle connector. It is sometimes difficult for the user to determine when a polarized connector, such as connector 30 is oriented in the correct insertion position.

Connector 30 also includes an interior cavity 38 within shell 34 along with contacts 36 formed within the cavity. Cavity 38 is prone to collecting and trapping debris within the cavity which may sometimes interfere with the signal connections to contacts 36. Also, and in addition to the orientation issue, even when connector 30 is properly aligned, the insertion and extraction of the connector is not precise, and may have an inconsistent feel. Further, even when the connector is fully inserted, it may have an undesirable degree of wobble that may result in either a faulty connection or breakage.

Many other commonly used data connectors, including standard USB connectors, mini USB connectors, FireWire connectors, as well as many of the proprietary connectors used with common portable media electronics, suffer from some or all of these deficiencies or from similar deficiencies.

BRIEF SUMMARY OF THE INVENTION

Various embodiments of the invention pertain to plug connectors and receptacle connectors that improve upon some or all of the above described deficiencies. Other embodiments of the invention pertain to methods of manufacturing such plug and/or receptacle connectors as well as electronic devices that include such connectors. Embodiments of the invention are not limited to any particular type of connector and may be used for numerous applications. Some embodiments, however, are particularly well suited for use as audio connectors and some embodiments are particularly well suited for data connectors.

In view of the shortcomings in currently available audio and data connectors as described above, some embodiments of the present invention relate to improved audio and/or data plug connectors that have a reduced plug length and thickness, an intuitive insertion orientation and a smooth, consistent feel when inserted and extracted from its corresponding receptacle connector. Additionally, some embodiments of plug connectors according to the present invention have external contacts instead of internal contacts and do not include a cavity that is prone to collecting and trapping debris.

One particular embodiment of the invention pertains to a dual orientation plug connector having external contacts carried by a connector tab. The connector tab can include first and second opposing sides with a first set of contacts formed on the first side and a second set of contacts formed on the second side. The first set of contacts can be symmetrically spaced with the second set of contacts and the connector tab can have a 180 degree symmetrical shape so that it can be inserted and operatively coupled to a corresponding receptacle connector in either of two insertion orientations. In some embodiments the plug connector further includes one or more ground contacts formed on side surfaces of the connector tab that extend between the first and second surfaces, and in some additional embodiments the connector tab includes a cap or ground ring that covers the tip of the connector and extends from the tip towards the body along at least a portion of each of the side surfaces. In some further embodiments, the connector tab includes at least one retention feature adapted to engage with a retention feature on a corresponding receptacle connector.

In another embodiment, the invention pertains to an dual orientation electrical connector comprising a body and a connector tab extending longitudinally away from the body that includes first and second opposing surfaces. A plurality of electrical contacts are carried by the connector tab including a first set of external contacts formed at the first surface and a second set of external contacts formed at the second surface. The connector tab is shaped to have 180 degree symmetry and the first set of contacts is symmetrically spaced with the second set of contacts allowing the connector to be inserted into a corresponding receptacle connector in either of two orientations. In some instances, the connector tab can further include a side peripheral surface that extends between the first and second opposing surfaces and at least one ground contact formed on the side peripheral surface. Additionally, in some embodiments the connector still further includes a metal ground ring that generally defines a shape of the connector tab and includes openings on both the first and second surfaces in which the first and second sets of contacts are respectively formed and surrounded by a dielectric. Still in some other embodiments, the body includes a flexible member or is made from a flexible material that allows the connector to bend with respect to an insertion axis in which the connector is mated with a receptacle connector.

In still another embodiment, the invention pertains to a dual orientation electrical plug connector having a body, a cable attached to the body, and an unpolarized connector tab extending longitudinally away from the body. The connector tab may have a generally rectangular cross section defined by first and second major opposing surfaces and first and second opposing side surfaces extending between the first and second major surfaces. A plurality of electrical wiping contacts can be carried by the connector tab including a first set of external contacts formed at the first major surface and extending parallel to each other along a length of the connector, and a second set of external contacts formed at the second major surface and extending parallel to each other along the length of the connector. The connector may also include first and second retention features formed on the first and second opposing side surfaces, respectively, that are adapted to engage with retention features on a corresponding receptacle connector to secure the connectors together during a mating event. In some embodiments, the first retention feature may also function as a first ground contact and the second retention feature may also function as a second ground contact. The first set of contacts can be symmetrically spaced with the second set of contacts, and the first ground contact can be symmetrically spaced with the second ground contact so that the connector tab has 180 degree symmetry and can be inserted and operatively coupled to the corresponding receptacle connector in either of two positions.

Other embodiments of the invention pertain to electrical receptacle connectors. In one embodiment, the receptacle connector can include a housing that defines an interior cavity extending in a direction of the depth of the housing and a plurality of electrical contacts positioned within the cavity. The cavity can have a 180 degree symmetrical shape so that a corresponding plug connector can be inserted into the cavity in either of two insertion orientations. Additionally, the plurality of contacts may include a first set of contacts positioned at a first interior surface of the cavity and a second set of contacts positioned at a second interior surface of the cavity spaced apart from the first interior surface in an opposing relationship. The first and second sets of contacts can further be mirror images of each other. In some embodiments, the receptacle connector can also include at least one retention feature adapted to engage with a retention feature on a corresponding plug connector. In still other embodiments, the receptacle connector can include first and second retention features positioned on opposing side surfaces the cavity adapted to engage with first and second retention features on a corresponding plug connector.

In another embodiment, the invention pertains to an electrical plug connector that includes a conductive cap or ground ring to isolate the connector's contacts from interference. The connector can further include a body and a connector tab that is attached to and extends longitudinally away from the body. The conductive cap can cover a tip of the connector and extend from the tip towards the body along at least a portion of the connector tab's side surfaces. A plurality of external contacts can be carried by the connector tab at a location at least partially surrounded by the conductive cap. In some embodiments the plurality of external contacts can include contacts formed at both first and second major opposing surfaces of the connector tab, and in some embodiments the contacts formed at the first and second surfaces are arranged on each surface in matching patterns. Additionally, in some embodiments the conductive cap can be a metal cap and in some embodiments the connector can further include first and second ground contacts formed on the sides of the conductive cap. In different embodiments the conductive cap may be a U-shaped frame or may generally define a shape of the connector tab except for the one or more contact regions of the connector tab in which the plurality of contacts are formed.

In still another embodiment, a method of manufacturing a plug connector having a body and a tab that is adapted to be inserted into a corresponding receptacle connector is disclosed. The method includes forming the connector tab to have first and second major opposing surfaces, third and fourth opposing side surfaces extending between the first and second surfaces and a 180 degree symmetrical design such that a plane bisecting a width of the connector tab at an angle perpendicular to the first and second major surfaces divides the tab into left and right portions that have substantially the same outer shape and a horizontal plane bisecting a height of the connector tab at an angle perpendicular to the third and fourth side surfaces divides the tab into upper and lower portions that have substantially the same outer shape; forming a first contact region at the first major surface of the connector tab and a second contact region at a second major surface of the connector tab opposite the first major surface, the first and second contact regions being substantially the same size and shape and including an equal number of contacts, wherein contacts in the first contact region are arranged in a first pattern according to a first spacing and contacts in the second contact are also arranged in the first pattern according to the first spacing; and attaching a cable having a plurality of insulated wires to the body so that each individual wire in the plurality of insulated wires is electrically connected to a contact in either the first or second contact regions.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 2A shows a perspective view of a previously known micro-USB plug connector while

FIG. 3A is simplified top view of a plug connector 40 according to one embodiment of the present invention;

FIGS. 3B and 3C are simplified side and front views, respectively, of connector 40 shown in FIG. 3A;

FIGS. 4A-4C are front view of alternative embodiments of connector 40 according to the present invention;

FIG. 18 is a simplified cross-sectional view of connector 140 along lines A-A' shown in FIG. 17D;

FIGS. 19A and 19B are simplified cross-sectional views of alternative method of connecting insulator 144 to ground ring 115 shown in FIG. 18;

FIG. 29 is a simplified perspective view showing plug connector 110 inserted into connector jack 250;

FIGS. 30A-30C illustrate different positions in which the contact overhead associated with a receptacle connector according to the present invention may be positioned;

FIG. 35 is a simplified exploded perspective view of a plug connector 310 according to another embodiment of the invention;

FIGS. 36A and 36B are simplified top and side plan views of printed circuit board 312a shown in FIG. 35 according to one embodiment of the present invention;

FIG. 41A-41G depicts various views of receptacle connector 360 at different stages of manufacture;

FIGS. 46A-46D illustrate one example of a connector 440 having five analog contacts as well as a fiber optic cable 445 that runs through the center of the connector;

FIG. 47 is a simplified perspective view of a plug connector 150 according to another embodiment of the invention;

FIG. 48 is a simplified perspective view of a headset 510 that includes connector 150 shown in FIG. 38 according to an embodiment of the invention;

FIG. 49A is a diagram depicting pin locations of connector 150 operating in a Mickey bus mode according to one embodiment of the invention and FIG. 49B is a diagram depicting the pin locations of connector 150 operating in a legacy/backward compatible mode according to one embodiment of the invention;

FIG. 55 is a simplified perspective view of a audio/visual adapter cable 210 having mini display port and USB connectors at one end and a similar to connector 50 at the other end according to another embodiment of the invention;

FIG. 56 is a simplified perspective view of a audio/visual adapter cable 220 having a mini display port connector at one end and a high speed connector at the other end according to another embodiment of the invention;

FIG. 57 is a diagram depicting pin locations of high speed connector 225 shown in FIG. 56 according to one embodiment of the invention;

FIG. 60 is a simplified illustrative block diagram of an electronic media device suitable in which embodiments of the invention may be incorporated or used with.

DETAILED DESCRIPTION OF THE INVENTION

Figure 1A:
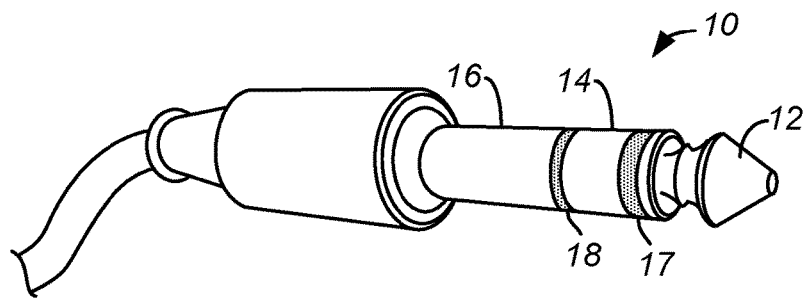
FIGS. 1A and 1B show perspective views of previously known TRS audio plug connectors.
Figure 1B:
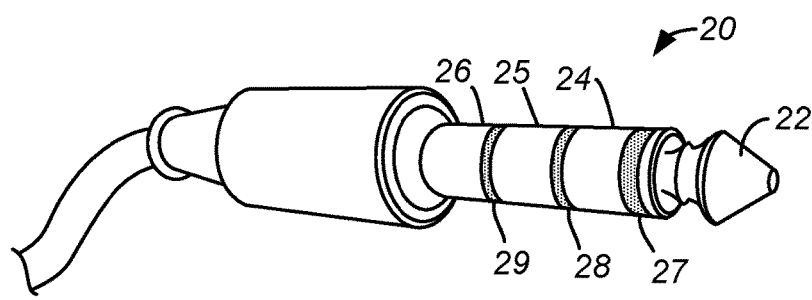
Figure 2A:
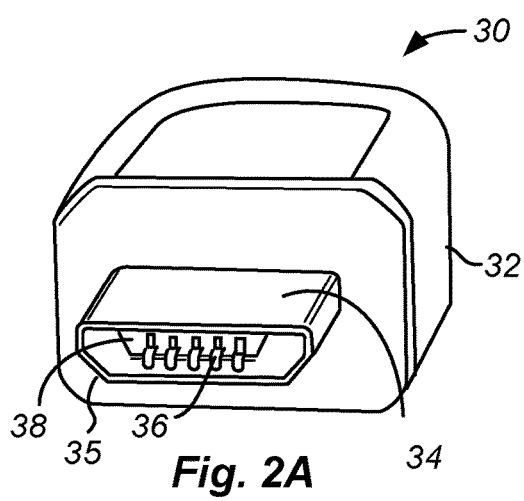
Figure 2B:
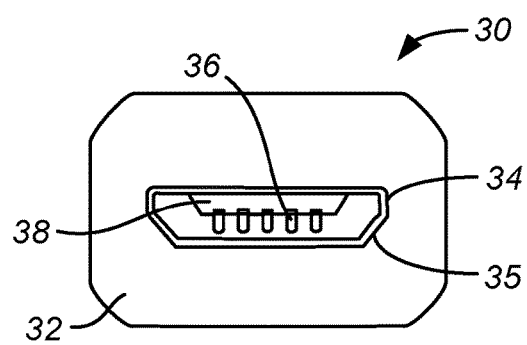
FIG. 2B shows a front plan view of the micro-USB connector shown in FIG. 2A.

The present invention will now be described in detail with reference to certain embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known details have not been described in detail in order not to unnecessarily obscure the present invention.

In order to better appreciate and understand the present invention, reference is first made to FIGS. 3A-3C, which are simplified top, side and front views, respectively, of a plug connector 40 according to one embodiment of the present invention. Connector 40 includes a body 42 and a tab portion 44. A cable 43 is attached to body 42 and tab portion 44 extends away from body 42 in a direction parallel to the length of the connector 40. Tab 44 is sized to be inserted into a corresponding receptacle connector during a mating event and includes a first contact region 46a formed on a first major surface 44a and a second contact region 46b (not shown in FIGS. 3A-3C) formed at a second major surface 44b opposite surface 44a. A plurality of contacts (not shown in FIGS. 3A-3C) can be formed in each of contact regions 46a and 46b such that, when tab 44 is inserted into a corresponding receptacle connector, contacts in regions 46a, 46b are electrically coupled to corresponding contacts in the receptacle connector. In some embodiments, the plurality of contacts are self-cleaning wiping contacts that, after initially coming into contact with a receptacle connector contact during a mating event, slide further past the receptacle connector contact with a wiping motion before reaching a final, desired contact position.

Tab 44 also includes first and second opposing side surfaces 44c, 44d that extend between the first and second major surfaces 44a, 44b. While tab 44 is shown in FIGS. 3A-3C as having a substantially rectangular and substantially flat shape, in some embodiments of the invention first and second major surfaces 44a, 44b may have matching convex or concave curvatures to them or may have a matching recessed region centrally located between the sides of tab 44. Contact regions 46a and 46b may be formed in the recessed regions and the recessed regions may, for example, extend from the distal tip of tab 44 all the way to base 42 or may extend along only a portion of the length of tab 44 (e.g., between ½ to ¾ of the length of the tab) ending at a point short of base 42. Side surfaces 44c and 44d may also have matching convex or concave curvatures.

Generally, the shape and curvature of surfaces 44a and 44b mirror each other, as do the shape and curvature of surfaces 44a and 44b, in accordance with the dual orientation design of connector 40 as described below. Additionally, while FIGS. 3A-3C show surfaces 44c, 44d as having a width significantly less that of surfaces 44a, 44b (e.g., less than or equal to one half width of surfaces 44a, 44b), in some embodiments of the invention side surfaces 44c, 44d have a width that is relatively close to or even equal with or wider than that of surfaces 44a, 44b.

FIGS. 4A-4C are simplified front plan views of embodiments of connector 40 in which body 42 and/or tab 44 have different cross-sectional shapes. For example, in FIG. 4A, major surfaces 44a and 44b are slightly convex, while in FIGS. 4B and 4C, side surfaces 44c and 44d are rounded. Further, FIG. 4C depicts an example of a connector having recessed regions 45a and 45b formed at major surfaces 44a and 44b, respectfully, of tab 44. The recessed regions extend from the distal tip of tab 44 along a portion of the length of tab 44 and are centrally located between side surfaces 44c and 44d. A person of skill in the art will understand that FIGS. 3C and 4A-4C are but examples of suitable cross-sectional shapes for body 42 and tab 44 and that many other cross-sectional shapes may be employed for each of body 42 and tab 44 in various embodiments of the invention.

In some embodiments, one or more ground contacts can be formed on the side surfaces. For example, FIGS. 3A and 3B show a ground contact 47a formed on first side surface 44c and a ground contact 47b formed on second side surface 44d opposite ground contact 47a. As another example, one or more ground contacts may be formed on end surface 44e at the distal tip of connector 40 in addition to, or instead of ground contacts 47a, 47b. In some embodiments, each of the one or more ground contacts can be formed on or form part of an outer portion of its respective side surface. In other embodiments, the one or more ground contacts can be formed within and/or as part of a pocket, indentation, notch or similar recessed region formed on each of the side surfaces 44c, 44d that operatively engage with a retention mechanism in a corresponding receptacle connector as described in detail below.

Body 42 is generally the portion of connector 40 that a user will hold onto when inserting or removing connector 40 from a corresponding receptacle connector. Body 42 can be made out of a variety of materials and in some embodiments is made from a dielectric material, such as a thermoplastic polymer formed in an injection molding process. While not shown in FIG. 3A or 3B, a portion of cable 43 and a portion of tab 44 may extend within and be enclosed by body 42. Also, electrical contact to the contacts in each of regions 46a, 46b can be made to individual wires in cable 43 within body 42. In one embodiment, cable 43 includes a plurality of individual insulated wires, one for each contact within regions 46a and 46b, that are soldered to bonding pads on a printed circuit board (PCB) housed within body 42. Each bonding pad on the PCB is electrically coupled to a corresponding individual contact within one of contact regions 46a or 46b.

Tab 44 may also be made from a variety of materials including metal, dielectric or a combination thereof. In some embodiments, tab 44 includes a frame made primarily or exclusively from a metal, such as stainless steel, and contact regions 46a and 46b are formed within the frame. In some other embodiments, tab 44 includes a frame made primarily or exclusively from a dielectric material, such as a ceramic or an elastomeric material. For example, tab 44 may be a ceramic base that has contacts printed directly on its surfaces.

In embodiment illustrated in FIGS. 3A and 3B, body 42 has a rectangular cross section that generally matches in shape but is slightly larger than the cross section of tab 44. As discussed with respect to FIGS. 4A-4C, body 42 can be of a variety of shapes and sizes, however. For example, body 42 may have a rectangular cross section with rounded or angled edges (referred to herein as a "generally rectangular" cross section), a circular cross section, an oval cross section as well as many other suitable shapes. In some embodiments, both the body 42 and tab 44 of connector 40 have the same cross-sectional shape and have the same width and height (thickness). As one example, body 42 and tab 44 may combine to form a substantially flat, uniform connector where the body and tab seem as one. In still other embodiments, the cross section of body 42 has a different shape than the cross section of tab 44. As one example, body 42 may have curved upper and lower and/or curved side surfaces while tab 44 is substantially flat.

Each of contact regions 46a, 46b can be centered between opposing side surfaces 44c, 44d. Individual contacts in contact regions 46a and 46b can be external contacts positioned at an outer surface of tab 44 so that some embodiments of connector 40 do not include contacts positioned within an internal cavity in which particles and debris may collect. Each of contact regions 46a and 46b can include one or more contacts that can be made from copper, nickel, brass, a metal alloy or any other appropriate conductive material. In some embodiments contacts can be printed on surfaces 44a and 44b using techniques similar to those used to print contacts on printed circuit boards.

Figures 5A, 5B, 5C, 5D:
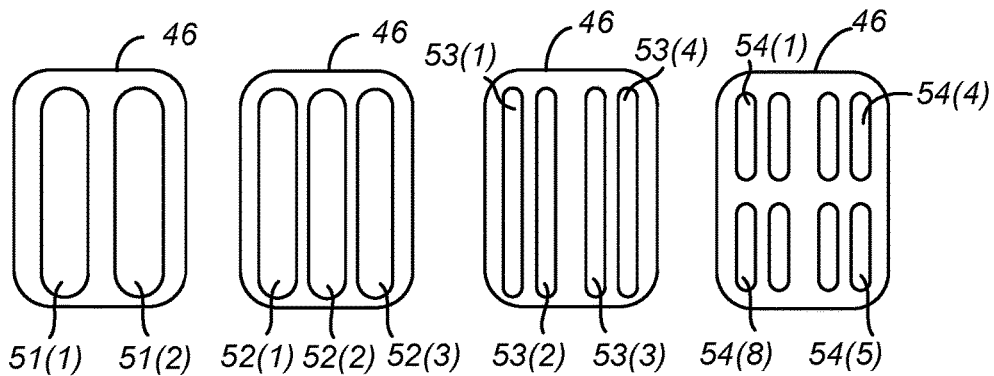
FIGS. 5A-5H are simplified top views of contact layouts within contact region 46 of connector 40 according to different embodiments of the invention.

Contact regions 46a and 46b may include any number of contacts, from one to twenty or more arranged in a variety of different patterns. FIGS. 5A-5H provide different examples of contact arrangements within a contact region 46 according to different embodiments of the invention. As shown in FIG. 5A, contact region 46 may include two contacts 51(1) and 51(2) that are centered and symmetrically positioned within the contact region. Similarly, FIG. 5B depicts a contact region 46 having three contacts 52(1) . . . 52(3) centered and symmetrically positioned within the contact region, and FIG. 5C depicts a contact region 46 having four such contacts 53(1) . . . 53(4).

Figures 5E, 5F, 5G, 5H:
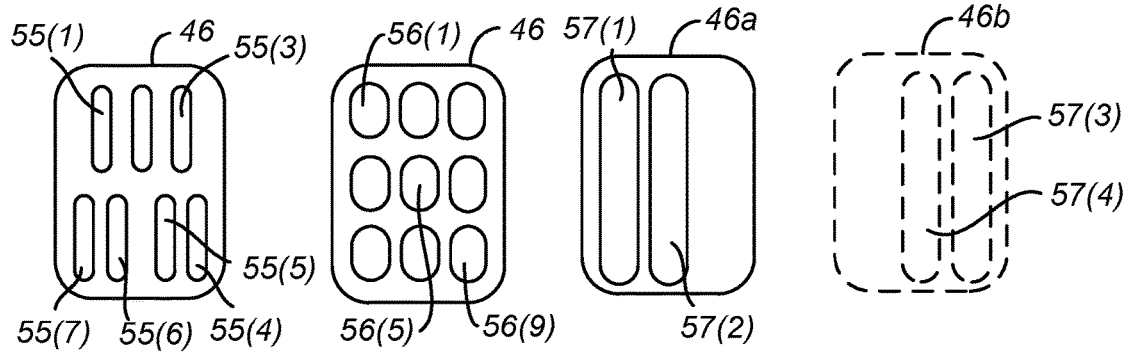

While each of FIGS. 5A-5C include a single row of contacts within region 46, some embodiments of the invention may include two, three or more rows of contacts. As examples, contact region 46 shown in FIG. 5D includes two rows of four contacts 54(1) . . . 54(4) and 54(5) . . . 54(8) with each row being centered between the sides of the contact region and symmetrically spaced with respect to a center line traversing the length of the contact region; FIG. 5E shows a contact region 46 having a first row of three contacts 55(1) . . . 51(3) and a second row of four contacts 55(4) . . . 55(7) positioned within the contact region; and FIG. 5F depicts a contact region 46 having three rows of three contacts for a total of nine contacts 56(1) . . . 56(9).

While each row of individual contacts in the contact regions shown in FIGS. 5A-5F center the contacts in the row between the sides of the contact region and symmetrically space the contacts with respect to a center line traversing the length of the contact region, in some embodiments of the invention the contacts need not be centered in this manner. As an example, FIG. 5G depicts a contact region 46a having two contacts 57(1) . . . 57(2) that are not centered within the contact region. To provide the 180 degree symmetry employed by some embodiments of the invention, a connector that includes the contact region 46a shown in FIG. 5G on one major surface, includes a contact region 46b as shown in FIG. 5H on the opposing major surface that matches contact region 46a. In FIG. 5H, contact region 46b and contacts 57(3)-57(4) are shown in dashed lines to represent the position of the contacts when looking from contact region 46a through the connector to contact region 46b.

Each of the contact regions 46 shown in FIGS. 5A-5G is representative of both regions 46a and 46b according to particular embodiments of the invention. That is, according to one embodiment of the invention, a plug connector 40 includes two contact regions 46a and 46b each of which includes two contacts as shown in region 46 in FIG. 5A. In another embodiment, a plug connector 40 includes contact regions 46a and 46b each of which includes three contacts as shown in FIG. 5B. Still other embodiments of the invention include: a connector 40 having contact regions 46a and 46b as shown in region 46 in FIG. 5C; a connector 40 having contact regions 46a and 46b as shown in region 46 in FIG. 5D; a connector 40 having contact regions 46a and 46b as shown in region 46 in FIG. 5E; a connector 40 having contact regions 46a and 46b as shown in region 46 in FIG. 5F; and a connector 40 having contact regions 46a and 46b as shown in region 46 in FIG. 5G.

Contacts within regions 46a, 46b may include contacts designated for a wide variety of signals including power contacts, ground contacts, analog contacts and digital contacts among others. In some embodiments, one or more ground contacts are formed in regions 46a and/or 46b while in other embodiments, ground contacts are only located at the tip 44e and/or on the side surfaces 44c, 44d of connector 40 in order to save space within contact regions 46a and 46b for power and signal contacts. Embodiments that employ ground contacts at one or more positions along the peripheral side and/or tip surfaces of connector 40 instead of within contact regions 46a and 46b may enable the overall footprint of connector tab 44 to be smaller than a similar connector that includes ground contacts in contact regions 46a or 46b.

Power contacts within regions 46a, 46b may carry signals of any voltage and, as an example, may carry signals between 2-30 volts. In some embodiments, multiple power contacts are included in regions 46a, 46b to carry power signals of different voltages levels that can be used for different purposes. For example, one or more contacts for delivering low current power at 3.3 volts that can be used to power accessory devices connected to connector 40 can be included in regions 46a, 46b as well as one or more contacts for delivering high current power at 5 volts for charging portable media devices coupled to connector 40.

Examples of analog contacts that may be included in contact regions 46a, 46b include contacts for separate left and right channels for both audio out and audio in signals as well as contacts for video signals, such as RGB video signals, YPbPr component video signals and others. Similarly, many different types of digital signals can be carried by contacts in regions 46a, 46b including data signals such as, USB signals (including USB 1.0, 2.0 and/or 3.0), FireWire (also referred to as IEEE 1394) signals, SATA signals and/or any other type of data signal. Digital signals within contact regions 46a, 46b may also include signals for digital video such as DVI signals, HDMI signals and Display Port signals, as well as other digital signals that perform functions that enable the detection and identification of devices or accessories to connector 40.

In some embodiments, dielectric material is filled in between individual contacts in contact regions 46a, 46b so that the dielectric material and contacts form a completely flush outer surface of tab 44 that provides a smooth, consistent feel across the surfaces of tab 44. Additionally, to improve robustness and reliability, connector 40 can be fully sealed and includes no moving parts.

Connector 40 can have a 180 degree symmetrical, double orientation design which enables the connector to be inserted into a corresponding receptacle connector in both a first orientation where surface 44a is facing up or a second orientation where surface 44a is rotated 180 degrees and facing down. To allow for the orientation agnostic feature of connector 40, tab 44 is not polarized. That is, tab 44 does not include a physical key that is configured to mate with a matching key in a corresponding receptacle connector designed to ensure that mating between the two connectors occurs only in a single orientation. Instead, if tab 44 is divided into top and bottom halves along a horizontal plane that bisects the center of tab 44 along its width, the physical shape of the upper half of tab 44 is substantially the same as the physical shape of the lower half. Similarly, if tab 44 is divided into left and right halves along a vertical plane that bisects the center of tab along its length, the physical shape of the left half of tab 44 is substantially the same as the shape of the right half. Additionally, contacts can be positioned within contact regions 46a and 46b so that individual contacts in region 46a are arranged symmetric with the individual contacts in region 46b located on the opposite side of tab 44, and ground contacts formed at the tip or on the sides of connector tab 44 can also be arranged in a symmetric manner.

Figures 6A, 6B:
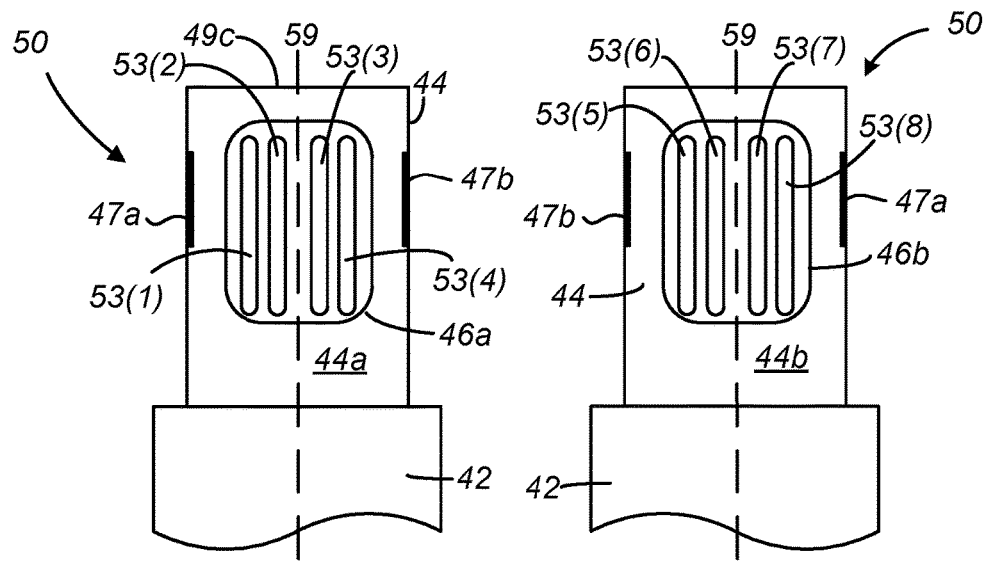
FIG. 6A is simplified view of contact region 46a of plug connector 50 and FIG. 6B is simplified view of contact region 46a of plug connector 50 shown in FIGS. 3A and 3B according to a specific embodiment of the present invention.

To better understand and appreciate the 180 degree symmetrical design of some embodiments of the invention, reference is made to FIGS. 6A and 6B which are simplified views of a first side 44a and an opposing second side 44b, respectively, of a plug connector 50 according to a specific embodiment of the invention that includes four individual contacts formed within each of contact regions 46a and 46b. For example, as shown in FIG. 6A, contact region 46a may include four evenly spaced contacts 53(1) . . . 53(4) formed within the region. With respect to a center plane 59 that is perpendicular to and passes through the middle of connector 50 along its length, contacts 53(1) and 53(2) are in a mirrored relationship with contacts 53(3) and 53(4). That is, the spacing from center line 59 to contact 53(2) is the same as the spacing from center line 59 to contact 53(3). Also, the spacing from center line 59 to contact 53(1) is the same as the spacing from centerline 59 to contact 53(4). Each of the pairs of contacts 53(1), 53(2) and 53(3), 53(4) are also spaced equally from the sides 44c and 44d of the connector with respect to each other and are spaced equally along the length of tab 44 between end surface 44e and body 42.

Similarly, in FIG. 6B contact region 44b includes the same number of contacts as region 44a that are also spaced according to the same spacing in region 44a. Thus, contact region 44b includes four contacts 53(5) . . . 53(8) spaced within region 46*b* according to the same layout and spacing as contacts 53(1) . . . 53(4) within regions 46*a*. Because the layout and spacing of contacts in regions 46*a* and 46*b* are identical, absent some sort of indicia or mark on one of surfaces 44*a* or 44*b*, the surfaces and contact layout on each of surfaces 44*a*, 44*b* looks the same. When connector 50 is inserted into a corresponding receptacle connector, the contacts in regions 46*a*, 46*b* will make proper electrical contact with contacts in the receptacle connector in either of two different orientations (referred to herein as "up" or "down" for convenience but it is to be appreciated that these are relative terms intended to connote a 180 degree change in the orientation of the connector only).

Figure 7A:
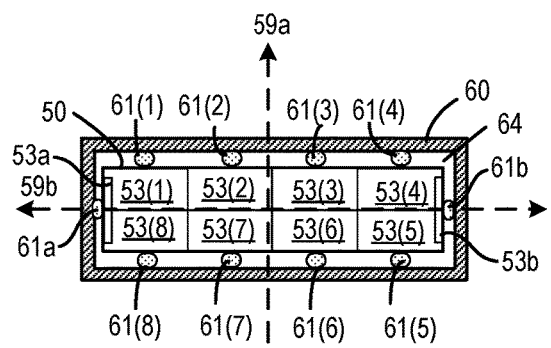
FIGS. 7A and 7B are diagrams depicting a set of exemplary contact locations according to some embodiments of the present invention.
Figure 7B:
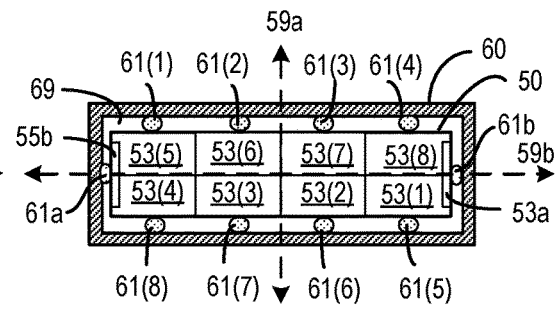

To further illustrate, reference is now made to FIGS. 7A and 7B, which schematically show a cross-sectional view of plug connector 50 having four contacts in each of regions 46*a*, 46*b* as depicted in FIGS. 6A and 6B inserted into a matching receptacle connector 60. Receptacle connector 60 includes a cavity 64 into which the tab of the plug connector can be inserted. Four contacts 61(1) . . . 61(4) extend from one interior surface of the receptacle connector into cavity 64 and four contacts 61(5) . . . 61(8) extend from the opposing interior surface into cavity 64 in an oppositional and mirrored relationship to contacts 61(1) . . . 61(4).

FIG. 7A depicts that when the connector 50 is inserted into cavity 65 in an "up" position, contact 53(1) of the plug connector aligns with contact 61(1) of the receptacle connector, contact 53(2) aligns with contact 61(2), contact 53(3) aligns with contact 61(3) and contact 53(4) aligns with contact 61(4). FIG. 7A also shows that, on the opposing surface, contact 53(5) aligns with contact 61(5), contact 53(6) aligns with contact 61(6), contact 53(7) aligns with contact 61(7) and contact 53(8) aligns with contact 61(8). When the plug connector is inserted into receptacle connector 60 in a "down" position, as shown in FIG. 7B, each contact in the plug connector still properly aligns with a contact in the receptacle connector. The contacts align differently, however, as follows: contact 53(5) of the plug connector aligns with contact 61(1) of the receptacle connector, contact 53(6) aligns with contact 61(2), contact 53(7) aligns with contact 61(3) and contact 53(8) aligns with contact 61(4), while on the opposing surface, contact 53(1) aligns with contact 61(5), contact 53(2) aligns with contact 61(6), contact 53(3) aligns with contact 61(7) and contact 53(4) aligns with contact 61(8). Additionally, when plug connector 50 includes side ground contacts 53*a*, 53*b*, each side contact aligns with a corresponding side ground contact 61*a*, 61*b* from receptacle connector 60 in either of the two possible insertion orientations as shown in FIGS. 7A and 7B.

Thus, whether connector 50 is inserted into receptacle connector 60 in either the "up" or "down" position, proper electrical contact is made between the contacts in the plug connector and the receptacle connector. Embodiments of the invention further pertain to a receptacle connector that includes circuitry that switches the functionality of its pins based on the orientation of the plug connector. In some embodiments, a sensing circuit in the receptacle connector or the electronic device in which the receptacle connector is housed, can detect the orientation of the plug connector and set software and/or hardware switches to switch internal connections to the contacts in the receptacle connector and properly match the receptacle connector's contacts to the plug connector's contacts as appropriate. In some embodiments the orientation of the plug connector can be detected based on a physical orientation key (different from a polarization key in that an orientation key does not prevent the plug connector from being inserted into the receptacle connector in multiple orientations) that, depending on the orientation of the plug connector, engages or does not engage with a corresponding orientation contact in the receptacle connector. Circuitry connected to the orientation contact can then determine which of the two possible orientations the plug connector was inserted into the receptacle connector.

Figures 8A, 8B, 8C:
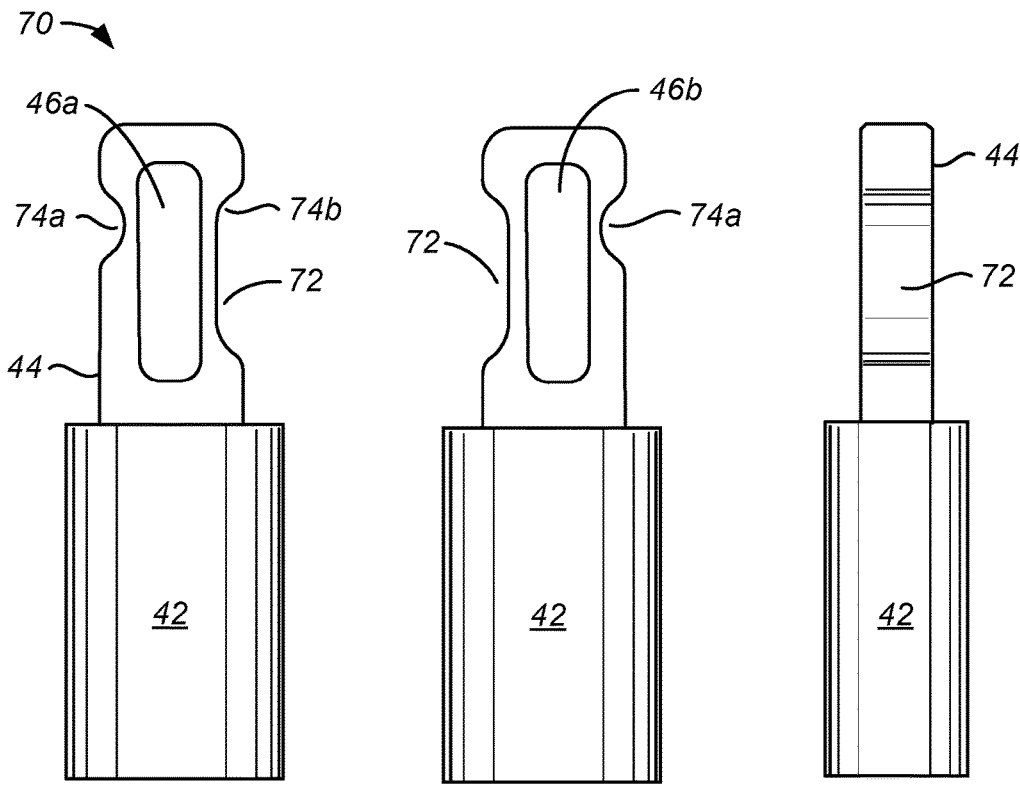
FIGS. 8A-8C are simplified top, bottom and side plan views of a plug contact connector that includes an orientation key according to another embodiment of the present invention.
Figure 9A:
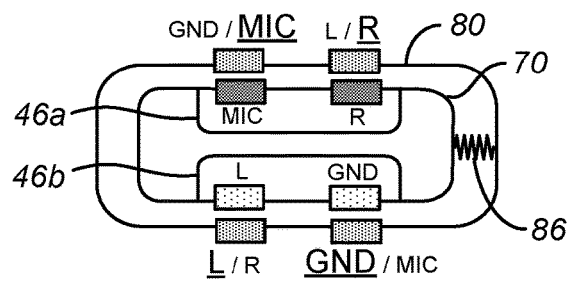
FIGS. 9A-9F are simplified schematic representations of contact arrangements of connectors according to additional embodiments of the invention.
Figure 9B:
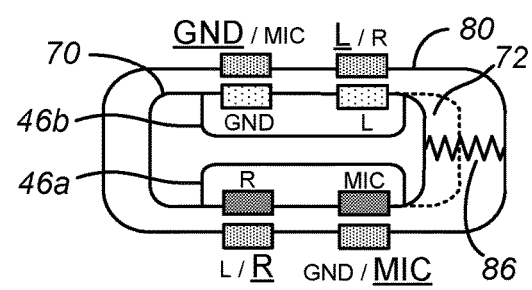

As an example, reference is now made to FIGS. 8A-8C, which show simplified top, bottom and side plan views of a plug connector 70 according to another embodiment of the present invention along with FIGS. 9A and 9B, which are simplified schematic views of plug connector 70 inserted within a receptacle connector 80. Connector 70 includes contact regions 46*a* and 46*b* formed on opposing major surfaces of the connector that may contain any reasonable number of contacts. For example, in the particular embodiment shown in FIG. 9A, connector 70 is an audio plug connector and each of contact regions 46*a* and 46*b* include two contacts: a microphone contact and right audio contact in region 46*a*, and a left audio contact and a ground contact in region 46*b*. When connector 70 is mated with receptacle connector 80, an orientation key 72 on the plug connector engages (or doesn't engage) with a corresponding orientation contact 86 within receptacle connector 80.

Circuitry operatively coupled to the receptacle connector can set software and/or hardware switches to properly match the receptacle connector's contacts to the contacts of plug connector 70. For example, a software switch can be used to switch the connector jack's contacts for left and right audio depending on the insertion orientation while a hardware switch can be used to switch the connector jacks microphone and ground contacts to match the contacts of connector 70. In other embodiments, both switches can be implemented in software or both switches can be implemented in hardware. A comparison of FIG. 9A to 9B illustrates the switching of the receptacle contacts depending on whether or not orientation contact 86 is engaged (FIG. 9B) or not engaged (FIG. 9A), where for ease of illustration, the labels of the switched contacts are underlined and depicted in a larger font.

Figure 9C:
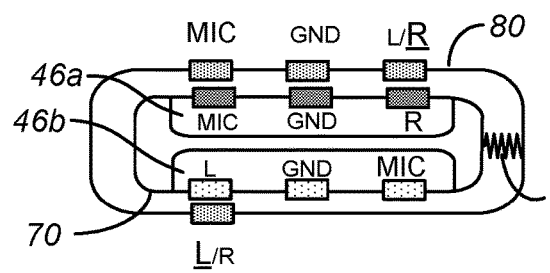
Figure 9D:
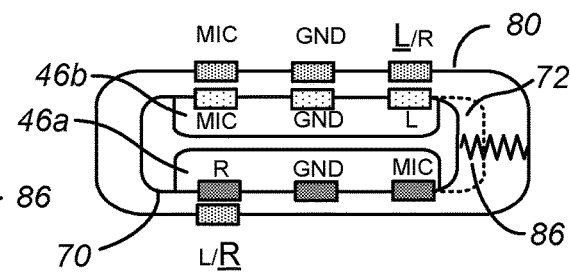

As another example, connector 70 can be a six contact audio plug connector with each of contact regions 46*a*, 46*b* including three contacts as shown in FIGS. 9C-9D: a microphone contact, a first dedicated ground contact and a right audio contact are within region 46*a*; while a left audio contact, a second dedicated ground contact and a second dedicated microphone contact are located within region 46*b*. The first and second ground contacts and first and second microphone contacts align with ground and microphone contacts of the corresponding connector jack 80 regardless of the insertion orientation of connector 70. Thus, this embodiment can be carried out with a single switch, that can be implemented in software or hardware to switch the connector jack's contacts for left and right audio depending on the insertion orientation which can be detected by orientation contact 86 within the receptacle connector.

As shown in FIGS. 8A-8C, connector 70 can also include retention features 74*a*, 74*b* on opposing side surfaces of the connector. Retention features can operate to secure connector 70 in a corresponding receptacle connector as discussed below with respect to FIGS. 12A and 12B. Notably, in the embodiment shown in FIGS. 8A-8C, retention feature 74*b* and orientation key 72 combine to form a single extended cutout on the side 44*d* of connector 70. In other embodiments, the retention feature(s) and orientation key can be completely separated from each other and even be included on separate surfaces. For example, in one embodiment orientation key 72 can be located on one of major surfaces

44a or 44b while the retention features can be located on one or both of side surfaces 44c and 44d.

In other embodiments, the plug connector does not include an orientation key and the orientation of the connector can instead be detected by circuitry associated with the corresponding receptacle connector based on signals received over the contacts. As one example, various accessories such as headsets for cellular phones include a microphone and allow a user to perform basic functions such as setting earphone volume and answering and ending calls with the push of a button on the accessory. A single wire, serial control chip can be used to communicate with the host electronic device and implement this functionality. The chip is connected to the microphone contact (e.g., contact 112b shown in FIG. 14A) and, when the plug connector is inserted into the receptacle jack, can talk to appropriate circuitry in the jack connector or host device. Upon an insertion event, the host device sends an Acknowledgment signal to the serial control chip over the contact in the receptacle connector designated for the microphone and waits for a Response signal. If a Response signal is received, the contacts are aligned properly and audio and other signals can be transferred between the connectors. If no response is received, the host device flips the signals to correspond to the second possible orientation (i.e., flips the signals 180 degrees) and repeats the Acknowledgement/Response signal routine.

Figure 9E:
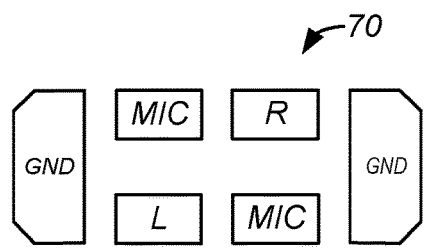
Figure 9F:
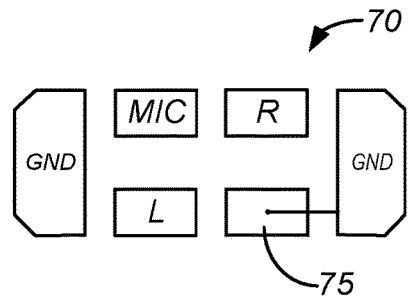

In the four contact embodiment of a plug connector 70 shown in FIG. 9E, left and right audio contacts are always in physically reversible positions while each of the other two contacts is designated as a microphone contact. In this embodiment, a physical orientation key in the plug connector, such as key 72, can be detected by an orientation contact or other appropriate mechanism in the receptacle connector to determine the orientation of the plug, and a hardware or software switch can set the receptacle connector contacts as appropriate for left and right audio to correspond to the plug connector contacts. In the embodiment of plug connector 70 shown in FIG. 9F, a contact 75 is connected to ground through, for example, a ground ring 102 (described with respect to FIGS. 10A-10B). When the connector is first plugged into a receptacle connector, circuitry associated with the receptacle connector or the electronic device in which the connector is housed detects the position of the grounded contact and switches the receptacle contacts to an appropriate orientation.

To facilitate the dual orientation feature of certain embodiments of the invention, contacts within contact regions 46a, 46b can be arranged such that similarly purposed contacts are located on opposite sides of the connector tab in a cater cornered arrangement. For example, referring back to FIG. 7A, contact 53(1) is in a cater cornered arrangement with contact 53(5) while contact 53(2) is in a cater cornered relationship with contact 53(6). Similarly purposed contacts are contacts that are designated to carry similar signals. Examples of similarly purposed contact pairs may include, first and second power contacts, left and right audio out contacts, first and second ground contacts, a pair of data differential contacts, and/or first and second digital contacts. Because of the symmetrical relationship between the contacts, such a cater cornered relationship ensures that for each pair of similarly purposed contacts in a cater cornered relationship, one of the similarly purposed contacts will be electrically connected to a contact in the receptacle connector that is either dedicated to the particular contact or can be readily switched to the particular contact. As an example, where contacts 53(1) and 53(5) are similarly purposed contacts that are dedicated to left and right audio out signals, respectively, when plug connector 50 is inserted into receptacle connector 60, one of the audio out contacts will be in electrical contact with receptacle contact 61(1) and the other of the audio out contacts will be in electrical contact with receptacle contact 61(5) regardless of whether the plug connector is mated with the receptacle connector in an "up" or "down" insertion orientation. Thus, both the receptacle contacts 61(1) and 61(5) can be audio contacts ensuring that they will be electrically coupled to an audio contact in the plug connector regardless of its insertion orientation.

While FIGS. 7A-7B depict a particular embodiment of the invention with an even number of contacts in each of contact regions 46a and 46b, some embodiments of the invention may include an odd number of contacts in each of regions 46a, 46b. In such embodiments, one of the contacts on each side of the plug connector is a central contact that is centered around bisecting line 59a and thus aligns with a centrally located receptacle contact in both the "up" and "down" positions. The central contacts are not in a cater cornered arrangement but are in a symmetrical arrangement and can be similarly purposed contacts according to some embodiments of the invention.

Figure 10A:
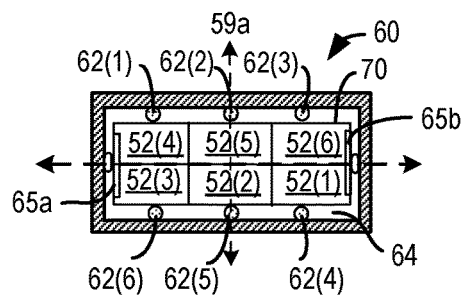
FIGS. 10A and 10B are diagrams depicting a set of exemplary contact locations according to some other embodiments of the present invention.
Figure 10B:
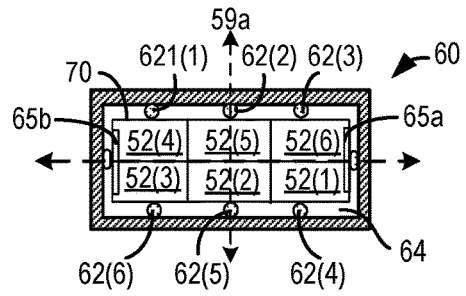

FIGS. 10A and 10B illustrate this aspect of certain embodiments of the invention and depict a plug connector 70 having three contacts 52(1) . . . 52(3) and 52(4) . . . 52(6) formed on the upper and lower surfaces of tab 44 of the plug connector, respectively. When the connector tab is inserted into a corresponding receptacle connector 80 in an "up" position, contacts 52(1) . . . 52(3) align with contacts 81(1) . . . 81(3) of the receptacle connector, respectively, and contacts 52(4) . . . 52(6) align with contacts 81(4) . . . 81(6), respectively. When the connector tab is inserted into receptacle connector 80 in a "down" position, contacts 52(4) . . . 52(6) align with contacts 81(1) . . . 81(3) of the receptacle connector, respectively, and contacts 52(1) . . . 52(3) align with contacts 81(4) . . . 81(6), respectively. In both orientations, plug connector contacts 52(2) and 52(5) align with one of the central receptacle contacts 81(2) or 81(5).

Figure 11A:
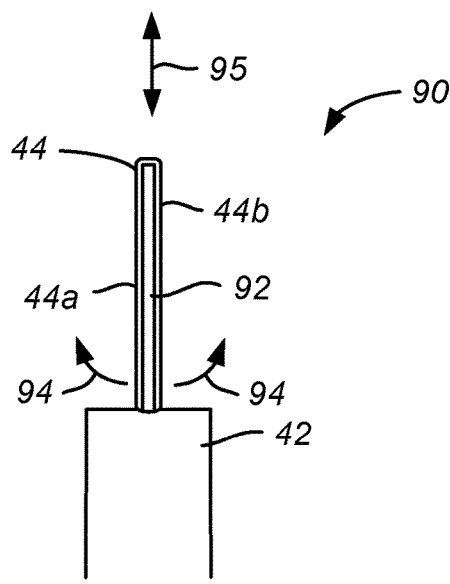
FIG. 11A is a simplified side cross-sectional view of a plug connector 90 according to one embodiment of the present invention.
Figure 11B:
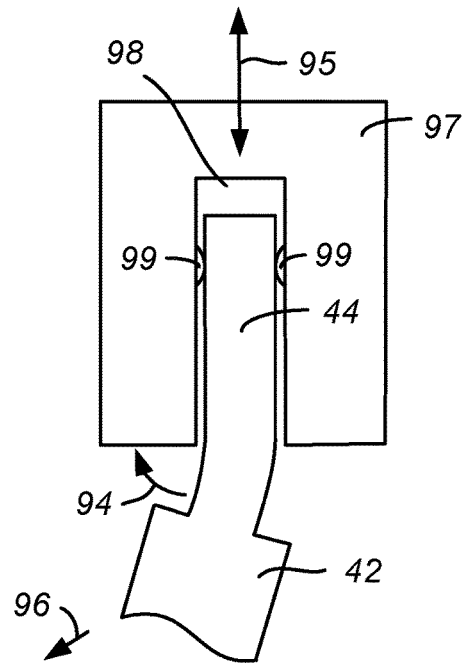
FIG. 11B is a simplified side view of plug connector 90 shown in FIG. 11A that illustrates how the connector may bend when extracted from a receptacle connector by being pulled in a direction that intersects the connector's axis of insertion.

Plug connector 40 can be designed to be inserted into a matching receptacle connector, such as receptacle connector 80, along an insertion axis. In some embodiments of the invention, at least a portion of the plug connector is made from a flexible material so that the connector can readily bend off-axis. As an example, FIG. 11A shows a simplified side cross-sectional view of a connector 90 similar to connector 40 that is intended to be inserted into a receptacle connector along an insertion axis 95. Tab 44 of connector 90 includes a flexible carrier member 92 that extends the length of tab 44 along with contacts (not shown) formed on each of the opposing surfaces 44a, 44b of connector 90 that can flex with carrier member 92. As an example, the contacts can be part of a flex circuit that is bonded to flexible carrier member 92. Flexible carrier 92 and the flexible contacts allow tab 44 to be bent along a direction 94 into a deformed shape as shown in FIG. 11B when the connector is mated with a receptacle connector 97 (i.e., positioned with an insertion cavity 98 of the receptacle connector) and subject to strain by being pulled in a direction 96 that intersects insertion axis 95. As soon as the strain is relieved, tab 44 returns to its normal shape shown in FIG. 11A. In this manner, when connector 90 is pulled out of its receptacle connector by pulling at least partially sideways (e.g., along direction 96 as opposed to pulling along axis 95) on either body 42 or the cable (not shown) attached to body 42, plug connector 90 can bend and pull out of the receptacle connector rather than binding within it or eventually breaking.

In one particular embodiment, flexible carrier 92 is a sheet of superelastic material, such as nitinol (an alloy of nickel and titanium present in roughly equal amounts) and the flexible contacts are part of a flex circuit adhered to the superelastic sheet. Nitinol alloys exhibit elasticity some 10-30 times that of ordinary metal which enables it to flex under very high strain without breaking. The flex circuit may include, for example, metal contacts screen printed on a thin polymide or PEEK (polyether ether ketone) layer. The flex circuit may be made from two separate pieces each of which is directly adhered to one side of the nitinol sheet or may be a single piece wrapped around the perimeter of the nitinol sheet or made into a sleeve that fits over the nitinol sheet.

Embodiments of the invention that include this flexibility characteristic are not limited to the use of any particular superelastic material and can instead use any material that deforms reversibly to very high strains and returns to its original shape when the load is removed without requiring a change of temperature to regain its original shape. Some embodiments of the invention may use flexible materials for carrier 92 that are not superelastic. For example, carrier 92 or tab 44 itself can be made from an elastomer or polyurethane in some embodiments.

When connector plug 90 is engaged with a corresponding receptacle connector and extracted at an angle to the insertion axis, more force is typically applied to the base of the connector than at its tip. To address this discrepancy, in some embodiments the flexibility of carrier 92 varies along the length of the carrier so that, for example, it is more flexible near the base portion or proximal end of the connector where it meets body 42 and less flexible near the distal end of the connector. Flexibility can be varied in this manner by, among other techniques, varying the materials along the length of the connector, varying the thickness of the flexible carrier along its length or varying the shape of the flexible carrier along its length or any combination of these approaches. For example, in one embodiment carrier 92 may include a superelastic sheet near its base and a polyurethane sheet near its distal end. The superelastic and polyurethane sheets may overlap and be adhered together in an area between the proximal and distal ends. In one particular embodiment, carrier 92 comprises two sheets of polyurethane near the distal end of tab 44 and a single sheet of nitinol near the base of tab 44 where the tab joins body 42. At a point approximately one third of the length of the connector from the distal end, the nitinol sheet is sandwiched between the two polyurethane sheets for a portion of the length.

Figure 12A:
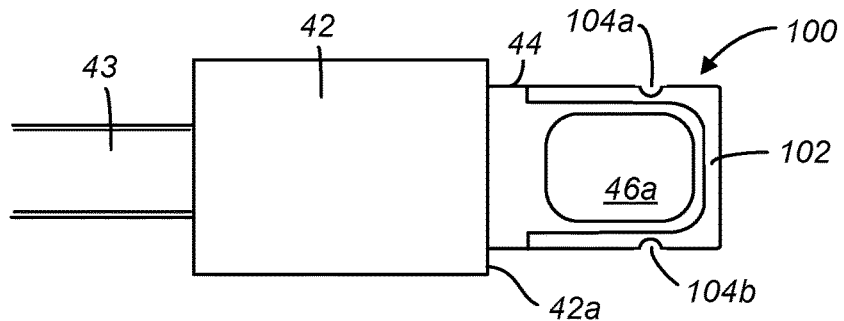
FIG. 12A is simplified top view of a plug connector 100 according to another embodiment of the present invention.
Figure 12B:
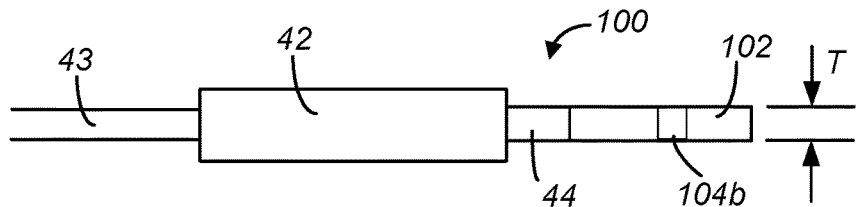
FIG. 12B is a simplified side view of connector 100 shown in FIG. 12A.

Reference is now made to FIGS. 12A and 12B, which are simplified top and side views of a plug connector 100 according to another embodiment of the invention. Plug connector 100 includes many of the same features as plug connector 40 but further includes a cap 102, and first and second retention features 104a and 104b, respectively, near a distal tip of the connector. Cap 102 can be made from a metal or other conductive material and can extend from the distal tip of connector 100 along the side of the connector towards body 42 either fully or partially surrounding contacts formed in contact regions 46a and 46b in the X and Y directions. Cap 102 can be grounded in order to minimize interference that may otherwise occur on the contacts of connector 100. In one embodiment, cap 102 may be a u-shaped frame having a thickness that is equivalent to the thickness (T) of connector 100. In another embodiment, cap 102 covers the entirety of tab 44 except for contact regions 46a, 46b and thus defines the shape of tab 44. Cap 102 is sometimes referred to herein as a ground ring and those two terms are intended to be used interchangeably. Cap 102 can be formed in a variety of ways and in one embodiment can be die cast from a metal, such as stainless steel, that can be slid over and attached to the end of connector tab 44 thus partially or fully surrounding contact regions 46a and 46b at the tip and sides of the connector.

Figure 13A:
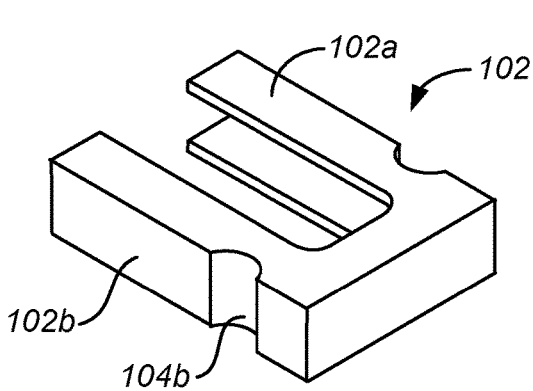
FIGS. 13A and 13B are simplified perspective views of a ground ring that can be included in some embodiments of the present invention.
Figure 13B:
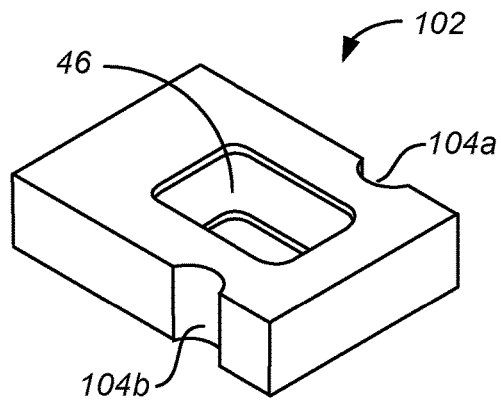

FIGS. 13A and 13B show two different embodiments of cap 102. In FIG. 13A, cap 102 is a u-shaped frame that can be attached to or slid over the end of the connector. Cap 102 includes side portions 102a, 102b that may have varying lengths in different embodiments. In some embodiments sides 102a, 102b extend past contact regions 46a, 46b all the way to the body 42 of the connector. In other embodiments the sides may extend past contact regions 46a, 46b but not all the way to body 42 (as shown in FIG. 12A); may extend exactly to the end of contact regions 46a, 46b or may be relatively short and extend only partially along the length of the contact regions. Contact regions 46a, 46b lie between the opposing sides 102a, 102b. In still other embodiments, cap or ground ring 102 defines the exterior shape of tab 44 completely surrounding the contact regions 46 at the outer surfaces of the connector as shown in FIG. 13B.

Referring back to FIGS. 12A and 12B, retention features 104a, 104b are formed on the opposing sides of connector 100 and are part of a retention system that includes one or more features on the plug connector that are adapted to engage with one or more features on the corresponding receptacle connector to secure the connectors together when the plug connector is inserted into the receptacle connector. In the illustrated embodiment, retention features 104a, 104b are semi-circular indentations in the side surfaces of tab 44 that extend from surface 44a to surface 44b The retention features may be widely varied and may include angled indentations or notches, pockets that are formed only at the side surfaces and do not extend to either of the surfaces 44a, 44b upon which contact regions 46a, 46b are formed, or other recessed regions. The retention features are adapted to engage with a retention mechanism on the receptacle connector that can be similarly widely varied. The retention mechanism(s) may be, for example, one or more springs that includes a tip or surface that fits within indentations 104a, 104b, one or more spring loaded detents, or similar latching mechanisms. The retention system, including retention features 104a, 104b and the corresponding retention mechanism on the receptacle connector, can be designed to provide specific insertion and extraction forces such that the retention force required to insert the plug connector into the receptacle connector is higher than the extraction force required to remove the plug connector from the receptacle connector.

While retention features 104a, 104b are shown in FIGS. 12A and 12B as having a female mating characteristic and the retention mechanism was described above as having a male characteristic that is moved into the retention features 104a, 104b, in other embodiments these roles may differ. For example, in one embodiment, retention features 104a, 104b may be spring loaded projections that engage with a female retention mechanism on the receptacle connector. In still other embodiments, one of features 104a, 104b may be male-oriented while the other of features 104a, 104b is female-oriented. In other embodiments, other retention mechanisms can be used such as mechanical or magnetic latches or orthogonal insertion mechanisms.

Additionally, while retention features 104a and 104b are shown in FIGS. 12A and 12B as being formed in metal cap 102, in embodiments of the invention that do not include a metal cap or ground ring, the retention features can be formed in whatever structure or material makes up tab 44.

Retention features 104a, 104b can also be located at a variety of positions along connector 100 including along the side surfaces of tab 44 and/or top and bottom surfaces of tab 44. In some embodiments, retention features 104a, 104b can be located on a front surface 42a of body 42 and adapted to engage with a retention mechanism located on a front exterior surface of the receptacle connector. In the embodiment illustrated in FIGS. 12A and 12B, retention features 104a, 104b are positioned within the last third of the length of tab 44. The inventors have determined that positioning the retention features and corresponding latching mechanism in the receptacle connector near the end of the plug connector helps to better secure the connector sideways when it is in an engaged position within the receptacle connector.

The description of various embodiments of the invention set forth above with respect to FIGS. 3A-13B describes a number of different features, aspects and variations of different embodiments of the invention. To gain a further understanding of the invention, numerous additional embodiments and examples of the invention including both audio connector and data connector embodiments are discussed below that include some or all of the features already mentioned as well as additional features. The various embodiments discussed below include many features in common with embodiments already discussed and with each other. As a matter of convenience such common features are often, but not always, referred to with the same reference number. Additionally, in the discussion below, reference to a connector having a specific number of contacts generally refers to the number of contacts on the opposing major surfaces of the connector and does not include any ground or other contacts formed on the tip and/or sides of the connector.

Figure 14A:
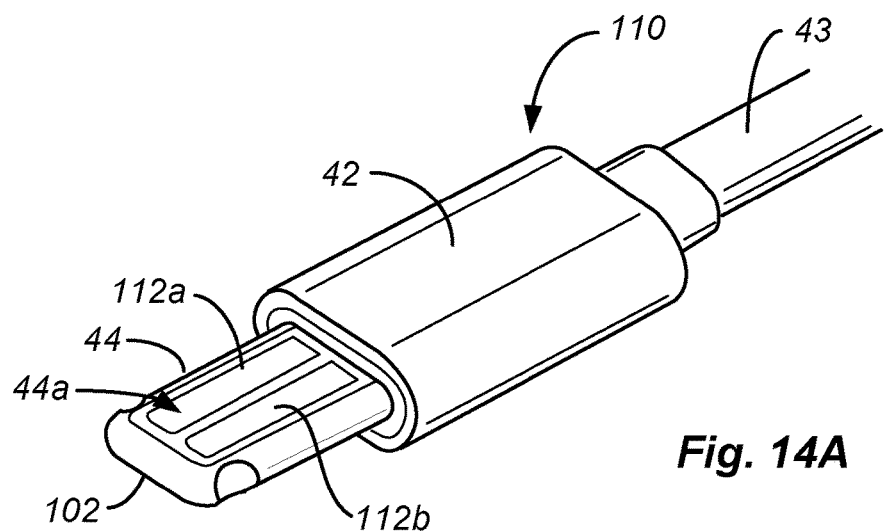
FIG. 14A is a simplified perspective view of an audio plug connector 110 according to one embodiment of the present invention.
Figures 14B, 14C, 14D:
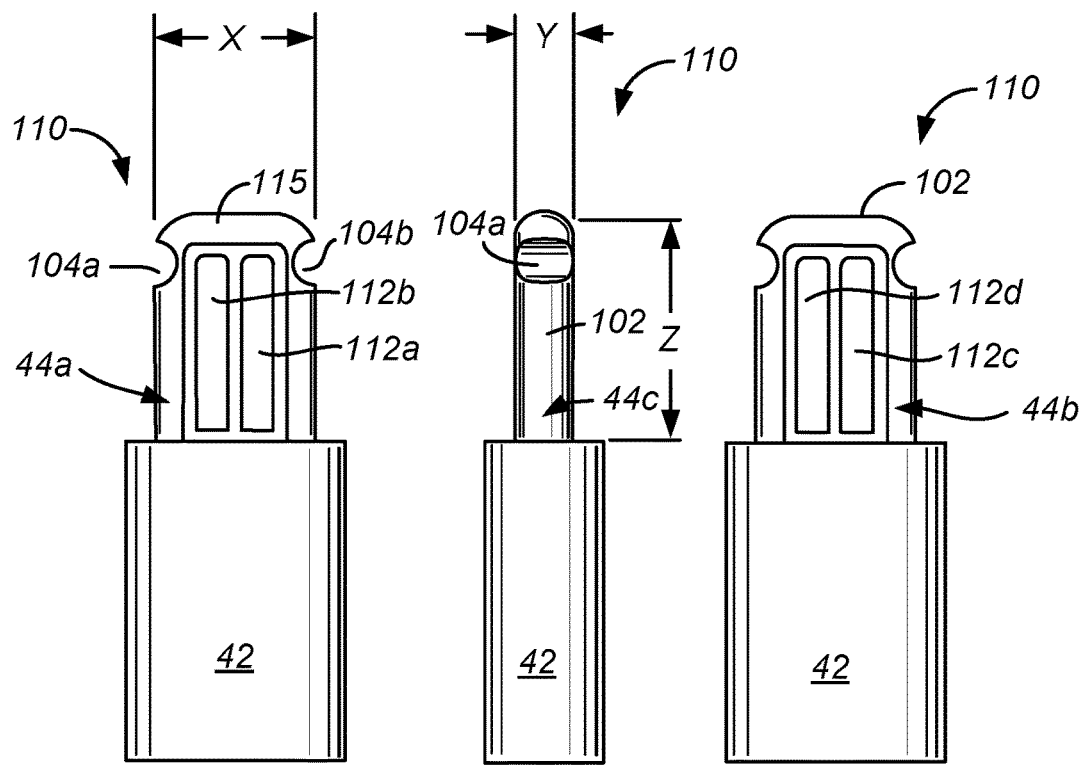
FIGS. 14B-14D are simplified plan views of the audio plug connector shown in FIG. 14A.

FIG. 14A is a simplified perspective view of a four contact plug connector 110 according to an embodiment of the invention while FIGS. 14B-14D are simplified top, side and bottom plan views, respectively, of connector 110. As shown connector 110 includes a tab 44 that extends from body 42. Tab 44 has a front major surface 44a upon which two contacts 112a and 112b are positioned and a back major surface 44b upon which two contacts 112c and 112d are located.

The contacts can be made from a copper, nickel, brass, a metal alloy or any other appropriate conductive material. Spacing is consistent between each pair of contacts 112a, 112b and 112c, 112d providing 180 degree symmetry so that plug connector 110 can be inserted into a corresponding receptacle connector in either of two orientations. In one particular embodiment, connector 110 is an audio plug connector and contact 112a is a left audio contact, contact 112b is a microphone contact, contact 112c is a right audio contact and contact 112d is a second, redundant microphone contact. Embodiments of the invention are not limited to any particular contact arrangement, however, and can be designated for other signals. In another four contact plug connector embodiment, connector 110 is a data connector and each of contacts 112a-112d can be designated for data signals. For example, contacts 112a and 112b can be designated for a first pair of differential data signals (e.g., data transmit) while contacts 112c and 112d can be designated for a second pair of differential data signals (e.g., data receive). In other embodiments, contacts 112a-112d can be designated for a wide variety of other signal types.

Metal ground ring 102 defines the shape of tab 44 and surrounds the contacts 112a-112d along an outer periphery of the tab. Two semi-circular notches 104a and 104b, are formed in ground ring 102 and located on opposing sides 44c and 44d of the tab near its distal end. In operation, tab 44 is inserted into a receptacle connector (e.g., shown in FIGS. 28A-28C) until notches 104a and 104b operatively engage with a retention mechanism, such as a cantilevered spring or detent.

In the engaged position, each of contacts 112a-112d is in electrical contact with a corresponding contact in the receptacle connector. Tab 44 has a 180 degree symmetrical, double orientation design which enables the connector to be inserted into the connector jack with either surface 44a or 44b on top. Additionally, the two audio contacts 112a and 112c are located on opposite sides of the connector in a cater cornered arrangement. Thus, microphone contact 112d is located directly opposite audio contact 112a and microphone contact 112b is located directly opposite audio contact 112c. In this manner, an audio contact is always on the right side of the connector and a microphone contact is always on the left side of the connector (as oriented from the connecter base to the distal end). A sensing circuit in the receptacle connector or the electronic device in which the receptacle connector is housed, can detect the direction that the contacts 112a-112d are set and switch internal connections to the contacts in the connector jack appropriately as described above.

As shown in FIGS. 14A-14D, contacts 112a-112d are external contacts and connector 110 does not include an exposed cavity in which particles and debris may collect. To improve robustness and reliability, connector 110 is fully sealed and includes no moving parts. Furthermore, connector 110 has a considerably reduced insertion depth and insertion width as compared to commonly available TRS and TRRS connectors. In one particular embodiment, tab 52 of connector 50 has a width, X, of about 2 mm; a thickness, Y, of about 1 mm; and a insertion depth, Z, of about 4 mm. In another embodiment, tab 52 of connector 50 has a width, X, of 4.1 mm; a thickness, Y, of 1.5 mm; and a insertion depth, Z, of 5.75 mm.

Figure 15A:
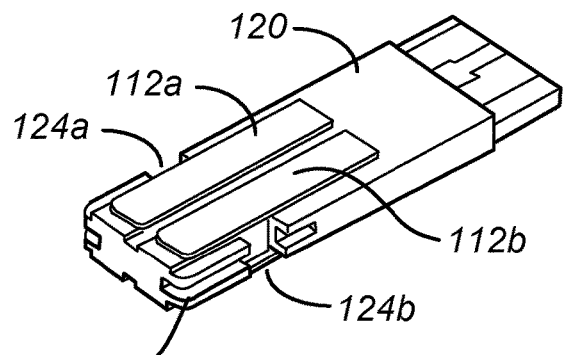
FIGS. 15A-15E are exploded perspective views of the connector 110 shown in FIG. 14A at various stages of manufacture.

Reference is now made to FIGS. 15A-15E, which show perspective views of connector 110 at various stages of manufacture. As shown in FIG. 15A, within connector 110 is a dielectric frame 120 that supports contacts 112a-112d. Frame 120 can be made from any appropriate dielectric material, such as polypropylene, and includes respective slots (not labeled) on the upper and lower surfaces of the frame through which each of contacts 112a-112d are threaded to better support the contacts. In other embodiments, frame 120 can be made from a ceramic material and contacts 112a-112d can be printed directly onto the frame.

Figure 15B:
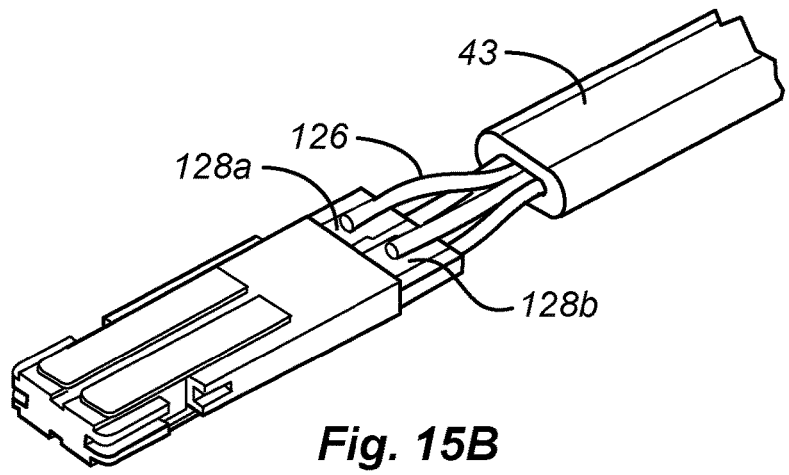
Figure 15C:
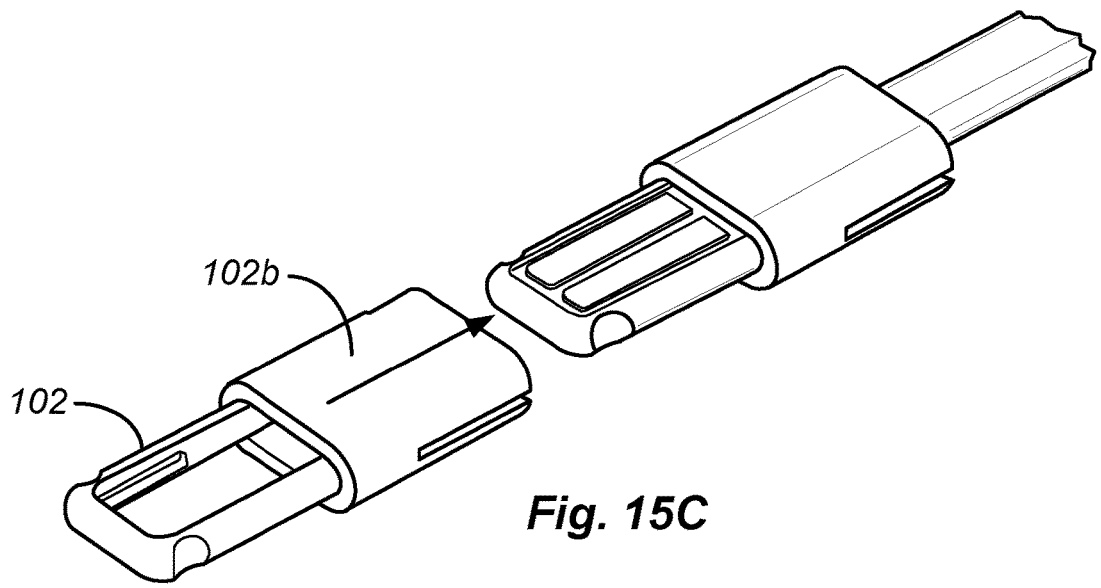
Figure 15D:
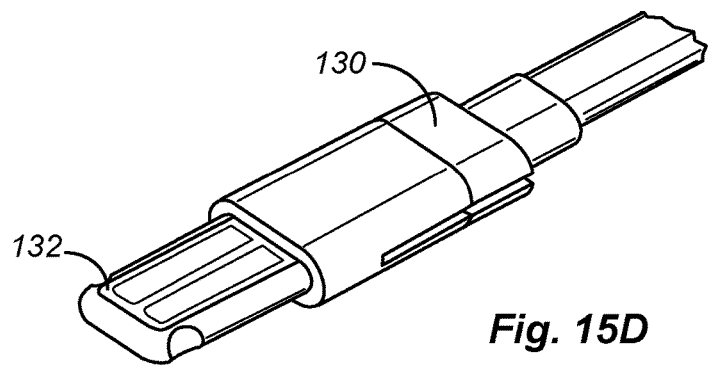

Frame 120 also includes grooves 122 partially surrounding an outer periphery at a distal tip of the frame as well as reliefs 124a, 124b that are positioned to align with notches 104a, 104b formed in the metal ground ring 102. Wires 126, one per contact, extend from a cable 43 are soldered to connection pads 128a-128d for each of the contacts 122a-112d as shown in FIG. 15B. The metal ground ring 102, which in the embodiment shown in FIG. 15C is a U-shaped frame die cast from stainless steel, is then slid over the distal end of the connector such that slots along an interior surface of the metal ring extend into the grooves 122 and a base portion 102b of the ground ring covers the soldered connection pads 128a-128d electrically coupled to contacts 112a-112d.

Figure 15E:
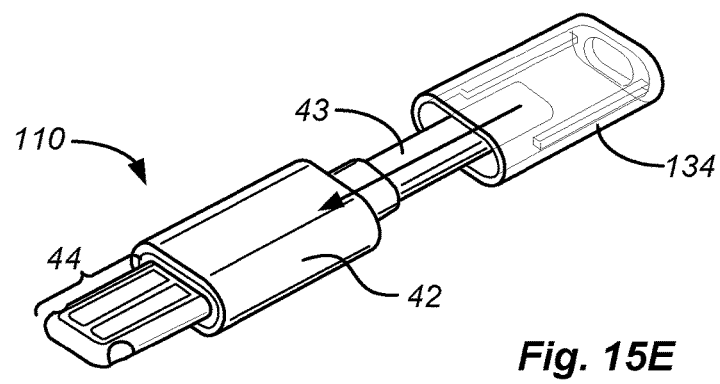

The connector is then overmolded (FIG. 15D) with thermoplastic polymer 130 or similar material to provide strain relief and insulation 132, e.g., POM, is injected around the contacts. Finally, an ABS or similar shell 134 is positioned over and fastened or bonded to the base 102(b) of the tab 102 as shown in FIG. 15E using an appropriate adhesive or other technique to form body 42 and complete formation of the connector.

Figure 16A:
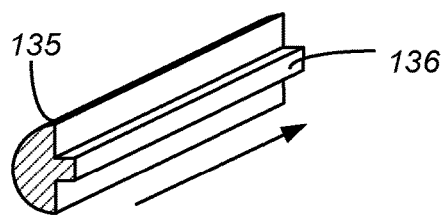
FIGS. 16A-16C illustrate one example of how ground ring 102 shown in FIG. 14A can be formed.
Figure 16C:
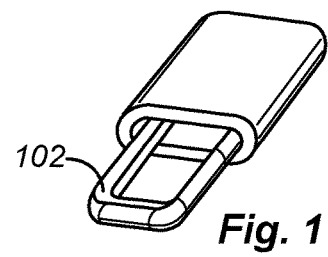
Figure 16B:
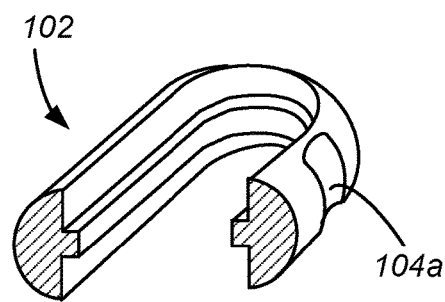

In another embodiment, the conductive ground ring 102 can be made from a high strength steel alloy or similar material. The ground ring can be formed in an extrusion process where the high strength conductive material is extruded through a mushroom shape mold to form a straight metal piece 135 having a mushroom shaped cross-section as shown in FIG. 16A. A stem section 136 of the ground ring can be designed to mate with grooves 122 positioned along the outer periphery of dielectric frame 120 when the ground ring is attached to frame 120. Extruded piece 135 can then be cut to length and notched to form u-shaped notches 104a, 104b that align with reliefs 124a, 124b in frame 120 prior to being bent into the U-shape ground ring 102 as shown in FIG. 16B. Stem section 136 of the U-shaped ground ring 102 can then be aligned with grooves 122 of the dielectric frame so that the ground ring can be slid over the end of frame 120 and welded, glued or otherwise bonded to the various components of the connector (the particular bonding method being selected based on the materials being connected) as shown in FIG. 16C, which for simplicity omits various features of the connector such as contacts 112a-112d.

Figure 17A:
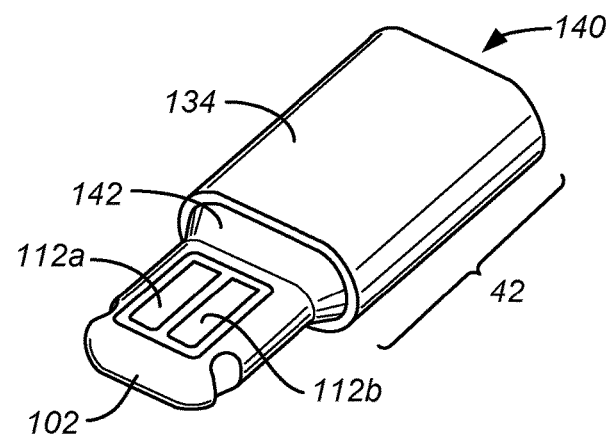
FIG. 17A is a simplified perspective view of an audio plug connector 140 according to another embodiment of the present invention.
Figure 17B:
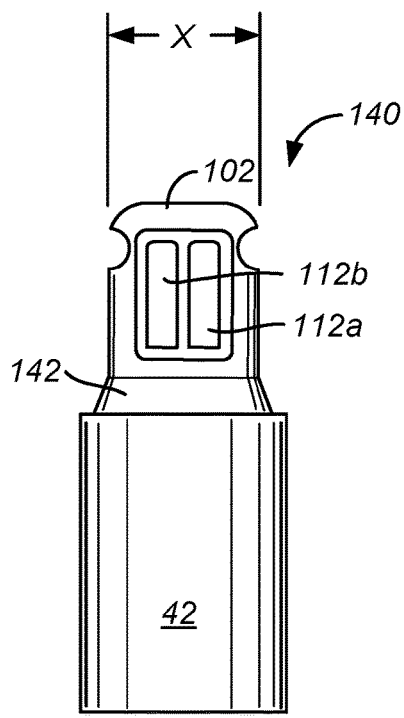
FIGS. 17B-17D, which are simplified plan views of connector 140 shown in FIG. 17A.
Figure 17C:
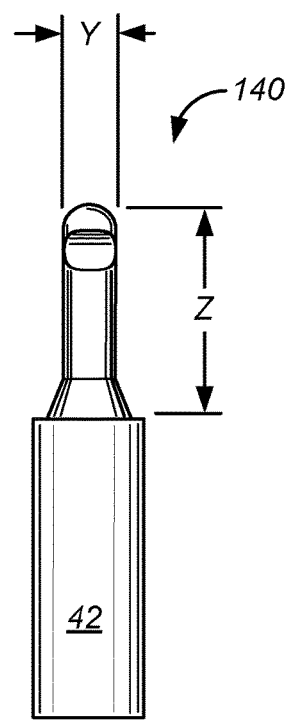

FIG. 17A is a simplified perspective view of an audio plug connector 140 according to another embodiment of the present invention. Connector 140 is similar to connector 110 except that it has been reinforced at the base of tab 44 to stiffen the connector and increase its strength in a side-load condition. Specifically, connector 140 has a thicker base portion 102(b) underneath outer shell 134 that forms body 42. A chamfered edge 142 extends between the thicker base portion to a connector portion of tab 44. To keep the insertion depth, Z, of the connector the same as that of connector 110, each of the contacts 112a-112d have a reduced length in connector 140 as compared to connector 110. While none of the figures herein are not meant to represent exact dimensions of the connectors, the reduced length can be seen generally by comparing FIG. 17A to FIG. 14A, which shows connector 110.

Figure 17D:
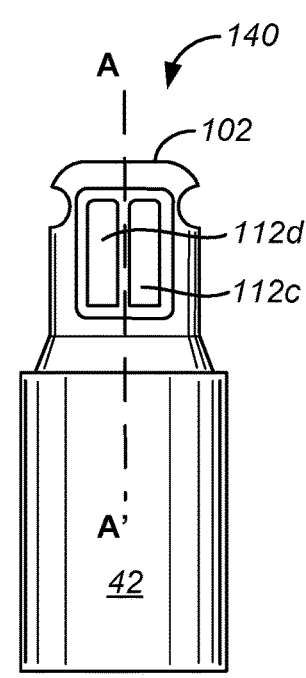

FIG. 18, is a simplified cross-sectional view of connector 140 along lines A-A' shown in FIG. 17D. As evident from the cross-sectional view, ground ring 102 forms a tip 143 of the connector as well as chamfered edge 142. Insulators 144 and 145, which can be a single part or separate parts and can be made from a thermoplastic or similar material, encircle the base and tip of the tab portion of connector 140, respectively, for cosmetic purposes. Insulator 144 also extends within the body of connector 140, underneath ground ring 102 to provide the thicker base portion. In one particular embodiment, insulators 144, 145 are made from polyoxymethylene (POM) plastic. A dielectric frame 148 runs through connector 140 to provide support for contacts 112a-112d. Wires 146 are soldered to each of the contacts 112a-112d within a cavity 149 formed at a connection pad coupled to the contacts that is surrounded by overmolding 147. In other embodiments, shown as separate examples in FIGS. 19A and 19B (which show an expanded view of chamfer portion 142 of tab 44 along with a portion of outer shell 134), insulator 144 interlocks with the ground ring to provide a more secure connection between insulator 144 and the ground ring.

Figure 20A:
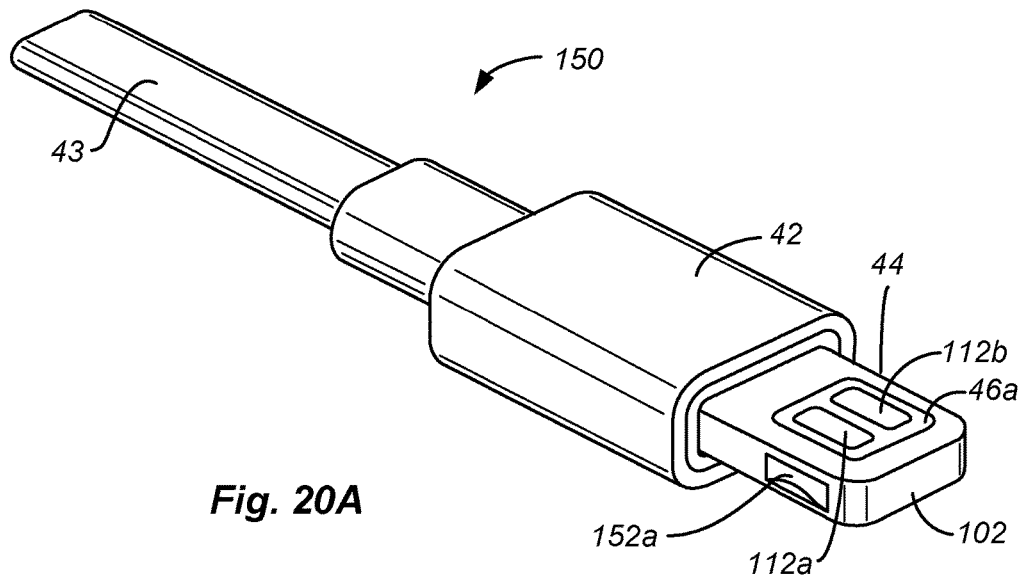
FIG. 20A is a simplified perspective view of a plug connector 150 according to one embodiment of the present invention.

Reference is now made to FIG. 20A, which is a simplified perspective view of a four contact plug connector 150 according to another embodiment of the invention. Connector 150 is generally similar to connector 110 shown in FIG. 14a except that body 42 and tab 44 of connector 150 have features that are generally more rectangular than similar features in connector 110 and connector 150 includes pockets 152 formed on the sides of tab 44 as retention feature rather than semi-circular notches. As shown in FIG. 20A, the edges of body 42 of connector 150 are less rounded and more rectangular than those of body 42 of connector 110. Similarly, the edges of tab 44 in connector 150 are also less rounded and more rectangular than those of tab 44 in connector 110 and the tab in connector 150 is shorter and stubbier than that of connector 110.

Indentations or pockets 152a, 152b on each side of the connector in ground ring 102 act as retention features, and function similarly to notches 104a, 104b in connector 110. Pockets 152a, 152b are adapted to operatively engage with a retention mechanism when the connector is mated with a corresponding receptacle connector. The retention mechanism fits within pockets 152a, 152b and provides a retention force that secures connector 100 to the matching receptacle connector. In addition to their retention feature, pockets 152a, 152b are part of metal ground ring 102 and serve as ground contacts, such as contacts 47a and 47b described with respect to FIGS. 3A and 3B.

Figure 20B:
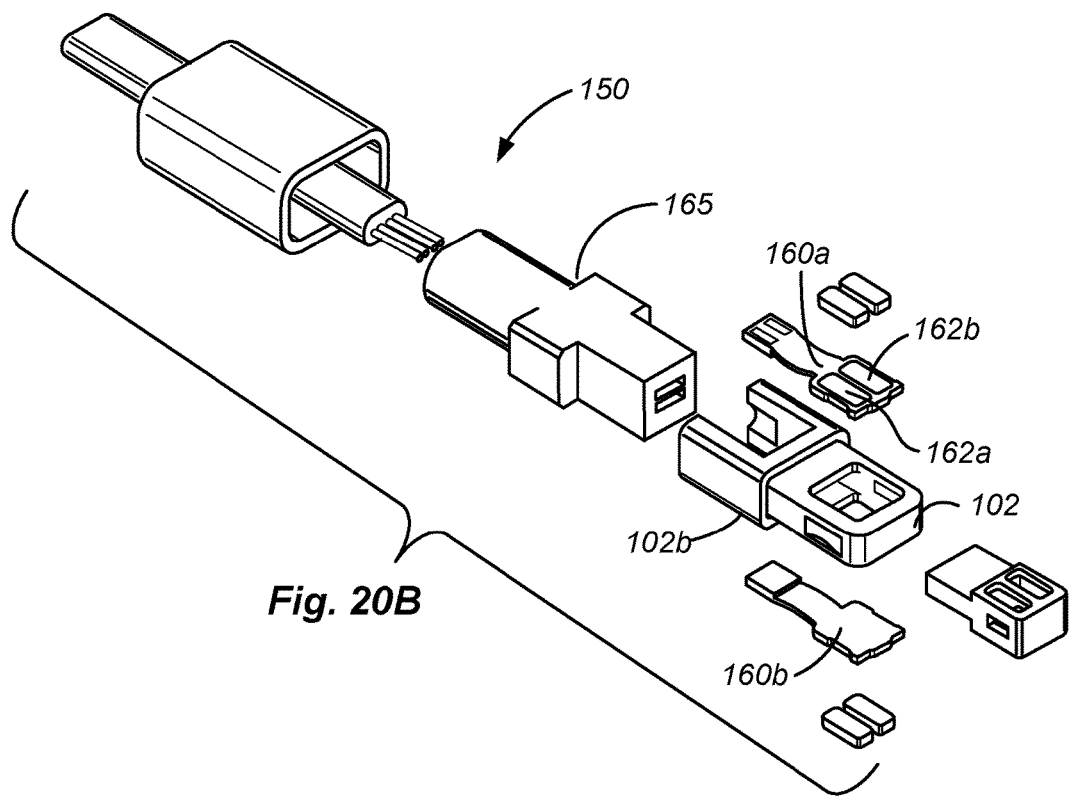
FIG. 20B is an exploded view of plug connector 150 shown in FIG. 20A.
Figure 21:
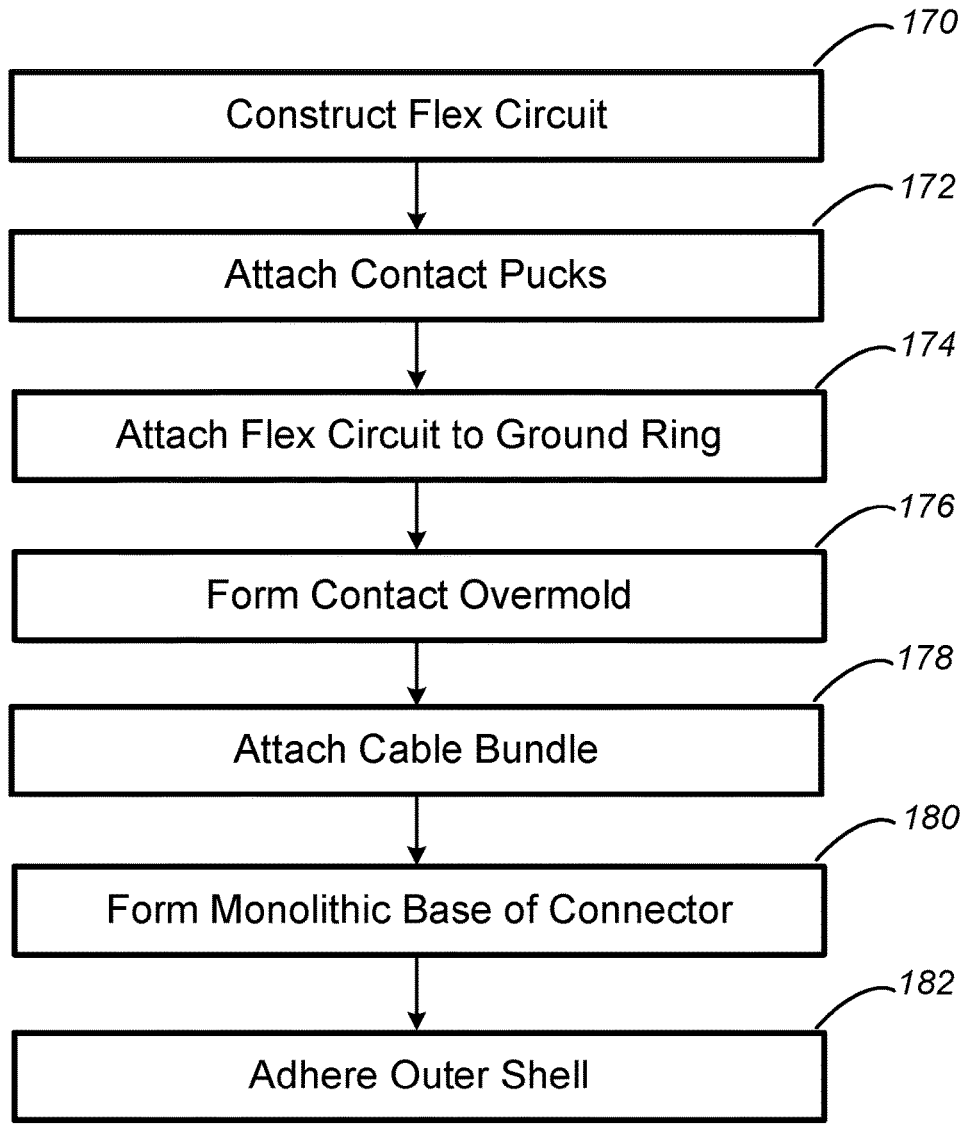
FIG. 21 is a flowchart depicting steps associated with manufacturing connector 150 according to one embodiment of the invention.
Figure 22A:
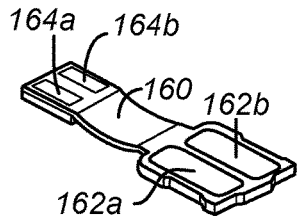
FIGS. 22A-22H are simplified perspective views of connector 150 shown in FIGS. 20A and 18B at different stages of manufacture discussed with respect to FIG. 21.

Reference is now made to FIG. 20B, which is an exploded view of connector 150, along with FIG. 21, which is a flow chart that illustrates steps associated with the manufacture of connector 150 according to one embodiment of the invention, and FIGS. 22A-22G, which depict connector 150 at the various stages of manufacture set forth in FIG. 19. The manufacture of connector 150 can start with the construction of a flex circuit 160 having flex contacts 162a and 162b formed on an upper surface and a similar pair of flex contacts (not shown in the figures) formed on a lower surface as shown in FIG. 22A (FIG. 21, step 170). Flex contact 162a is electrically coupled to a solder landing 164a where a signal wire can be soldered to the contact by a trace (not shown) on the flex circuit. Similarly, flex contact 162b is electrically coupled to a solder landing 164b by a trace on flex circuit 160.

In one embodiment, flex circuit 160 is made from two substantially identical flex circuits 160a, 160b adhered together. For example, a first flex circuit 160a with flex contacts 162a and 162b formed on its upper surface and no contacts formed on its opposing surface is adhered to a second flex circuit 160b with two flex contacts (not shown but similar to contacts 162a and 162b) formed on its upper surface and no contacts formed on its opposing surface. The two surfaces without the contacts are then joined together to form an assembled flex circuit 160 that has flex contacts 162a, 162b on a first surface and two matching contacts 162c, 162d on its opposite surface.

Figure 22B:
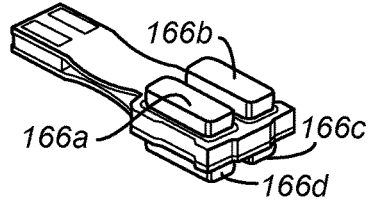
Figure 22C:
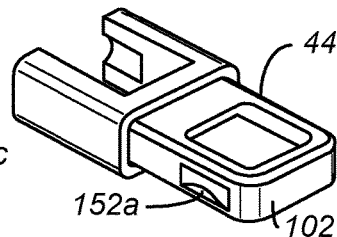
Figure 22D:
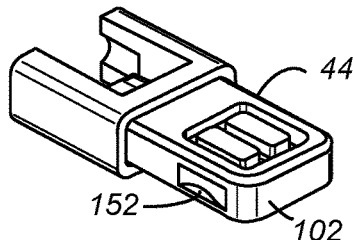

Contact pucks 166a and 166b can then be attached to the flex circuit at contact areas 162a, 162b, respectively, while contact pucks 166c and 166d can be attached to contact areas on the other side of flex circuit 160 (FIG. 21, step 172 and FIG. 22B). Pucks 166a-166d can be made from a variety of conductive materials and in one embodiment are nickel-plated brass. Pucks 166a-166d can be cut to size in a stamping or similar process from a metal sheet and can be attached to flex circuit 160 using surface mount technology. Next, flex circuit 160 can be inserted into ground ring 102 (FIG. 21, step 174 and FIG. 22C) and a thermoplastic or similar dielectric overmold 163 can formed around the contacts to provide smooth and substantially flat upper and lower surfaces of tab portion 44 of the connector and provide a finished look (FIG. 21, step 176 and FIG. 22D). In one embodiment, dielectric overmold 163 is formed with an injection molding process using polyoxymethylene (POM).

Figure 22F:
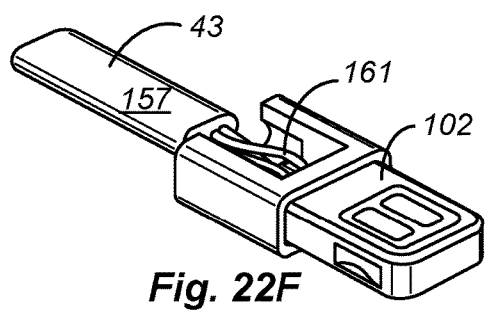
Figure 22E:
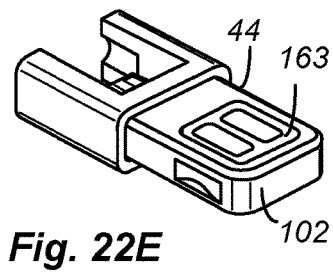
Figure 22G:
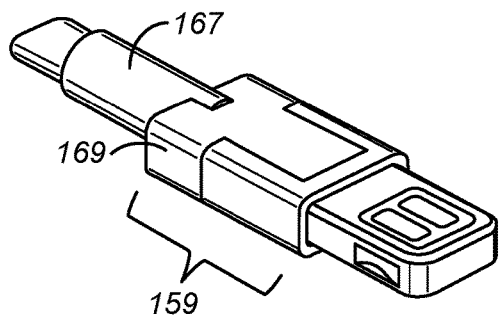
Figure 22H:
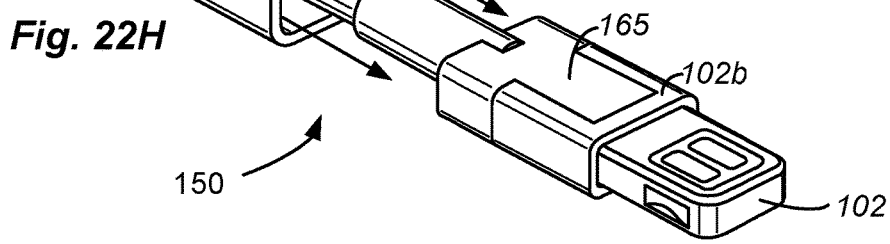

A cable bundle 43 having four individual and insulated signal wires 161, one for each of the contacts of connector 150, can then be attached to the ground ring/flex circuit assembly as shown in FIG. 22E by soldering each of the wires 161 to its respective solder landing, e.g., solder landings 164*a*-164*d* (FIG. 21, step 178). At this stage of manufacture the end of a jacket 157 of cable bundle 43 is spaced apart from flex circuit 160 in an oppositional relationship. An inner dielectric jacket 165 is then formed around much of the assembly using an injection molding or similar process (FIG. 21, step 180 and FIG. 22F). Inner jacket 165 includes a generally circular end portion 167 that covers a couple centimeters or more of cable bundle 43 and a connector portion 169 that, combined with ground ring 102, forms a substantially monolithic base portion 159 of connector 150. Inner jacket 165 provides structure and strain relief for connector 150 and can be made from a dielectric material such as an elastomer or a polypropylene material.

The construction of connector 150 can then be completed by sliding an outer shell 134 around the monolithic base portion 159 covering an end base portion 102*b* of ground ring 102 and inner jacket 165 (FIG. 20, step 182 and FIG. 219G). Outer shell 134 can be adhered to the ground ring and inner jacket using any appropriate adhesive suitable for the particular materials being bonded.

Figure 23A:
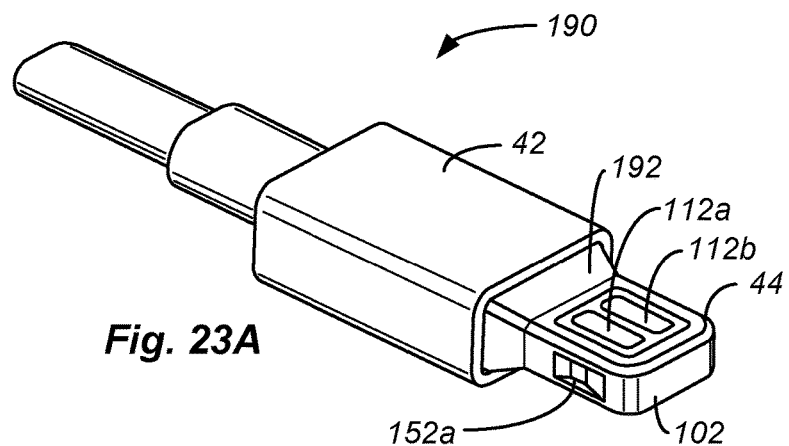
FIG. 23A is a simplified perspective view of a plug connector 190 according to another embodiment of the invention.

FIG. 23A is a simplified perspective view of a plug connector 190 according to another embodiment of the invention. Connector 190 includes many features similar in design and function as that of connector 150 discussed above. For example, connector 190 includes a tab 44 having four contacts 112*a*-112*d* formed at its outer surface and arranged on opposing sides of the connector. Tab 44 includes a ground ring 102 that surrounds contacts 112*a*-112*d* and includes indentations or pockets 152*a*, 152*b* of each side of the connector tab are adapted to operatively engage with a retention mechanism when the connector is mated with a corresponding receptacle connector. Connector 190 differs from connector 150 by including a chambered edge 192 between the tab and the body that strengthens the connector under side-load forces similar to chamfered edge 142 of connector 140.

Figure 23B:
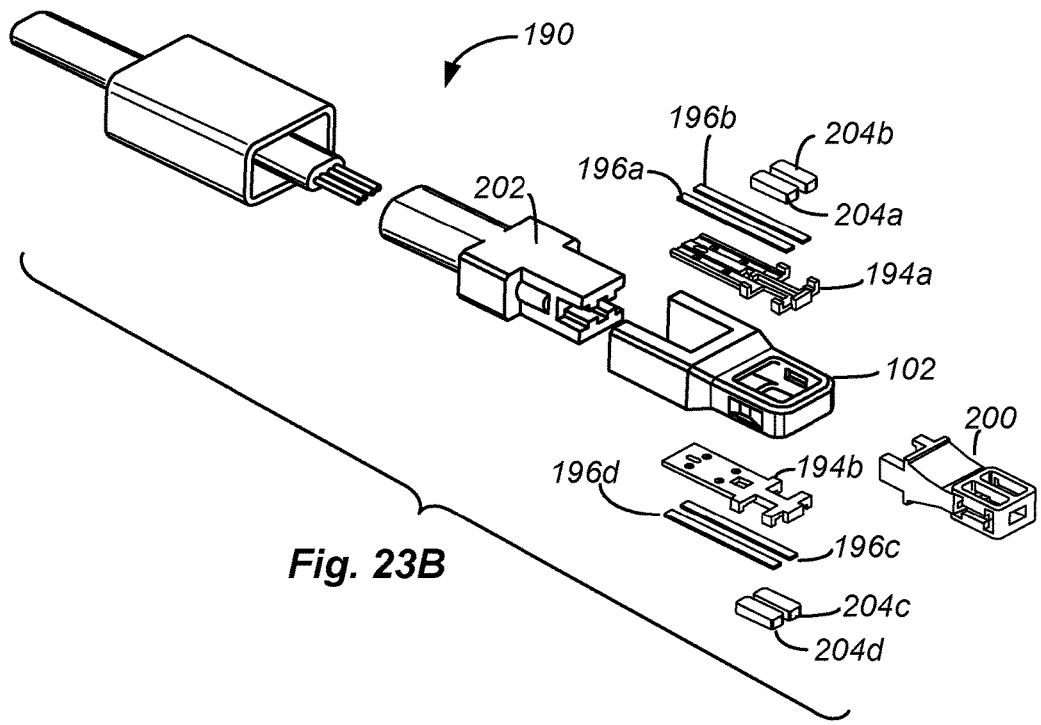
FIG. 23B is an exploded view of connector plug 190 shown in FIG. 23A.
Figure 24:
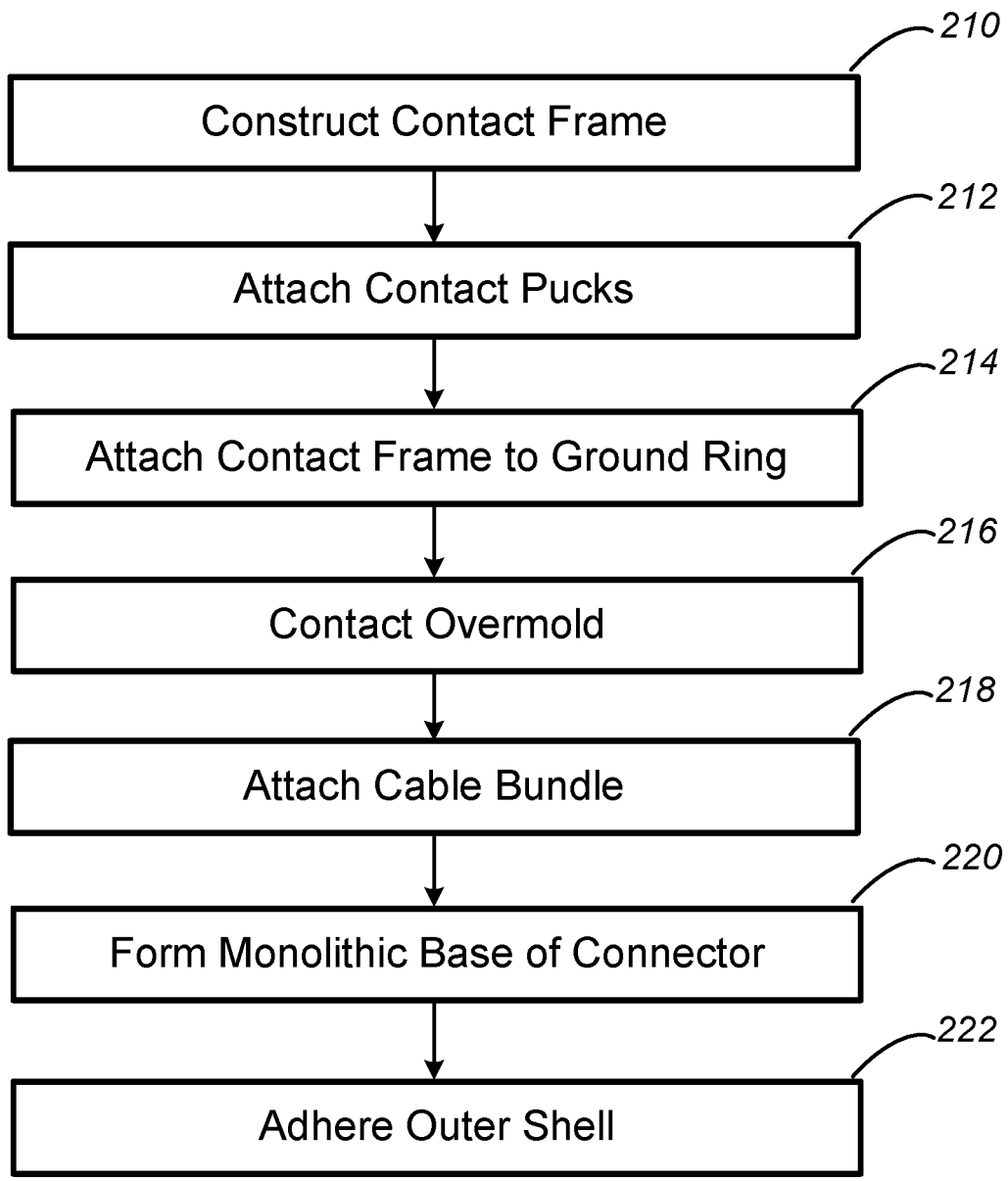
FIG. 24 is a flowchart depicting steps associated with manufacturing connector 190 according to one embodiment of the invention.
Figure 25A:
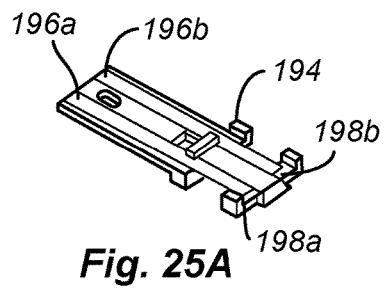
FIGS. 25A-25G are simplified perspective views of connector 190 shown in FIGS. 23A and 21B at different stages of manufacture discussed with respect to FIG. 24.

Reference is now made to FIG. 23B, which is an exploded view of connector 190, along with FIG. 24, which is a flow chart that illustrates steps associated with the manufacture of connector 190 according to one embodiment of the invention and FIGS. 25A-25H, which depict connector 190 at the various stages of manufacture set forth in FIG. 24. The manufacture of connector 190 can start with the formation of a contact frame 194 that carries four contact strips 196*a*-196*d*, one for each of contacts 112*a*-112*d*. Contact frame 194 can be made from a dielectric material and in one particular embodiment is formed from a liquid crystal polymer using an injection molding process. Contact strips 196*a*-196*d* can be stamped from a sheet of metal such as phosphor bronze and threaded into grooves 198*a*-198*d* formed in contact frame 194 as shown in FIG. 25A (FIG. 24, step 210).

Figure 25B:
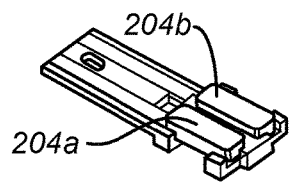
Figure 25C:
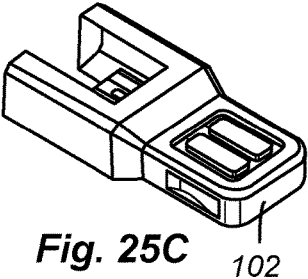
Figure 25D:
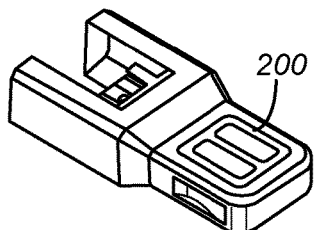

Contact pucks 204*a* and 204*b* can be attached to one end of contact strips 196*a* and 196*b*, respectively, while contact pucks 204*c* and 204*d* can be attached to the corresponding ends of contact strips 196*c* and 196*d* (FIG. 24, step 212 and FIG. 25B). Pucks 204*a*-204*b* can be made from a variety of conductive materials and formed in a variety of different manners. In one particular embodiment, pucks 204*a*-204*d* are stamped from a sheet of nickel-plated brass and laser welded to their respective contact strips. Next, contact frame 194 can be inserted into ground ring 102 (FIG. 24, step 214 and FIG. 25C) and a thermoplastic or similar dielectric overmold 200 can formed around the contacts to provide smooth and substantially flat upper and lower surfaces of the tab portion of the connector and provide a finished look (FIG. 24, step 216 and FIG. 25D). In one embodiment, dielectric overmold 200 is formed from polyoxymethylene (POM) in an injection molding process.

Figure 25E:
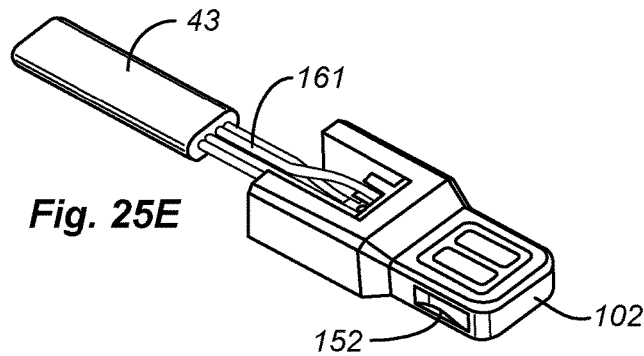
Figure 25F:
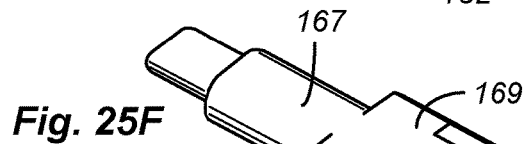
Figure 25G:
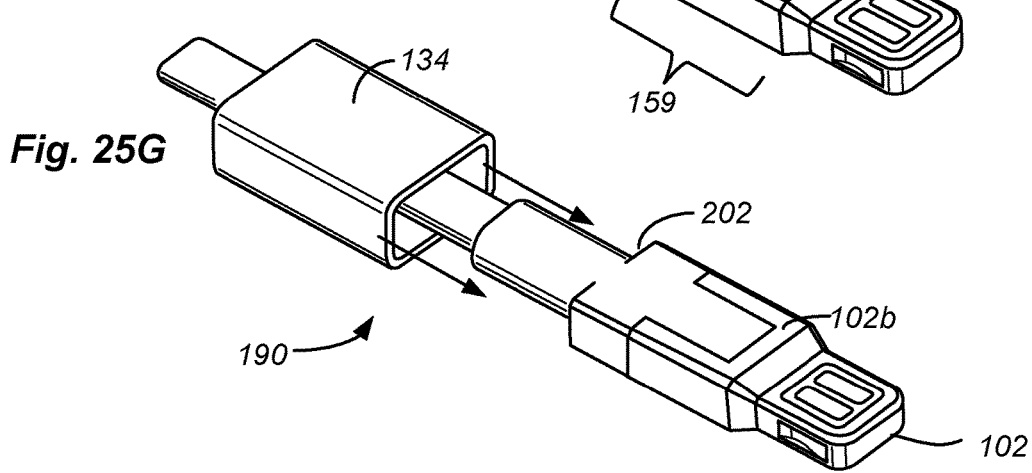

Next, a cable bundle 43 having four individual insulated signal wires 161, one for each of the contacts of connector 190, is attached to the ground ring/contact frame assembly as shown in FIG. 25E by soldering each of the wires 161 to its respective contact strip (FIG. 24, step 218). An inner dielectric jacket 202 is then formed around much of the assembly using an injection molding or similar process (FIG. 24, step 220 and FIG. 25F). Inner jacket 202 includes a generally rounded or oval end portion 167 that covers several centimeters or more of cable bundle 161 and a connector portion 169 that, combined with ground ring 102, forms a substantially monolithic base portion 159 of connector 190. Inner jacket 202 helps provides strain relief for connector 190 and can be made from a dielectric material such as an elastomer or a polyproplylene material. The construction of connector 190 can then be completed by sliding an outer shell 134 around an end base portion 102*b* of ground ring 102 and inner jacket 202 (FIG. 24, step 222 and FIG. 25G). Outer shell 134 can be adhered to the ground ring and inner jacket using any appropriate adhesive suitable for the particular materials being bonded.

Figure 26A:
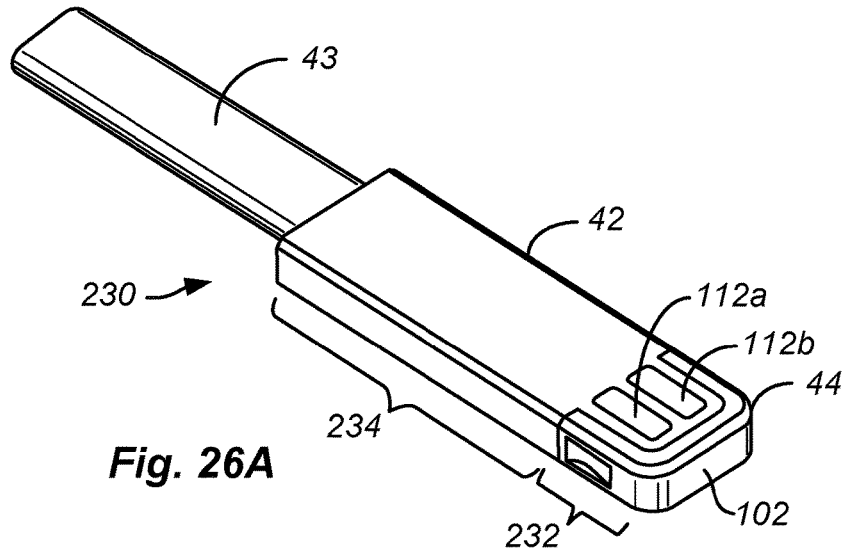
FIG. 26A is a simplified perspective view of a flexible plug connector 230 according to another embodiment of the invention.
Figure 26B:
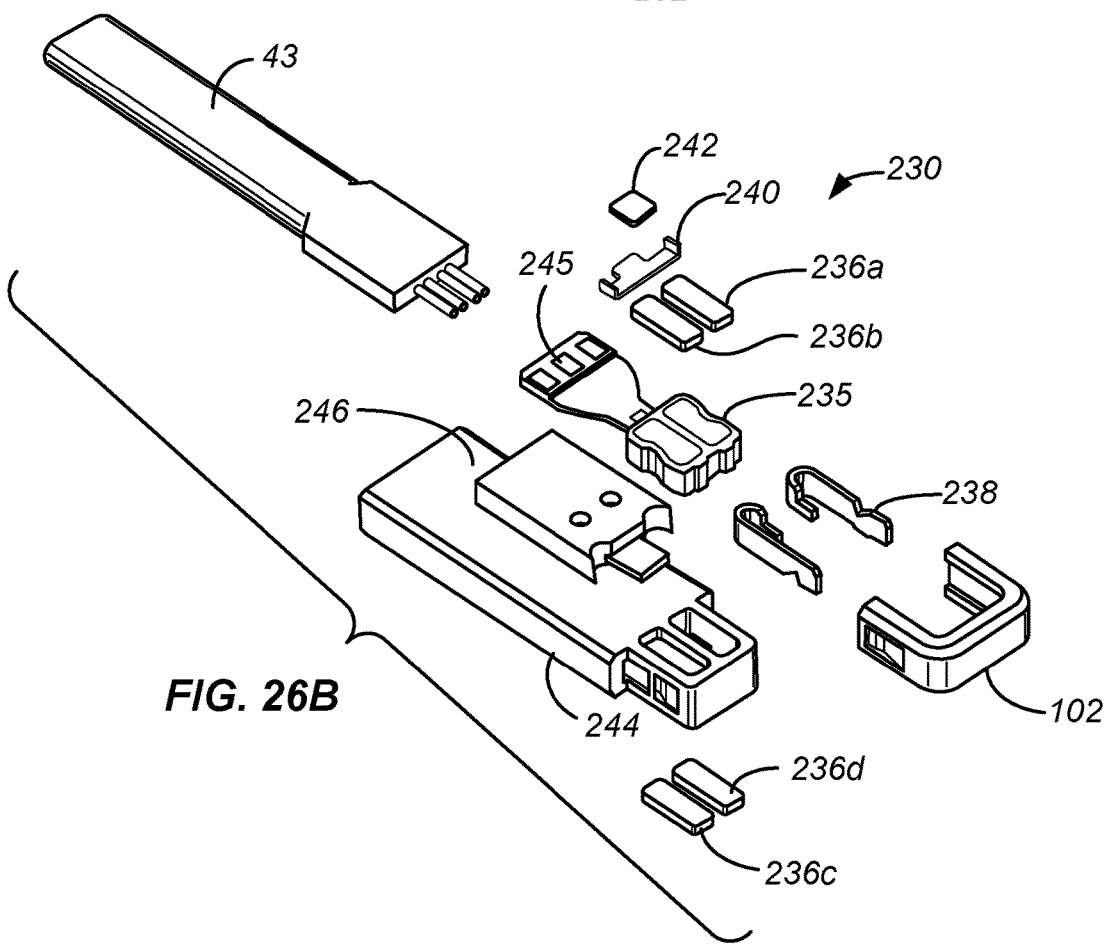
FIG. 26B is an exploded view of plug connector 230.

FIG. 26A is a simplified perspective view of a four contact plug 230 according to still another embodiment of the invention and FIG. 26B is an exploded view of connector plug 230. Connector 150 includes many features similar to connectors 150 and 190 discussed above with respect to FIGS. 20A and 23A, respectively. Connector 123 differs from these connectors in that the body of connector 230 and tab portion 44 of the connector that is designed to be inserted within a corresponding receptacle connector are combined as a single monolithic (though relatively small) piece with a uniform cross-sectional shape. Additionally, a portion of connector 230 is relatively flexible. Specifically, connector 230 includes a rigid connector or tip portion 232 and a flexible base portion 234. In this particular embodiment, rigid portion 232 is approximately one third the length of the connector while flexible portion 234 is approximately two thirds the length. In other embodiments, however, the ratio between the flexible and rigid tip portion may differ considerably.

The tip 232 of connector 230 includes a ground ring 102 that surrounds contacts 112*a*-112*d* at the tip and sides of the connector. Ground ring 102 can be made from any appropriate metal or other conductive material and in one embodiment is stainless steel plated with copper and nickel. When fully inserted, the entirety of rigid portion 232 is within the receptacle connector along with a portion 132 of the flexible portion 234 of connector 230.

The flexible base portion 234 of connector 230 can be made from a flexible dielectric material such as an elastomer or a polyproplylene material which enables the connector to flex along the length of the connector to at least a point where the ground ring begins in order to relieve strain during off angle mating events in a manner similar to that described with respect to FIGS. 11A and 11B. In one specific example, base portion 234 is made from Arnitel EL250 available from DSM Engineering. Connector 230 also includes indentations or pockets 152a, 152b on each side of the connector in ground ring 102 as described above.

Figure 27A:
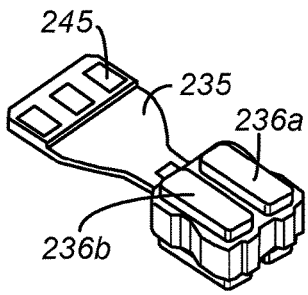
FIGS. 27A-27G are simplified perspective views of connector 230 shown in FIGS. 26A and 24B at different stages of manufacture.
Figure 27B:
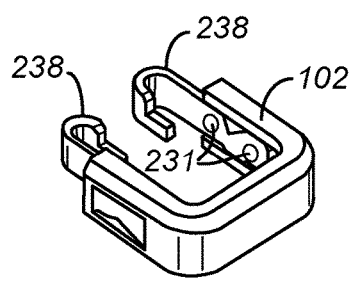

Reference is now made to FIGS. 27A-27G, which depict connector 230 at various stages of manufacture. Contacts 112a-112d are formed from a flex circuit 235 upon which contact pucks 236a-236d are attached. Pucks 236a-236d can be made from a variety of conductive materials and in one embodiment are brass. Pucks 236a-236d can be cut to size in a stamping or similar process from a metal sheet and can be attached to flex circuit 235 using surface mount technology (SMT) as shown in FIG. 27A. In a separate step, ground ring 102 can be secured to the body of connector 230 by retention clips 238 which can be made out of the same stainless steel or other metal as the ground ring and laser welded at locations 239 or otherwise connected to ground ring 102 as shown in FIG. 27B. Retention clips 238 have an anchor at one end that extends beyond the ground ring towards a base of the connector to secure the ground ring to the connector body as described more fully below.

Figure 27C:
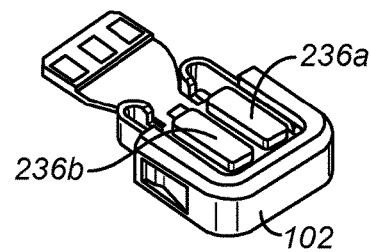
Figure 27D:
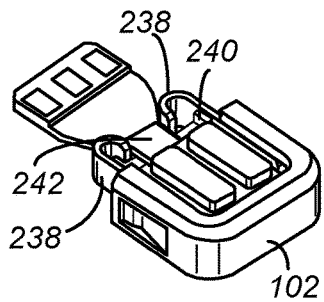
Figure 27E:
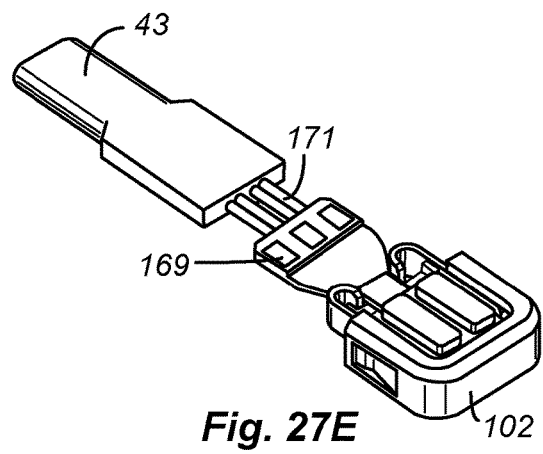
Figure 27F:
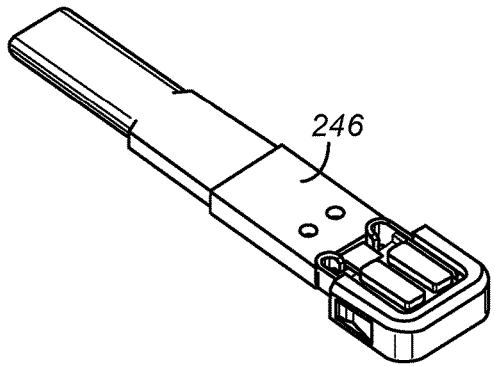

Once the ground ring/retention clip and flex circuit/contact puck assemblies are made, the flex circuit assembly can be inserted into and adhered to the ground ring with an appropriate adhesive as shown in FIG. 27C. Next, a metal ground bridge 240 and weld puck 242, each of which, for example, can be brass, are soldered together and attached to the flex circuit between opposing ends of retention clips 238 as shown in FIG. 17D. A cable 43 with signal wires 171 is then soldered to contacts 245, which are electrically connected to and carry signals from respective contacts 152a-152d (FIG. 27E). As shown in FIG. 27E, cable 43 has a generally flat portion that is spaced apart from flex circuit 235 in an oppositional relationship. An inner dielectric jacket 246 is formed around much of the assembly using an injection molding or similar process as shown in FIG. 27F. Inner jacket 246 extends from the substantially flat end of cable 43 to retention clips 238 and provides structural strength to connector 230 covering signal wires 171 and a portion of flex circuit 235. Inner jacket 246 can be made from a flexible dielectric material such as an elastomer or a polyproplylene material just like outer jacket 244, and in one particular embodiment, is made from the same material as the outer jacket.

Figure 27G:
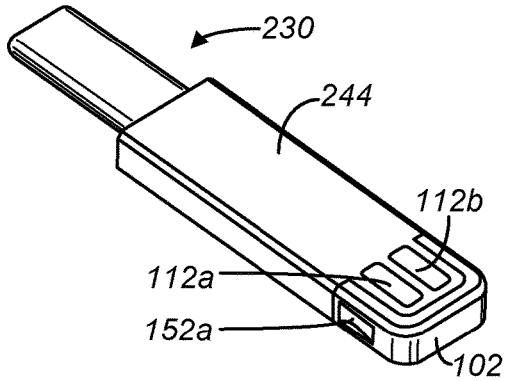

The construction of connector 230 can then be completed by forming outer jacket 244 around an end portion of cable 170, inner jacket 246 and the other connector components using an injection molding or similar process forming the substantially rectangular connector plug 230. As shown in FIG. 27G, outer jacket 244 fills in the gaps between the contact pucks and covers anchors 230 filling the semicircular space between each anchor end thereby fully securing ground ring 102 and components connected to the ground ring to the connector body.

Figure 28A:
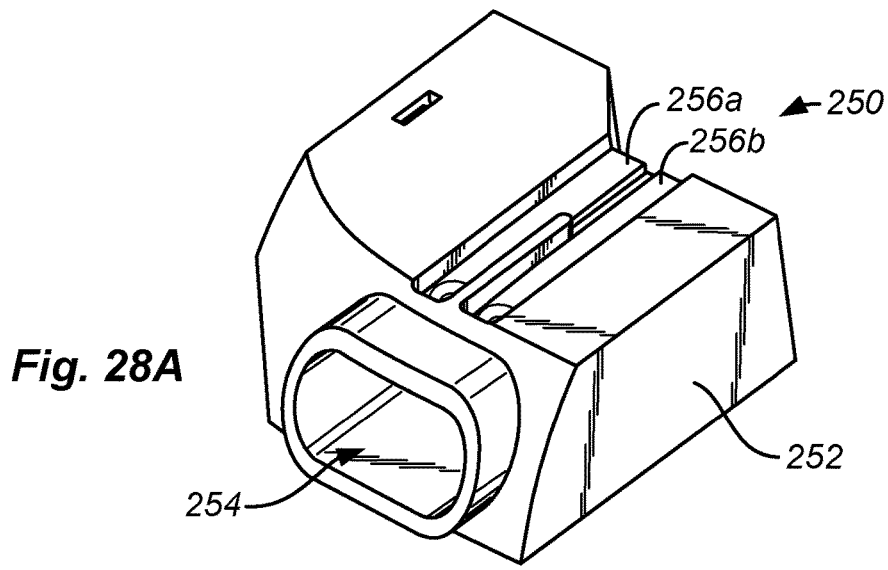
FIG. 28A is a simplified perspective view of a receptacle connector jack 250 according to one embodiment of the invention.

Reference is now made to FIG. 28A, which is a simplified perspective view of one embodiment of a receptacle connector 250 that can be used in conjunction with certain plug connectors according to the present invention. Connector jack 250 includes a housing 252 that defines an interior cavity 254 into which a plug connector, such as connector 40, can be inserted. One or more contacts extend into cavity 254 from each of the upper and lower interior surfaces of the cavity, the number of which depends on the type of plug connector receptacle connector 250 is intended to be used with. For example, receptacle connector 250 can be designed to mate with a four contact plug connector such as connector 110 shown in FIGS. 14A-14D and thus includes four contacts within cavity 254—two on each of the major opposing interior surfaces of cavity 254 and can be designed to mate with a four contact plug connector such as connector 110 shown in FIGS. 14A-14D. In other embodiments, connector jack 250 may include any number of contacts, from pairs of one to twenty or more arranged on opposing surfaces of cavity 254 in a variety of different patterns that match the contact locations of a particular plug connector. As examples, receptacle connector 250 may include contacts at both the upper and lower interior surfaces of cavity 254 that are positioned to electrically couple with contacts arranged on a plug connector according to any of the contact patterns shown in FIGS. 5A-5H as well as other contact patterns.

Figure 28B:
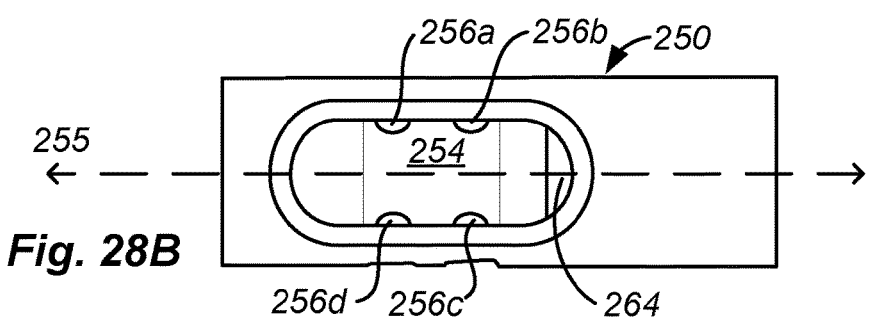
FIGS. 28B and 28C are front and bottom plan views of connector jack 250 shown in FIG. 28A.

As seen in FIG. 28B, which is a front view of connector jack 250, in one particular embodiment receptacle connector 250 includes four contacts 256a-256d positioned to electrically couple to appropriate contacts in the corresponding plug connector, for example to contacts 112a-112d in connector 110. Thus, contacts 256a-256d are arranged in a symmetric manner complementary of contacts 112a-112d of the plug connector. Additionally, cavity 254 is shaped so that the plug connector can be inserted into the cavity in either of two orientations: a first orientation in which plug connector contacts from region 46a (contacts 112a, 112b) electrically couple to the receptacle connector contacts protruding from an interior upper surface of the cavity and a second orientation in which plug connector contacts from region 46b (contacts 112c, 112d) electrically couple to the receptacle connector contacts protruding from the interior upper surface. Circuitry within receptacle connector jack 250 detects the orientation of the plug connector and sets software switches to properly match the contacts to the plug connector's contacts. For example, a first software switch can be used to switch the connector jack's contacts for left and right audio depending on the insertion orientation while a second software switch can be used to switch the connector jacks microphone and ground contacts to match the contacts of connector 110.

To facilitate the dual orientation insertion, upper and lower portions of cavity 254 (as defined by a plane 255 that horizontally bisects the cavity as shown in FIG. 28B) can be mirror images of each other. Left and right portions of cavity 254 (as defined by a similar plane that vertically bisects the cavity) can also be mirror images of each other. Additionally, receptacle connector 250 does not include polarization keys that limit a mating event between the plug and receptacle connectors to a single orientation.

Figure 28C:
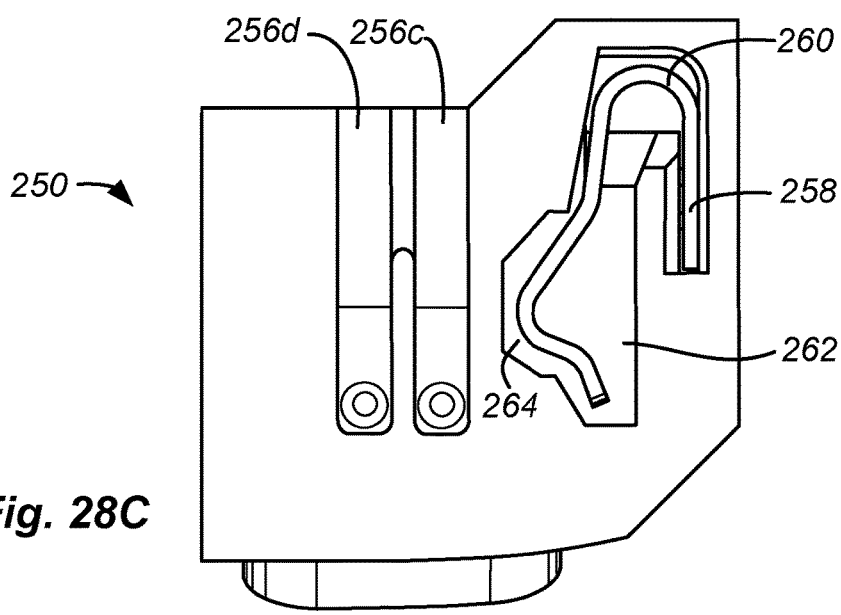

In some embodiments receptacle connector 250 is designed to be waterproof so as to not allow ingress of moisture into whatever electronic device the connector is housed within. Also, a hole (not visible in the drawing) within the interior of cavity 254 allows a spring-loaded retention mechanism 258 to protrude into the cavity. As shown in FIG. 28C, which is a bottom plan view of receptacle connector 250, retention mechanism 258 includes a spring 260 positioned in a cut-out section 262 of the housing. Spring 260 is pre-loaded so that a tip 264 extends through an opening between cut-out 262 and cavity 254. When plug connector 110 is inserted into cavity 254, spring 260 latches with either retention feature 104a or 104b of the connector plug depending on its insertion orientation. In some embodiments, spring 260 can be made from metal and also act as a ground contact for receptacle connector 250.

As previously discussed, retention features 104a, 104b can be located near the distal end of connector 110. The inventors have determined that positioning the retention features near the end of the plug connector (and thus positioning the and corresponding retention mechanism near the rear of cavity 254) helps to better secure the plug connector sideways when it is in an engaged position within receptacle connector 250. Furthermore, the shape of the retention features on the plug connector can match the shape of retention mechanism 258 to provide a comfortable click feel when the retention mechanism engages the retention feature. For example, the rounded bulbous shape of retention features 104a, 104b of connector 110 can match the rounded shape of the tip 264 of spring 260 to provide a secure engagement between the structures. FIG. 29 shows plug connector 110 inserted into connector jack 250 where one of retention features 104a, 104b is engaged with spring 260.

In FIGS. 28A-28C, the overhead of contacts 256a-256d of receptacle connector 250 is placed at the ends of the contacts as illustrated schematically in FIG. 30A, which shows contacts 256a, 256b of receptacle connector 250 and their associated contact overhead 268 in relation to a plug connector 110 having contacts 112a, 112b operatively coupled to the receptacle jack. In other embodiments, the overhead of the contacts can be placed at the sides of the receptacle connector contacts as shown in FIG. 30B or above and below the contacts as shown in FIG. 30C, which is a simplified side view of plug connector 110 mated with contacts in a receptacle connector (where, for ease of illustration, only the contacts of the receptacle connector are shown in a schematic representation).

Figure 31A:
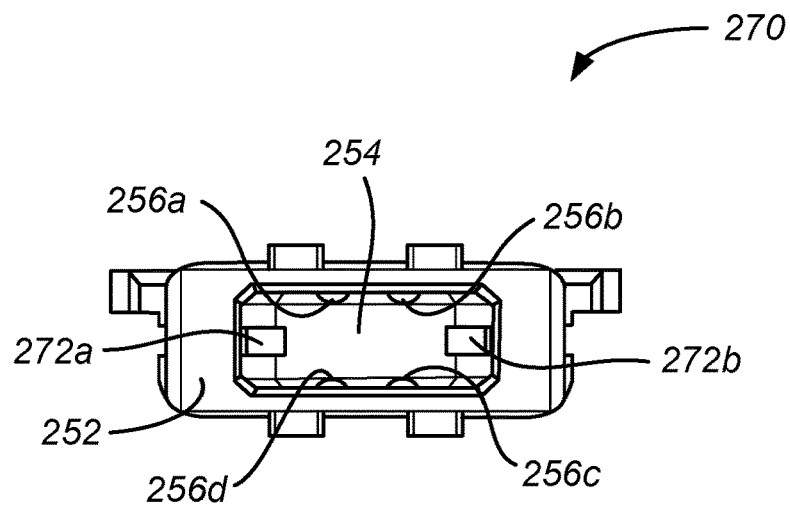
FIGS. 31A and 31B are front and bottom plan views of a receptacle connector jack 200 according to one embodiment of the invention.

FIG. 31A is a front view of receptacle connector 270 according to another embodiment of the invention. Receptacle connector 270 is similar to receptacle connector 250 except, among other differences, in the shape of cavity 254, which is generally more rectangular than that of connector 250, and that connector 270 includes first and second retention mechanisms 272a and 272b protruding into cavity 254 from opposing side surfaces of the cavity instead of a single retention mechanism. Each of retention mechanisms 272a, 272b may include, for example, a spring that is pre-loaded so that a tip of the retention mechanism extends through an opening in each sidewall of the cavity 254. When a plug connector is inserted into cavity 254, the retention mechanisms 272a, 272b latch with retention features, such as notches 104a, 104b or pockets 152a, 152b of one of the plug connectors discussed above. Retention mechanisms 272a, 272b can be located directly opposite each other within cavity 254 and can be designed to impart a retention force on the plug connector that is approximately equal at each side. Similar to retention mechanism 258, the shape of retention mechanism 272a, 272b can match that of the plug connector retention features to provide a comfortable click feel when the retention mechanisms and features engage with each other.

Figure 31B:
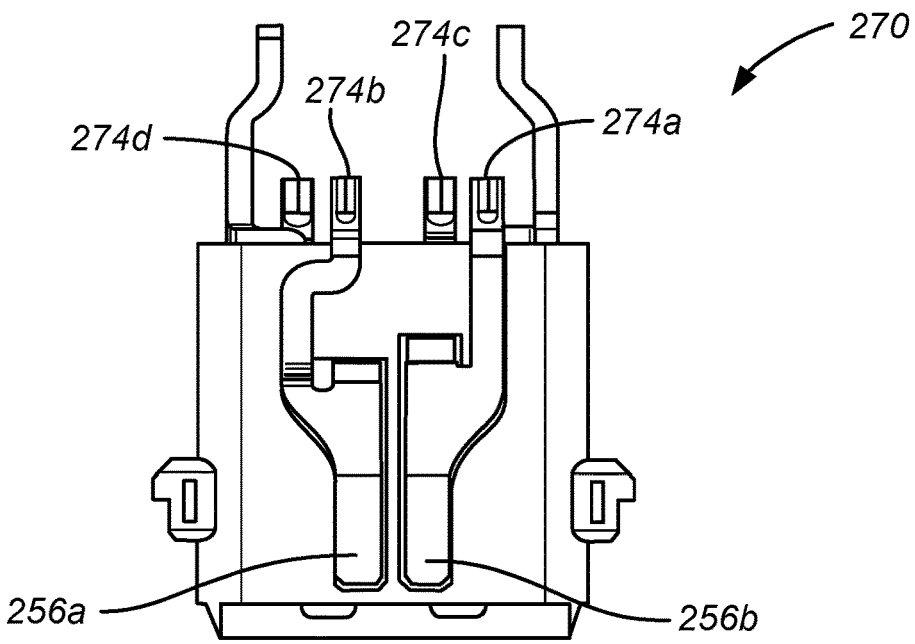

FIG. 31B is a top plan view of connector jack 270. As shown in FIG. 31B, each of the receptacle contacts 256a-256d includes a contact tip, 274a-274d, respectively, that can be bonded to a wire that electrically connects the contact to circuitry associated with the electrical device in which receptacle connector 270 is housed. For example, connector jack 270 can be part of a portable media device and electronic circuitry associated with the media device is electrically connected to receptacle connector 270 via contact tips 274a-274d.

As described above, various embodiments of the invention pertain to a connector system having 180 degree symmetry. Thus, cavity 254 can be symmetrical with respect to both vertical and horizontal bisecting planes as discussed above. Additionally, contacts 256a and 256b can be directly opposite contacts 256c and 256d so that a plug connector, such as connector 230, can be inserted into jack 270 in either of two orientations. In a first orientation, plug connector contacts 112a, 112b are respectively coupled to receptacle contacts 256a, 256b and contacts 112c, 112d are respectively coupled to receptacle contacts 256c, 256d. In a second orientation opposite the first orientation, plug contacts 112a, 112b are coupled to receptacle contacts 256d, 256c, while plug contacts 112c, 112d are coupled to receptacle contacts 256b, 256a.

Figure 33A:
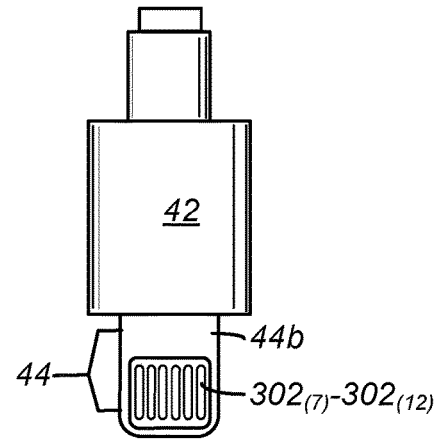
FIGS. 33A-33C are simplified plan views of plug connector 300 shown in FIG. 32.
Figure 33B:
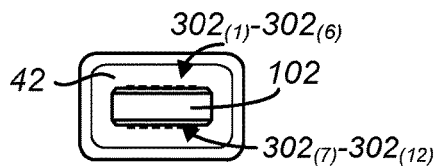
Figure 33C:
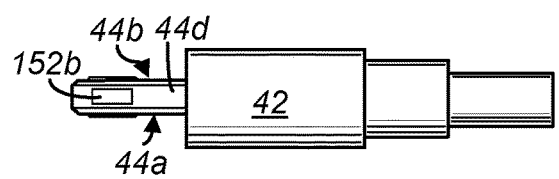

While many of the embodiments of the invention set forth above have been depicted in the included figures as four contact connectors, embodiments of the invention are not limited to any particular number of contacts. To further underscore this, reference is now made to FIGS. 33A-33D, which depict various views of a twelve contact plug connector 300 according to one embodiment of the present invention. Specifically, FIG. 33A is a simplified perspective view of plug connector 300 while FIGS. 33B-33D are simplified bottom, front and side plan views, respectively. Connector 300 includes many of the same features as connector 150 except it has six contacts $302_{(1)}$ and $302_{(6)}$ positioned within contact region 46a and an additional six contacts $302_{(7)}$ and $302_{(12)}$ positioned within region 46b on the opposing surface of tab 44. The contacts can be made from a copper, nickel, brass, a metal alloy or any other appropriate conductive material. Spacing is consistent between each of the contacts on the front and back sides and between the contacts and the edges of the connector providing 180 degree symmetry so that plug connector 300 can be inserted into a corresponding receptacle connector in either of two orientations as discussed above.

A significant portion of tab 44 is including its shape is defined by ground ring 102 that extends from a distal tip of the connector towards the outer shell and partially surrounds contacts $302_{(1)}$-$302_{(12)}$ along an outer periphery of tab 44. Ground ring 102 can be made from any appropriate metal or other conductive material and in one embodiment is stainless steel plated with copper and nickel. Two indentations or pockets 152a and 152b are formed in ground ring 102 and located on opposing sides 56c and 56d of the tab near its distal end as with connector 150. In one particular embodiment, tab 44 of connector 300 has a width, X, of 4.0 mm; a thickness, Y, of 1.5 mm; and a insertion depth, Z, of 5.0 mm. It is understood that the dimensions of connector 50 as well as the number of contacts may vary in different embodiments.

When connector 300 is properly engaged with a receptacle connector each of contacts $302_{(1)}$-$302_{(12)}$ is in electrical contact with a corresponding contact in the corresponding receptacle connector. Tab 52 has a 180 degree symmetrical, double orientation design which enables the connector to be inserted into a connector jack in both a first orientation where surface 44a is facing up or a second orientation where surface 44b is facing up. In the first orientation, plug connector contacts $302_{(1)}$-$302_{(6)}$ couple to receptacle contacts $366_{(1)}$-$366_{(6)}$, respectively, and contacts $302_{(7)}$-$302_{(12)}$ couple to receptacle contacts $366_{(7)}$-$366_{(12)}$, respectively. In the second orientation opposite the first orientation, plug contacts $302_{(1)}$-$302_{(6)}$ couple to receptacle contacts $366_{(7)}$-$366_{(12)}$ and plug contacts $302_{(7)}$-$302_{(12)}$ couple to receptacle contacts $366_{(1)}$-$366_{(6)}$.

To facilitate the orientation agnostic feature of connector 300, contacts $302_{(1)}$-$302_{(12)}$ are arranged such that similarly purposed contacts are located on opposite sides of the connector in a cater cornered arrangement. As an example, reference is made to FIG. 34A, which is a diagram depicting pin locations of connector 300 according to one specific embodiment of the invention having two contacts designated for power, two contacts designated for analog audio signals and eight contacts designated for differential data signals including two USB data contacts, and six display port contacts.

Figure 34A:
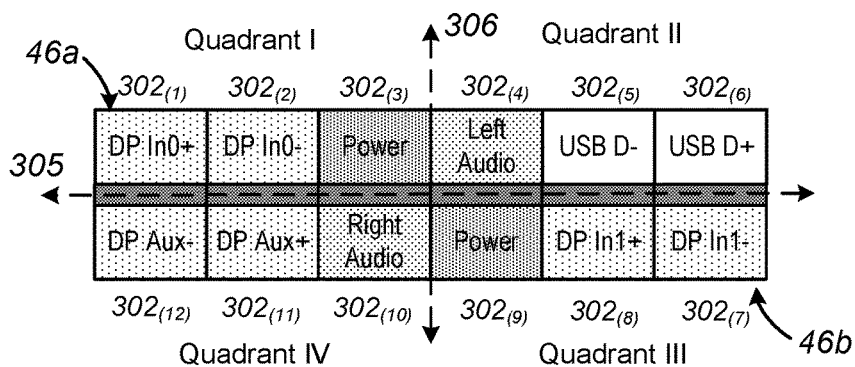
FIGS. 34A and 34B are diagrams depicting pin locations of connector 300 in two different orientations according to an embodiment of the invention.

As shown in FIG. 34A, when a midpoint line 305 dividing connector tab 44 into equal top and bottom halves and a midpoint line 306 dividing the connector tab 44 into equal left and right halves are considered, the contacts associated with connector 50 can be divided into four quadrants labeled clockwise from the top left portion of the connector as quadrants I, II, III and IV, respectively. Quadrants I and III are located in a cater cornered arrangement as are quadrants II and IV. Individual contacts within the cater cornered quadrants can be arranged, based on their function, in a mirrored relationship. For example, the two contacts in quadrants I and III closest to midpoint line 61, contacts $302_{(3)}$ and $302_{(9)}$, are each dedicated for power. Similarly the two outermost contacts in these quadrants are dedicated for a pair of differential data signals. In quadrants, II and IV, the innermost contact, contacts $302_{(4)}$ and $302_{(10)}$ are each dedicated for analog audio signals while the two outermost contacts in each quadrant dedicated for a pair of differential data signals.

As evident from a comparison of FIGS. 34A and 34B, which depict the pinout of connector 300 in two different orientations (in FIG. 34A surface 44a is facing up while in FIG. 34B surface 44b is facing up), regardless of which of the two possible orientations that connector 300 is inserted into its receptacle connector, the contact order on the top side of the connector, from left to right, is always as follows: the first two contacts are designated for a pair of differential data signals, the third contact is designated for a power contact, the fourth contact is designated for an audio contact and the fifth and sixth contacts are designated for another pair of differential data signals. Similarly, the contact order on the bottom side of the connector, from left to right, is always as follows: the first two contacts are designated for a pair of differential data signals, the third contact is designated for an audio contact, the fourth contact is designated for a power contact and the fifth and sixth contacts are designated for another pair of differential data signals.

Figure 37:
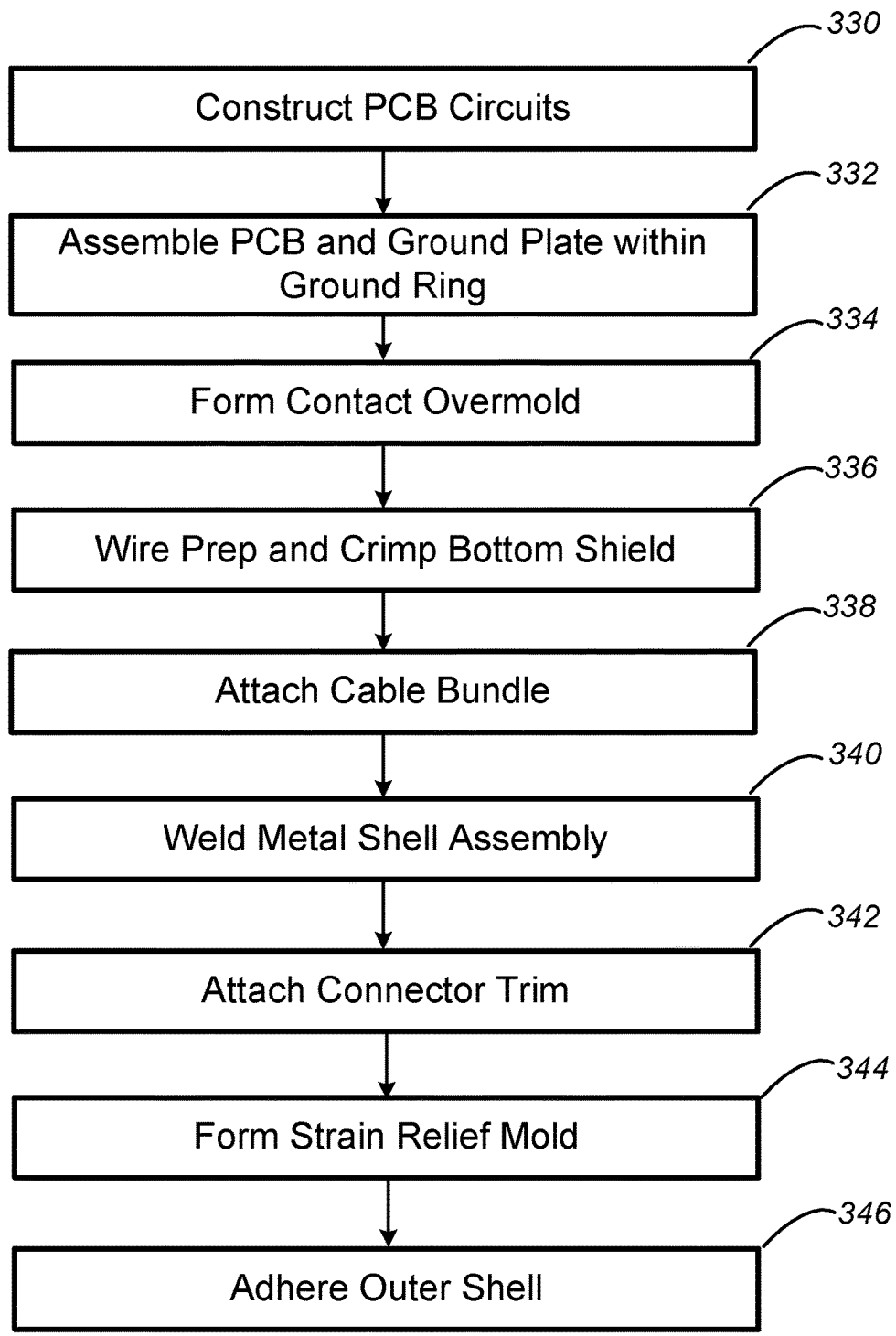
FIG. 37 is a flowchart depicting steps associated with manufacturing connector 310 according to one embodiment of the invention.

Reference is now made to FIGS. 35-38. FIG. 35 is an exploded view of connector 310 for a synchronization and charging cable that has the same form factor as connector 300 (and thus will operatively engage with the same set of receptacle connectors as plug connector 300) including the same number of contacts. As a sync and charge cable, however, the contact locations dedicated for audio contacts and display port contacts are not needed and thus are not made operational in this particular embodiment. FIG. 37 is a flow chart that illustrates steps associated with the manufacture of connector 310 according to one embodiment of the invention and FIG. 38A-38P depicts connector 310 at the various stages of manufacture set forth in FIG. 37.

The manufacture of connector 310 can start with the construction of printed circuit boards 312a and 312b (FIG. 37, step 330) each of which includes six contact areas that, together, correspond to contacts $302_{(1)}$-$302_{(12)}$. FIGS. 36A and 36B more clearly show a top plan view and side plan view, respectively, of PCB 312a. Contact pucks are attached to the contact areas of PCB 312a to form contacts $302_{(1)}$-$302_{(6)}$. The contact pucks can be made from a variety of conductive materials and in one embodiment are nickel-plated brass. The pucks can be cut to size in a stamping or similar process from a metal sheet and can be attached to PCB 312a using surface mount technology. As shown in FIG. 36A, PCB 312a includes wire solder pads 315 that are electrically coupled to corresponding contact areas. As noted above because connector 310 is a sync and charge cable, connector 310 does not include electrical connections for audio contacts $302_{(4)}$ and $302_{(10)}$, nor does it include electrical connections for display port contacts $302_{(1)}$-$302_{(2)}$, $302_{(7)}$-$302_{(8)}$ and $302_{(11)}$-$302_{(12)}$. Instead, contacts formed in those locations are not coupled to solder pads on the PCBs and are thus not functional. This is evidenced in FIG. 36A which shows USB contacts $302_{(5)}$-$302_{(6)}$ and power contact $302_{(3)}$ coupled to corresponding solder pads via electrical traces while contacts $302_{(1)}$, $302_{(2)}$ and $302_{(4)}$ are not connected to electrical traces and are not connected to any of solder pads 315. In other embodiments, all of contacts $302_{(1)}$-$302_{(12)}$ may be operatively coupled to solder pads on the PCBs or different subsets of contacts may be coupled depending on the purpose of the connector.

Figure 38C:
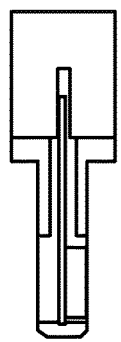
FIG. 38A-38P depicts various views of plug connector 310 at different stages of manufacture discussed with respect to FIG. 37.
Figure 38F:
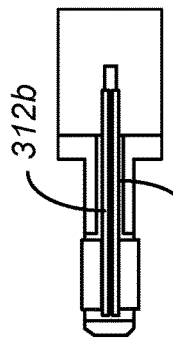
Figure 38I:
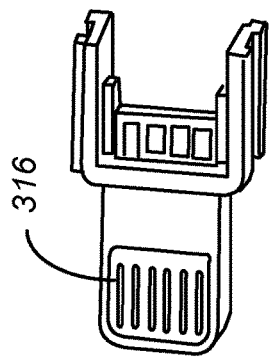
Figure 38B:
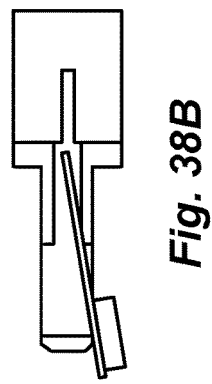
Figure 38E:
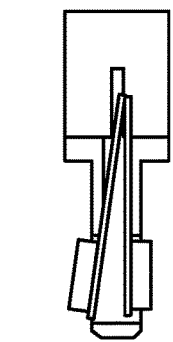
Figure 38H:
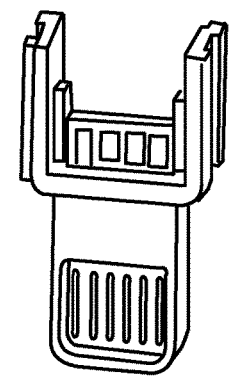
Figure 38A:
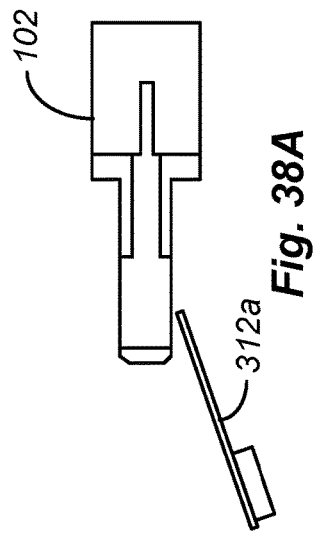
Figure 38D:
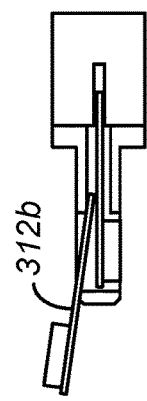
Figure 38G:
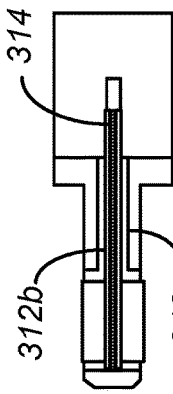
Figure 39A:
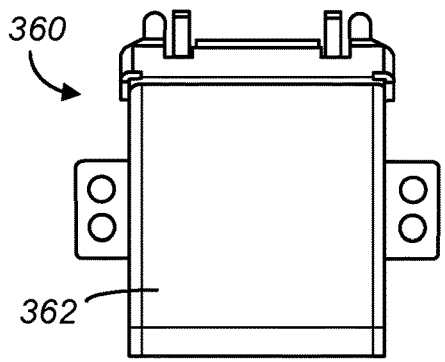
FIGS. 39A-39D depict various simplified views of a receptacle connector jack 360 according to one embodiment of the invention.
Figure 39B:
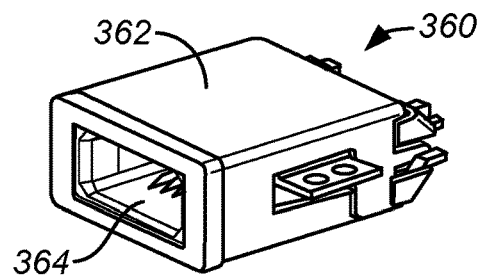
Figure 39C:
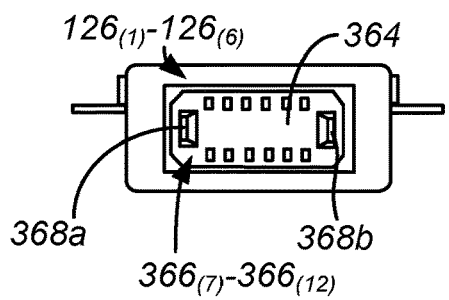
Figure 39D:
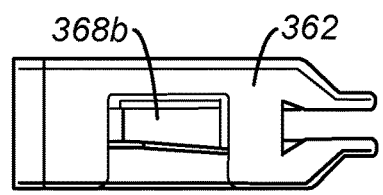
Figure 40A:
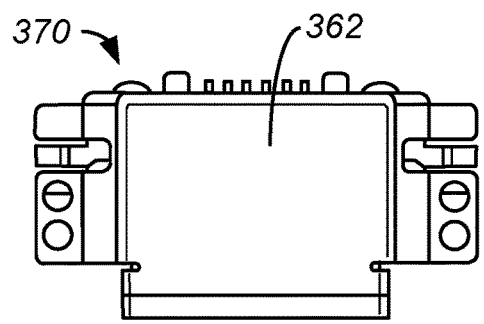
FIGS. 40A-40D depict various simplified views of a receptacle connector jack 370 according to another embodiment of the invention.
Figure 40B:
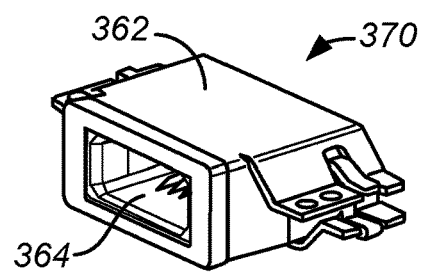
Figure 40C:
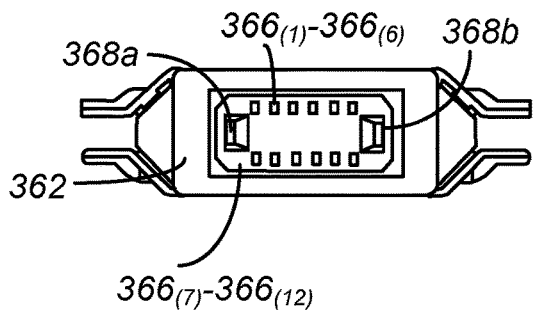
Figure 40D:
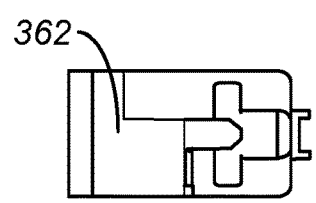

After each of the PCBs 312a, 312b are constructed and the contacts attached, the PCBs are inserted through the front side of ground ring 102 via the top and bottom openings of the ground ring that surround the contacts as shown in FIG. 38A-38F. Next, ground plate 314 is sandwiched between the two PCBs 312a, 312b by inserting the ground plate from the back of ground ring 102 (FIG. 38G). Ground plate 314 provides a thick layer of shielding between contacts $302_{(1)}$-$302_{(6)}$ formed on PCB 312a and contacts $302_{(7)}$-$302_{(12)}$ formed on PCB 312b.

The assembled ground ring/PCB/ground plate structure (FIG. 38H) is then placed in a molding tool and a thermoplastic or similar dielectric overmold 316 can be formed around the contacts to provide smooth and substantially flat upper and lower surfaces of the tab portion of connector 310 and provide a finished look (FIG. 37, step 334; FIG. 38I). In one embodiment, dielectric overmold 316 is formed with an injection molding process using polyoxymethylene (POM).

A cable bundle 318 having individual signal wires 320, one for each of the functional contacts of connector 310 as well as one or more ground wires to be coupled to ground ring 102 can be prepared at this time or prior to step 330 (FIG. 38J). The individual signal wires are cut and stripped, the jacket of the cable bundle is stripped and the cable shields are folded back over the jacket. Next, a cable crimp 322 having a bottom metal shield is secured to the cable bundle (FIG. 37, step 336; FIG. 38K). The cable bundle can then be attached to the ground ring/PCB assembly as shown in FIG. 38L by soldering each of the signal wires to its respective solder pad and soldering the ground wires to the ground ring (FIG. 37, step 338). The solder joints and exposed wires can then be potted with a UV glue to further secure the connections.

At this stage of manufacture the end of cable bundle 318 is spaced apart from the PCB assembly in an oppositional relationship and positioned above bottom metal shield 312 and between two opposing ends of ground ring 102. A metal top shield 314 can be attached to the top of ground ring 102 (FIG. 38M) and the top and bottom metal shields are laser welded or similarly attached to ground ring 102 to form an enclosure or box around the cable bundle (FIG. 37, step 340). Next, a dielectric trim piece 326 can be slid over the end of tab 102 and glued to the exposed front of ground ring 102 (FIG. 37, step 342; FIG. 38N). As shown in FIG. 38N, dielectric trim includes two rails 326a, 326b that slide into corresponding grooves in ground ring 102 and includes a front face 326c that is sized to have the same width and height as the base of ground ring 102. In one embodiment trim piece 326 can be made from ABS plastic or a similar dielectric material.

An inner dielectric strain relief jacket 328 is then formed around much of the assembly using an injection molding or similar process (FIG. 37, step 344; FIG. 38O). Strain relief jacket 328 can include a generally circular end portion 328a that covers a centimeter or more of cable bundle 318 and a block portion 328b that completes and fills in gaps in the metal enclosure formed by ground ring 102, bottom shied 322 and top shield 324 thereby forming a substantially monolithic base portion 90 of connector 310 that is effectively sealed. Strain relief jacket 328 provides structure and strain relief for connector 310 and can be made from a dielectric material such as an elastomer or a polyproplylene material.

The construction of connector 310 can then be completed by sliding an outer shell 134 around the monolithic base portion covering an end portion of ground ring 102, trim piece 326 and strain relief jacket 328 (FIG. 37, step 346; FIG. 38P). Outer shell 134 can be formed from ABS or a similar dielectric material and adhered to the ground ring and inner jacket using any appropriate adhesive suitable for the particular materials being bonded.

FIGS. 39A-39D show top, perspective, front and side views of a receptacle connector 360 according to one embodiment of the invention designed to have a reduced width as compared to depth. Receptacle connector 360 includes a housing 362 that defines a cavity 364 and houses twelve contacts $366_{(1)}$-$366_{(12)}$ within the cavity. In operation, a connector plug, such as plug connector 300 can be inserted into cavity 364 to electrically couple the contacts $302_{(1)}$-$302_{(12)}$ to respective contacts $366_{(1)}$-$366_{(12)}$. Positioned along the sides of the interior of cavity 364 are two spring-loaded conductive retention clips 368a, 368b that protrude into the cavity and function to both secure the plug connector within the cavity and provide a ground for the connector.

Retention mechanisms 368a, 368b may include, for example, a metal spring that is pre-loaded so that a tip of the retention mechanisms extend through an opening in each sidewall of the cavity 364. When a plug connector is inserted into cavity 364, the retention clips 368a, 368b latch with pockets 152a, 152b, respectively, of the connector plug. The shape of retention mechanism 368a, 368b matches that of pockets 152a, 152b to provide a comfortable click feel when the retention clips engage with the pockets. In one embodiment, the depth and position of the pockets is selected to provide specific insertion and extraction forces such that the retention force required to insert the plug connector into receptacle connector 360 is higher than the extraction force required to remove the plug connector from the receptacle connector. Also, in one embodiment, retention clips 368a, 368b are located near the back surface of cavity 364. The inventors have determined that positioning the retention clips near the back of the cavity, which requires pockets 152a, 152b on the plug connector to be positioned near its distal end, helps to better secure the connector sideways when it is in an engaged position within connector jack 360.

Each of the receptacle contacts $366_{(1)}$-$366_{(12)}$ electrically connects its respective plug contact to circuitry associated with the electrical device in which receptacle connector 360 is housed. For example, receptacle connector 360 can be part of a portable media device and electronic circuitry associated with the media device is electrically connected to jack 360 by soldering tips of contacts $366_{(1)}$-$366_{(12)}$ that extend outside housing 362 to a multilayer board such as a printed circuit board (PCB) within the portable media device. Additionally, each of the conductive retention clips 368a, 368b can be electrically coupled to a ground path associated with connector 360. As an example, in one embodiment, pins at a back end of retention clips 368a, 368b can be soldered to bonding pads formed on the multilayer board or PCB associated with the portable media device that are coupled to ground.

FIGS. 40A-40D show top, perspective, front and side views of a receptacle connector 370 according to another embodiment of the invention designed to have a reduced depth as compared to width. Except for the dimensions of housing 363, the components of connector 370 are similar to those of connector 360 and are thus referred to with the same reference numbers.

In one embodiment, each of receptacle connectors 360 and 370 can be formed using the process depicted in FIG. 41. For example, contacts $366_{(1)}$-$366_{(12)}$ can be formed from lead frames stamped from an appropriate metal such as nickel-coated brass (FIG. 41A). The contacts can be arranged and spaced apart in a mold and insert molded within dielectric blocks 369 made from a thermoplastic or similar material to form two separate sets of contacts (FIG. 41B). Each of the contact sets can then be attached at top and bottom interior surfaces of housing 362 (FIG. 41C) so that a front end of the contact extends into cavity 364 formed by the housing and a back end of the contact extends out of the back of the housing so that it can be soldered to a bonding pad (not shown) formed on a printed circuit board or similarly electrically connected to desired circuitry associated with the electronic device in which the receptacle connector is housed.

Retention clips 368a, 368b can similarly be formed using a metal stamping process and assembled to the sides of housing 362 (FIG. 41D). Retention clips 368a, 368b can include pins 367 that extend out past a back end of housing 362 in order to electrically ground the retention clips to the electrical device in which receptacle connector 360 is housed as discussed above. Next, the partially assembled receptacle connector can be placed in a mold and liquid silicone rubber can be injected around the housing to form a boot 380 that seals the receptacle connector (FIG. 41E). Top and bottom metal shells 382 and 384 can then be attached over silicone rubber boot 380 to the top and bottom of housing 362, respectively, and laser welded together to form an outer enclosure that provides additional shielding for the connector (FIG. 41F). Finally, a conductive EMI gasket 386 can be attached to the front of the housing to further seal the connector when receptacle connector and the plug connector are mated (FIG. 41G).

Figure 42:
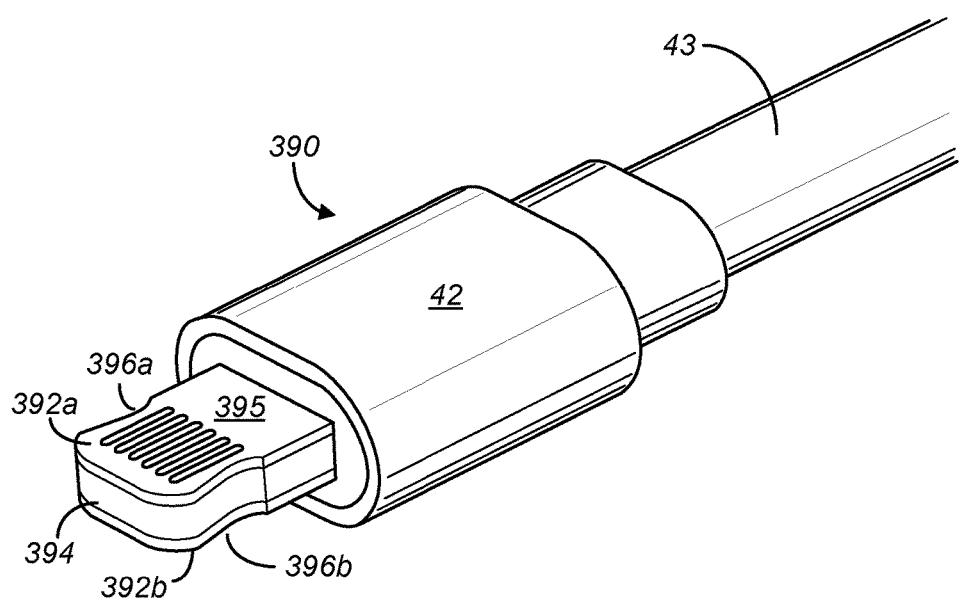
FIG. 42 is a simplified perspective view of a connector plug 390 according to another embodiment of the invention.

FIG. 42 is a simplified perspective view of a connector plug 390 according to another embodiment of the invention in which a ground ring is not employed. Instead, connector 390 is made from two printed circuit boards 392a, 392b sandwiched around a structural conductive member 264, such as a brass plate. A tab portion 395 extends out of body 42 and has the same form factor as tab 44 of connector 300 shown in FIG. 32 including the same twelve contacts (six on an upper surface of connector 390 and six on a lower surface) spaced the same distance from the edges of the connector at the same spacing enabling plug connector 390 to be operatively coupled to the same receptacle connectors such as plug connector 300.

Connector 390 does not include a ground ring similar to ground ring 102, however. Instead, indentations 396a, 396b formed on opposing sides of conductive member 394 match generally the size and contour of pockets 152a, 152b giving the tab portion of connector 390 a bread loaf shape when viewed from above or below. Indentations 266 provide the connector the same comfortable click/lock feeling achieved by connector 300 when it is inserted and removed from a receptacle connector. Also, when mated with a receptacle connector, conductive member 394 receives a ground connection via the retention clips in the receptacle connector.

Figure 43:
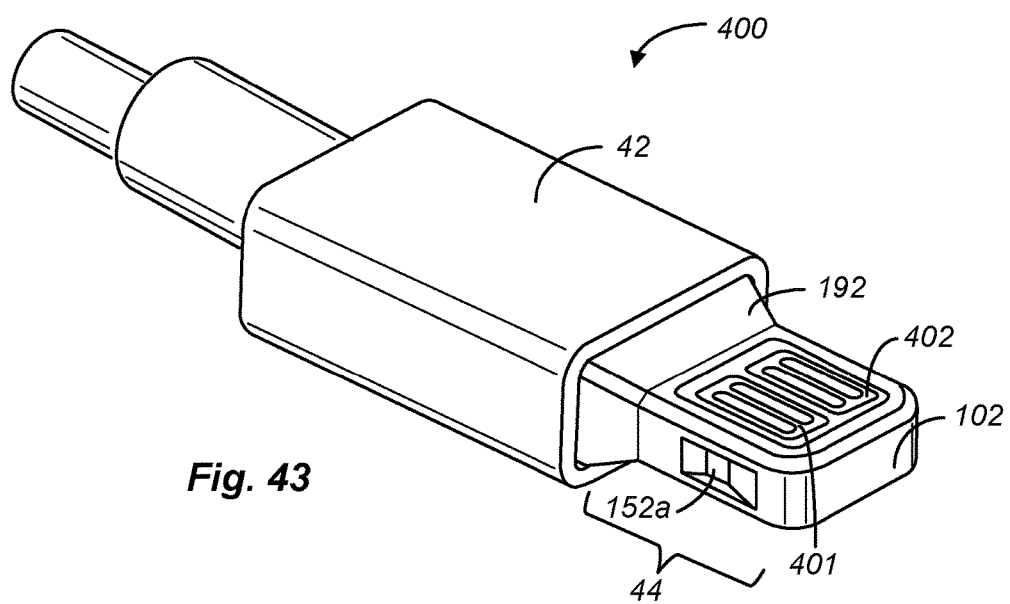
FIG. 43 is a simplified perspective view of a connector plug 400 according to another embodiment of the invention.

Another example of a data connector according to the present invention is illustrated in FIG. 43, which is a perspective view of a connector 400 according to another embodiment of the invention. Connector 400 includes eight contacts arranged as four pairs of contacts 401, 402 on a first major surface of tab 44 and 403 and 404 (not shown in FIG. 43) on the opposing major surface. In one embodiment, each of the contact pairs carry complementary or similarly purposed signals. For example, in one particular embodiment contact pair 401 includes first and second power signals, contact pair 402 includes a first set of positive and negative differential data signals, signal pair 403 includes a second set of positive and negative differential data signals, and contact pair 404 includes a third set of positive and negative differential data signals (contact pairs 403 and 404 are not shown in FIG. 43 but are directly opposite contact pairs 401 and 402). The data contacts can be used to carry any appropriate data signal as well as audio signals, video signals and the like. From an exterior view, other than the number of contacts, connector 400 is similar to connector 300 and includes a ground ring 102, an outer sleeve 216 and pockets 217 that are similar to the components of the same name in connector 300. Additionally, ground ring 102 includes a chamfered edge 192 to increase the strength of the connector.

Figure 44A:
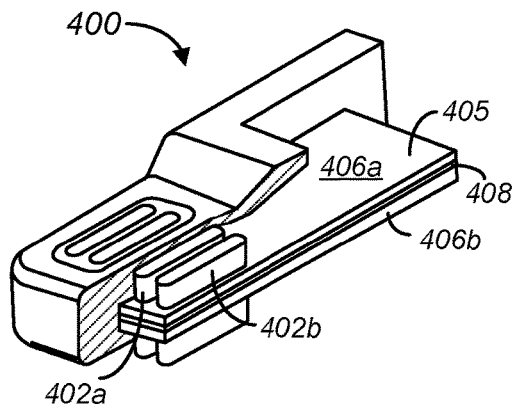
FIG. 44A is a simplified partial cut-away perspective view of plug connector 400 and FIG. 44B is a simplified cross-sectional view of plug connector 400.

FIG. 44A is a simplified perspective cut-away view of connector 400 in which individual contacts 402a and 402b from contact pair 402 are fully visible without surrounding molding or the ground ring. Each of the contacts is attached to a printed circuit board 405 having a ground plane 408 sandwiched between top and bottom dielectric layers 406a and 406b. Contacts 401a, 401b and 402a, 402b are attached to conductive pads (not shown) formed on dielectric layer 406a while contact 403a, 403b and 404a, 404b are attached to conductive pads formed on dielectric layer 406b. Ground plane 408 is thus positioned between the sets of contacts pairs (401 and 404) and (402 and 403) which reduces signal interference that may otherwise occur between the closely spaced contact pairs.

Figure 44B:
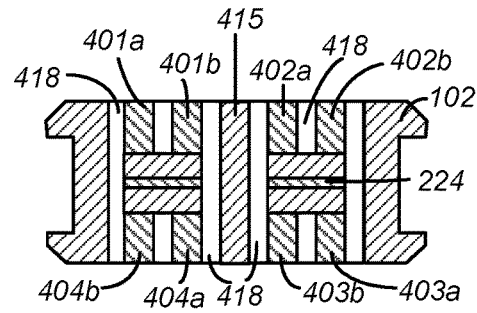

FIG. 44B is a simplified cross-sectional view of connector 400 through the middle of the contact pairs. As shown in FIG. 44B, contact pairs 401-404 are divided into four quadrants by ground plane 404 and a central rib 415a, which is part of ground ring 102. Rib 415a runs longitudinally through the tab portion of connector 400 dividing the tab into left and right halves with contact pairs 401 and 404 on one half and contact pairs 402 and 403 on the opposite half. FIG. 44B also shows that dielectric overmolding 418 (e.g., a thermoplastic material such as POM) fills in gaps between the individual contacts of each contact pair (e.g., between contacts 401a and 401b) as well as between the contact pairs and ground ring 102 and rib 415a.

Figure 45:
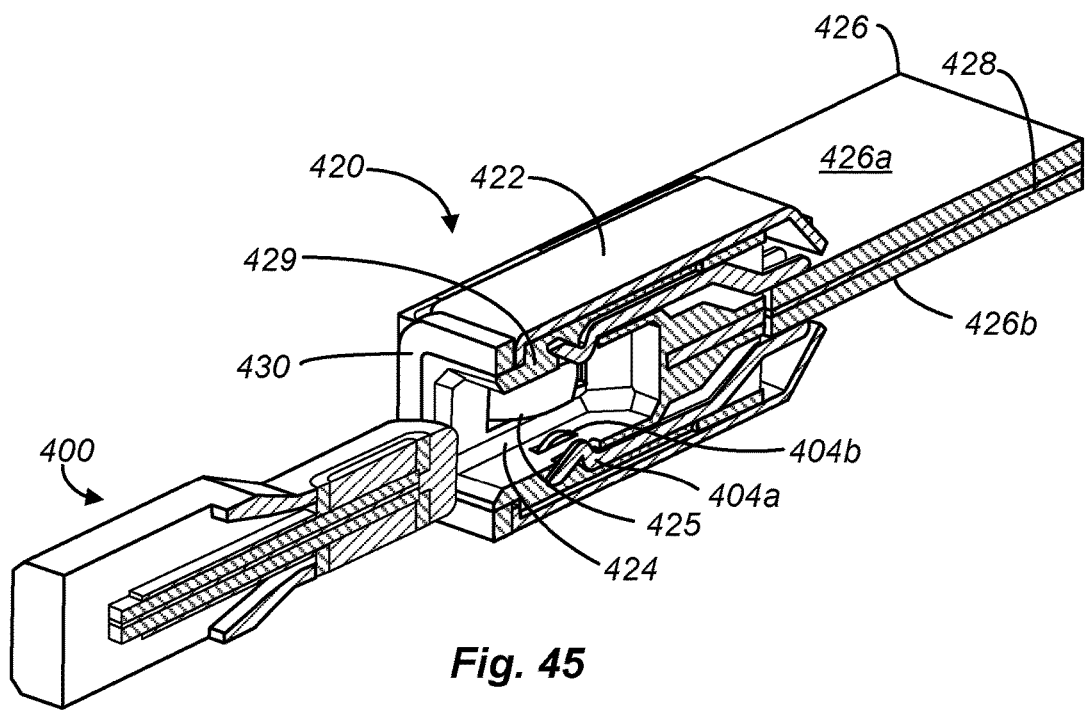
FIG. 45 is a simplified partial cut-away perspective view of plug connector 400 inserted into a receptacle connector jack 420.

Reference is now made to FIG. 45, which is a simplified partial cut-away perspective view of a plug connector 400 and a receptacle connector jack 420 according to an embodiment of the invention where plug connector 400 is positioned next to connector jack 420 prior to a mating event. Connector jack 420 includes an outer shell 422 that defines an interior cavity 424 into which the tab portion of plug connector 400 can be inserted. The receptacle connector includes four contact pairs 426-429 that extend into cavity 424 and detents 425 which extend from the opposing sidewalls of jack 420 into cavity 424. When plug connector 400 is inserted into cavity 424, detents 425 engage pockets 152a, 152b to secure the plug connector within cavity 424 and individual contacts in contact pairs 401-404 of the plug connector are electrically coupled to individual contacts of contact pairs 426-429, respectively, of the receptacle connector.

Each of the contacts in contact pairs 426-429 can be is insert molded within a dielectric block 429 made from a thermoplastic or similar material with a front end of the contact extending into cavity 424 and a back end extending in the opposite direction towards a back end of the receptacle connector. In FIG. 45 only individual contacts 402b and 404a, 404b of receptacle connector 420 can be seen. The back end of each contact is electrically coupled to a bonding pad (not shown) formed on printed circuit board (PCB) 426. Conductive traces (not shown) on PCB 426 connect the contacts to circuitry associated with the electronic device in which receptacle connector 420 is housed. To reduce signal interference between contacts and improve grounding, receptacle connector 430 includes grounding contacts and a ground plane 428 that generally surround the contact pairs and divide them into quadrants that correspond to the quadrants associated with contacts 401-404. Specifically, a grounding contact can be located between each contact pair and a sidewall of housing 422 while other grounding contacts can be located between contact pairs 403, 404 and 401, 402, respectively. Each of the grounding contacts is positioned to contact a different portion of ground ring 102 when the connectors are mated. Grounding plane 428 is formed on PCB 426 and sandwiched between an upper dielectric layer 426a and a lower dielectric layer 426b. Finally, a conductive gasket 430 provides sealing and environmental shielding when jack 420 and plug connector 400 are mated.

Any of the connectors discussed herein can be modified to include one or more fiber optic cables that extend through the connector and can be operatively coupled to receive or transmit optical data signals between a mating connector jack. As an example, FIGS. 46A-46D illustrate one example of a connector 440 having five analog contacts as well as a fiber optic cable 445 that runs through the center of the connector. The analog contacts include contacts 112a, 112c for left and right audio, a contact 112b for microphone, a contact 112d for power, and a contact 222e for ground. Fiber optic cable 230 allows for high data rate transmissions and can be used for USB 4.0 compatibility (e.g., 10 GB/second data transfer). With power, audio and data connections, connector 440 can be used to charge a device while simultaneously providing data and audio functions.

As shown in FIG. 46D, which is an expanded view of the distal end of connector 440, fiber optic cable 445 terminates at a lens 446 positioned at the distal end of the connector and secured in place by ground ring 425. Lens 446 can be made from a chemically strengthened aluminosilicate glass or a similar material that is highly resistant to scratching and is flush with the external surface of ground ring 425 to prevent debris build-up and abstraction of light.

Some embodiments of the invention pertain to connectors specifically designed for specific functions, for example as required by certain accessories or cable adapters, as described below with respect to FIGS. 47-59. In the described embodiments and unless otherwise noted, each of the connectors described with respect to FIGS. 47-59 includes a connector tab that is similarly designed in shape and dimensions to tab 44 of plug connector 300 shown in FIG. 32, including contact spacing and side retention pockets, so that the various connector tabs are generally insertable and useable with the same receptacle connector as plug connector 300. Also, each of the connectors described in FIGS. 47-59 includes a ground ring that enables the connector to be connected to ground via grounded retention clips in a corresponding receptacle connector as described above.

As a first example of a specifically purposed connector, FIG. 47 is a simplified perspective view of a plug connector 500 according to an embodiment of the invention specifically designed for headphones and other audio applications. Connector 500 includes four contacts, two contacts on an upper surface of a tab portion 502 of the connector and two contacts on the lower surface of connector tab 502. The four contacts provide left and right audio as well as microphone power, and are sized and spaced such that they match the locations of contacts $302_{(3)}$ and $302_{(4)}$ on one side and match the location, size and spacing of contacts $302_{(9)}$ and $302_{(10)}$ on the other side. Thus, as shown in FIG. 49A, the two contacts on each side can be used to represent power and audio and align (depending on the orientation of connector 500) with either the power and audio contacts shown in FIG. 34A or shown in FIG. 34B. In one embodiment, circuitry associated with an electronic device in which connector 500 can be plugged into allows the contacts to be used in a backward compatible mode where the power contact is replaced with a Microphone Bias contact as shown in FIG. 49B. FIG. 48 is a simplified perspective view of a headset 510 that includes connector 500 shown in FIG. 47 according to an embodiment of the invention including left and right earbuds 512, 514 connected to connector 500 by a cable 516.

Figure 50:
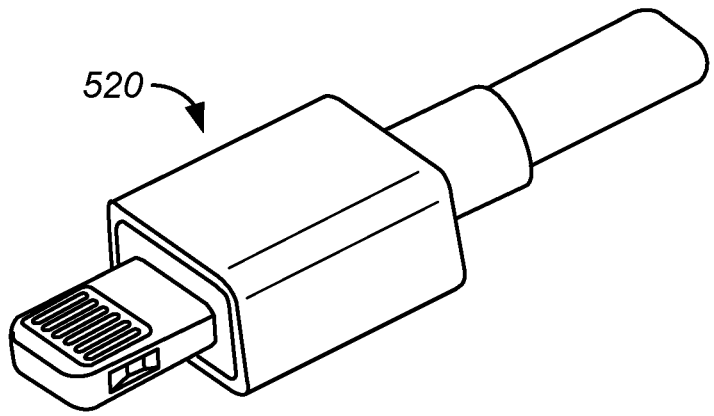
FIG. 50 is a simplified perspective view of a connector plug 170 according to another embodiment of the invention.
Figure 51:
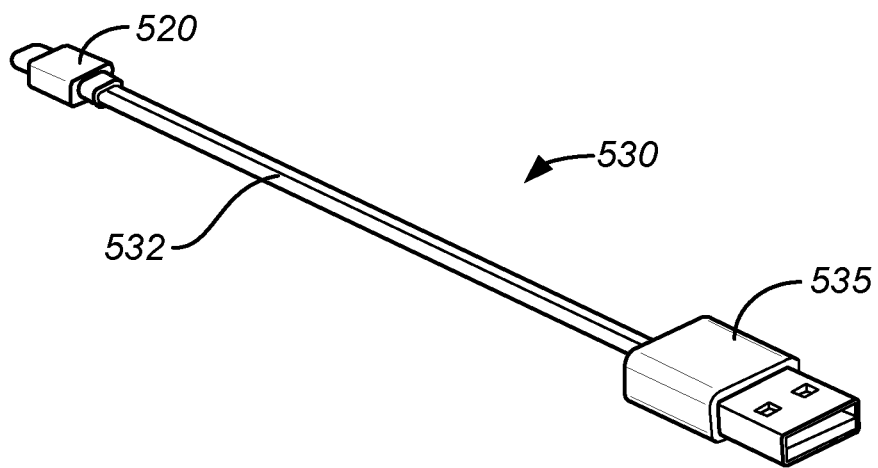
FIG. 51 is a simplified perspective view of a USB adapter cable 180 having a USB connector at one end and connector 170 shown in FIG. 50 at the other end according to an embodiment of the invention.
Figure 52:
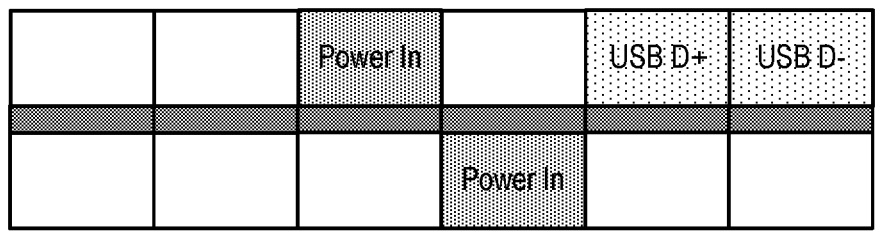
FIG. 52 is a diagram depicting pin locations of connector plug 170 shown in FIG. 50 according to one embodiment of the invention.

FIG. 50 is a simplified perspective view of a connector plug 520 according to another embodiment of the invention that is specifically adapted to be used in data synchronization applications and charging applications. To this end, connector 520 includes fully functional contacts at the two locations designated for USB data that align with contact locations 302(5) and 302(6) and the two locations designated for power that align with contact locations 302(3) and 302(9) as shown in FIG. 52 as well as ground contacts that connect to connector 520 through its ground ring via the receptacle connector retention clips as described above. As configured, connector 520 allows for USB 2.0 synchronization as well as 5 volt, 2 amp charging. FIG. 51 is a simplified perspective view of a USB adapter cable 530 having a USB male connector 535 at one end and connector 520 shown in FIG. 50 at the other end according to an embodiment of the invention. The two connectors are connected together by a cable 532.

Figure 53:
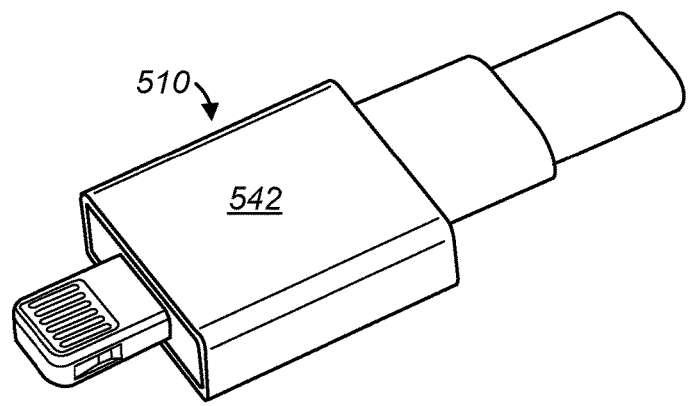
FIG. 53 is a simplified perspective view of a connector plug 190 according to another embodiment of the invention.
Figure 54:
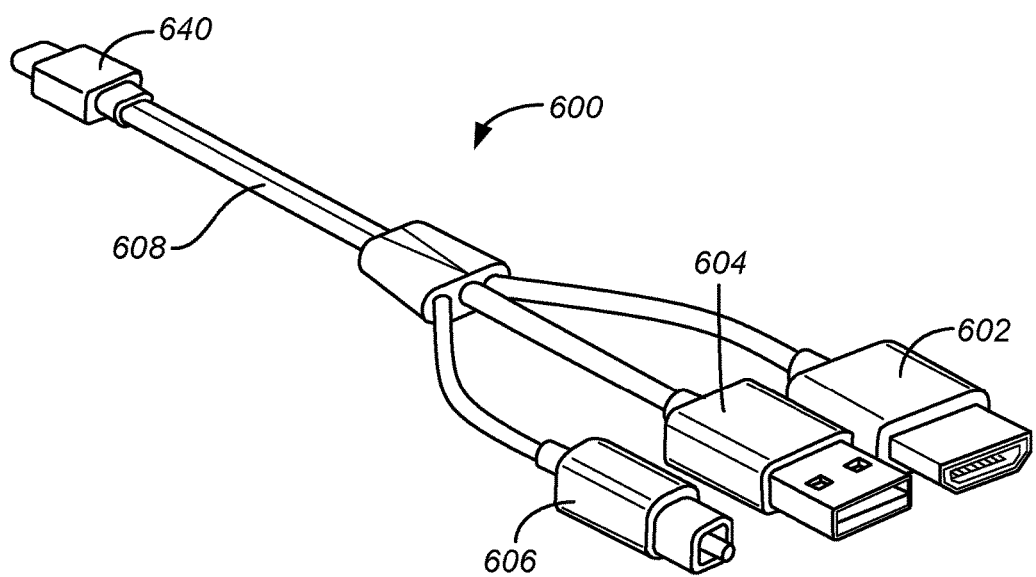
FIG. 54 is a simplified perspective view of a audio/visual adapter cable 200 having HDMI, USB and digital audio connectors at one end and connector 190 at the other end according to an embodiment of the invention.

FIG. 53 is a simplified perspective view of a connector plug 540 that supports full audio/video functionality according to another embodiment of the invention including line out audio, Mikey bus control and a two channel display port as well as USB 2.0 synchronization, 5 volt, 2 amp charging and a 3 volt accessory out signal. Connector 540 includes active circuitry (not shown) within a shell 542 that allows for conversion of display port video signals to HDMI signals. Connector 540 includes the full complement of twelve functional contacts as shown in FIGS. 34A and 34B. FIG. 54 is a simplified perspective view of a audio/visual adapter cable 600 having an HDMI connector 602, a USB connector 604 and a digital audio connector 606 at one end connected by a cable 608 to connector 540 at the other end according to an embodiment of the invention. Active circuitry within shell 542 of connector 540 separates audio and digital data send over the six display port data contacts of connector 540 sending the audio signals to both the digital audio connector 606 and HDMI connector 602 while sending the video signals to HDMI connector 602. The USB data signals can be passed through the USB contact pins of connector 540 directly to USB connector 604.

Figure 34B:
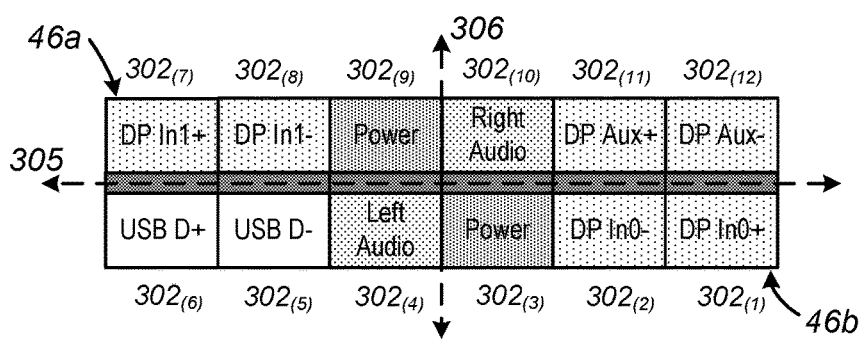

FIG. 55 is a simplified perspective view of a audio/visual adapter cable 610 having a mini display port connector 612 and a USB connector 614 at one end connected by a cable 618 to a plug connector 616 having a pinout as shown in FIGS. 34A and 34B at the other end according to another embodiment of the invention. FIG. 56 is a simplified perspective view of a audio/visual adapter cable 620 having a mini display port connector 622 at one end connected by a cable 628 to a high speed data connector 626 at the other end according to another embodiment of the invention. Connector 626 has a pinout that includes two high speed differential data input contacts and two high speed differential data output contacts as shown in FIG. 57 instead of display port contacts. The high speed data contacts allow for data transfer rates of up to 10 GB/second thereby allowing 5 GB/sec data transfer using the PCI-express 2.0 standard and 8 GB/sec data transfer using the PCI-express 3.0 standard. Active circuitry embedded in the shell of connector 626 converts the PCI-express signals as necessary to other data formats such as minidisplay port signals.

Figure 32:
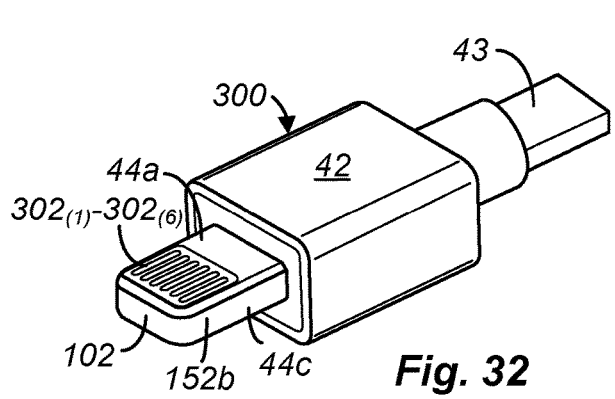
FIG. 32 is a simplified perspective view of a plug connector 300 according to one embodiment of the present invention.
Figures 58, 59:
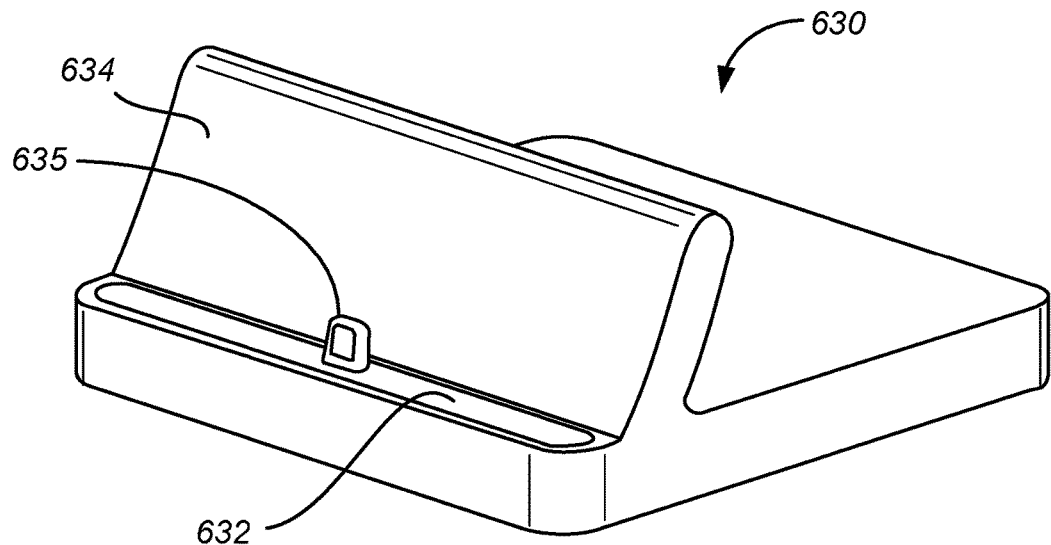
FIG. 58 is a simplified perspective view of a docking station 230 that includes a plug connector 235 according to an embodiment of the invention.
FIG. 59 is a diagram depicting pin locations of connector plug 235 shown in FIG. 52 according to one embodiment of the invention.

FIG. 58 is a simplified perspective view of a docking station 630 that includes a connector tab 635 according to an embodiment of the invention that has the same form factor and contact arrangement as tab 44 in FIG. 32. Tab 635 extends upward from a surface 632 upon which a portable electronic device may be placed when docked in station 630 with tab 635 mated with a receptacle connector incorporated into the portable media device. A second surface 634 can support a back of the electronic device while docked.

Docking station 630 allows a portable media device, such as an iPod or MP3 player or an iPhone or other smart phone to be connected to a host computer via connector 635. Connector 635 supports the full complement of twelve contacts set forth in FIGS. 34A and 34B and thus allows for line out audio, Mikey bus control and a two channel display port as well as USB 2.0 synchronization, 5 volt, 2 amp charging and a 3 volt accessory out signal. In another embodiment, docking station 630 does not provide full audio/video support and instead provides charging and USB data transfer as well as audio out and legacy/UART (universal asynchronous receiver/transmitter) control. FIG. 59 is a diagram depicting pin locations of connector tab 635 shown in FIG. 58 according to this additional embodiment with reduced contact pins in tab 635.

While the discussion of various particular connectors for accessories, cable adapters or other devices set forth above with respect to FIGS. 47-59 specifically included twelve contact connectors having a connector layout compatible with that of plug connector 300 discussed with respect to FIGS. 32-34B, embodiments of the invention are not so limited. In other embodiments, similar or identical accessories, cable adapters and other devices may include connectors having twelve contacts arranged in a different layout than connector 300 or having contacts dedicated to different signals or signals arranged in a different order. Additionally, still other embodiments include similar or identical accessories, cable adapters and other devices that include connectors with fewer or more contacts than connector 300. A person of skill in the art will readily recognize these and other alternative embodiments of the present invention based on the disclosure herein.

Embodiments of the invention are suitable for a multiplicity of electronic devices, including any device that receives or transmits audio, video or data signals among others. In some instances, embodiments of the invention are particularly well suited for portable electronic media devices because of their potentially small form factor. As used herein, an electronic media device includes any device with at least one electronic component that may be used to present human-perceivable media. Such devices may include, for example, portable music players (e.g., MP3 devices and Apple's iPod devices), portable video players (e.g., portable DVD players), cellular telephones (e.g., smart telephones such as Apple's iPhone devices), video cameras, digital still cameras, projection systems (e.g., holographic projection systems), gaming systems, PDAs, desktop computers, as well as tablet (e.g., Apple's iPad devices), laptop or other mobile computers. Some of these devices may be configured to provide audio, video or other data or sensory output.

Figure 60:
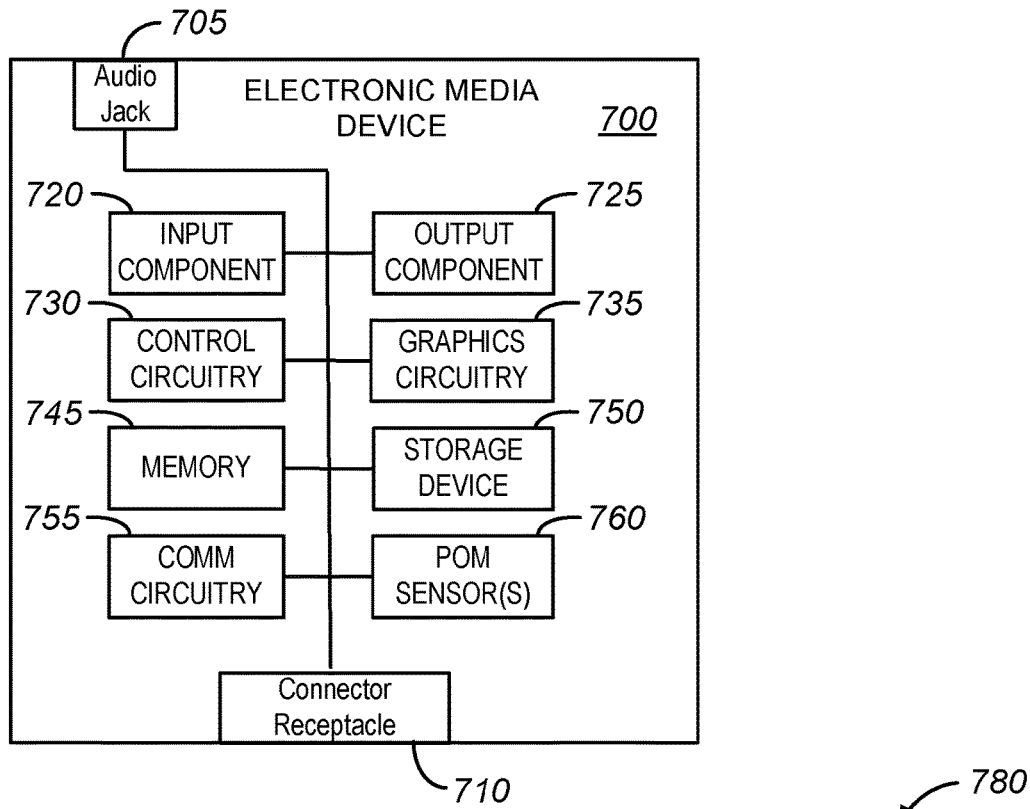

FIG. 60 is a simplified illustrative block diagram representing an electronic media device 700 that includes an audio plug receptacle 705 according to embodiments of the present. Electronic media device 700 may also include, among other components, connector receptacle 710, one or more user input components 720, one or more output components 725, control circuitry 730, graphics circuitry 735, a bus 740, a memory 745, a storage device 750, communications circuitry 755 and POM (position, orientation or movement sensor) sensors 760. Control circuitry 730 may communicate with the other components of electronic media device 700 (e.g., via bus 740) to control the operation of electronic media device 700. In some embodiments, control circuitry 730 may execute instructions stored in a memory 745. Control circuitry 730 may also be operative to control the performance of electronic media device 700. Control circuitry 730 may include, for example, a processor, a microcontroller and a bus (e.g., for sending instructions to the other components of electronic media device 700). In some embodiments, control circuitry 730 may also drive the display and process inputs received from input component 720.

Memory 745 may include one or more different types of memory that may be used to perform device functions. For example, memory 745 may include cache, flash memory, ROM, RAM and hybrid types of memory. Memory 745 may also store firmware for the device and its applications (e.g., operating system, user interface functions and processor functions). Storage device 750 may include one or more suitable storage mediums or mechanisms, such as a magnetic hard drive, flash drive, tape drive, optical drive, permanent memory (such as ROM), semi-permanent memory (such as RAM) or cache. Storage device 750 may be used for storing media (e.g., audio and video files), text, pictures, graphics, advertising or any suitable user-specific or global information that may be used by electronic media device 700. Storage device 750 may also store programs or applications that may run on control circuitry 730, may maintain files formatted to be read and edited by one or more of the applications and may store any additional files that may aid the operation of one or more applications (e.g., files with metadata). It should be understood that any of the information stored on storage device 750 may instead be stored in memory 745.

Electronic media device 700 may also include input component 720 and output component 725 for providing a user with the ability to interact with electronic media device 700.

For example, input component 720 and output component 725 may provide an interface for a user to interact with an application running on control circuitry 730. Input component 720 may take a variety of forms, such as a keyboard/keypad, trackpad, mouse, click wheel, button, stylus or touch screen. Input component 720 may also include one or more devices for user authentication (e.g., smart card reader, fingerprint reader or iris scanner) as well as an audio input device (e.g., a microphone) or a video input device (e.g., a camera or a web cam) for recording video or still frames. Output component 725 may include any suitable display, such as a liquid crystal display (LCD) or a touch screen display, a projection device, a speaker or any other suitable system for presenting information or media to a user. Output component 725 may be controlled by graphics circuitry 735. Graphics circuitry 735 may include a video card, such as a video card with 2D, 3D or vector graphics capabilities. In some embodiments, output component 725 may also include an audio component that is remotely coupled to electronic media device 700. For example, output component 725 may include a headset, headphones or ear buds that may be coupled to electronic media device 700 with a wire or wirelessly (e.g., Bluetooth headphones or a Bluetooth headset).

Electronic media device 700 may have one or more applications (e.g., software applications) stored on storage device 750 or in memory 745. Control circuitry 730 may be configured to execute instructions of the applications from memory 745. For example, control circuitry 730 may be configured to execute a media player application that causes full-motion video or audio to be presented or displayed on output component 725. Other applications resident on electronic media device 700 may include, for example, a telephony application, a GPS navigator application, a web browser application and a calendar or organizer application. Electronic media device 700 may also execute any suitable operating system, such as a Mac OS, Apple iOS, Linux or Windows and can include a set of applications stored on storage device 750 or memory 745 that is compatible with the particular operating system.

In some embodiments, electronic media device 700 may also include communications circuitry 755 to connect to one or more communications networks. Communications circuitry 755 may be any suitable communications circuitry operative to connect to a communications network and to transmit communications (e.g., voice or data) from electronic media device 700 to other devices within the communications network. Communications circuitry 755 may be operative to interface with the communications network using any suitable communications protocol such as, for example, Wi-Fi (e.g., a 802.11 protocol), Bluetooth, high frequency systems (e.g., 900 MHz, 2.4 GHz and 5.6 GHz communication systems), infrared, GSM, GSM plus EDGE, CDMA, quadband and other cellular protocols, VOIP or any other suitable protocol.

In some embodiments, communications circuitry 755 may be operative to create a communications network using any suitable communications protocol. Communications circuitry 755 may create a short-range communications network using a short-range communications protocol to connect to other devices. For example, communications circuitry 755 may be operative to create a local communications network using the Bluetooth protocol to couple with a Bluetooth headset (or any other Bluetooth device). Communications circuitry 755 may also include a wired or wireless network interface card (NIC) configured to connect to the Internet or any other public or private network. For example, electronic media device 700 may be configured to connect to the Internet via a wireless network, such as a packet radio network, an RF network, a cellular network or any other suitable type of network. Communication circuitry 755 may be used to initiate and conduct communications with other communications devices or media devices within a communications network.

Electronic media device 700 may also include any other component suitable for performing a communications operation. For example, electronic media device 700 may include a power supply, an antenna, ports or interfaces for coupling to a host device, a secondary input mechanism (e.g., an ON/OFF switch) or any other suitable component.

Electronic media device 700 may also include POM sensors 760. POM sensors 760 may be used to determine the approximate geographical or physical location of electronic media device 700. As described in more detail below, the location of electronic media device 700 may be derived from any suitable trilateration or triangulation technique, in which case POM sensors 760 may include an RF triangulation detector or sensor or any other location circuitry configured to determine the location of electronic media device 700.

POM sensors 760 may also include one or more sensors or circuitry for detecting the position orientation or movement of electronic media device 700. Such sensors and circuitry may include, for example, single-axis or multi-axis accelerometers, angular rate or inertial sensors (e.g., optical gyroscopes, vibrating gyroscopes, gas rate gyroscopes or ring gyroscopes), magnetometers (e.g., scalar or vector magnetometers), ambient light sensors, proximity sensors, motion sensor (e.g., a passive infrared (PIR) sensor, active ultrasonic sensor or active microwave sensor) and linear velocity sensors. For example, control circuitry 730 may be configured to read data from one or more of POM sensors 760 in order to determine the location orientation or velocity of electronic media device 700. One or more of POM sensors 760 may be positioned near output component 725 (e.g., above, below or on either side of the display screen of electronic media device 700).

Figure 61:
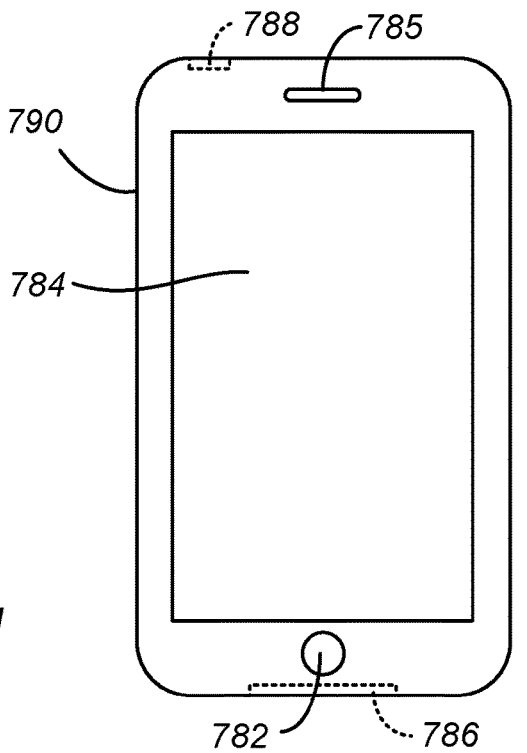
FIG. 61 depicts an illustrative rendering of one particular embodiment of an electronic media device suitable for use with embodiments of the present invention.

FIG. 61 depicts an illustrative rendering of one particular electronic media device 780. Device 780 includes a multipurpose button 782 as an input component, a touch screen display 784 as a both an input and output component, and a speaker 785 as an output component, all of which are housed within a device housing 790. Device 780 also includes a primary receptacle connector 786 and an audio plug receptacle 788 within device housing 790. Each of the receptacle connectors 786 and 788 can be positioned within housing 790 such that the cavity of the receptacle connectors into which a corresponding plug connector is inserted is located at an exterior surface of the device housing. In some embodiments, the cavity opens to an exterior side surface of device 780. For simplicity, various internal components, such as the control circuitry, graphics circuitry, bus, memory, storage device and other components are not shown in FIG. 61. Receptacle connectors according to embodiments of the invention are particularly suitable to be used as either or both of primary receptacle 786 or audio plug receptacle 788. Additionally, in some embodiments, electronic media device 780 has only a single receptacle connector that is used to physically interface and connect the device (as opposed to a wireless connection) to the other electronic devices. Embodiments of the invention are also particularly suitable for such a connector.

As will be understood by those skilled in the art, the present invention may be embodied in many other specific forms without departing from the essential characteristics thereof. As an example, while a number of embodiments illustrated above included ground contacts that were incorporated into the retention features, both in the plug connector as well as the receptacle connector, other embodiments of the invention may include ground contacts along portions of the side or tip of the connector that is not part of a retention mechanism. Similarly, some embodiments may not include any contacts at all on the side of the connector tab and instead may include both signal and ground contacts on the first and second major opposing surfaces of the connector tab. In such embodiments, ground contacts can be located within the contact regions 46a, 46b and/or may be located at one or more locations on major sides 44a, 44b outside of contact regions 46a, 46b.

Also, while a number of specific embodiments were disclosed with specific features, a person of skill in the art will recognize instances where the features of one embodiment can be combined with the features of another embodiment. For example, some specific embodiments of the invention set forth above were illustrated with pockets as retention features. A person of skill in the art will readily appreciate that any of the other retention features described herein, as well as others not specifically mentioned, may be used instead of or in addition to the pockets. Also, those skilled in the art will recognize, or be able to ascertain using no more than routine experimentation, many equivalents to the specific embodiments of the inventions described herein. Such equivalents are intended to be encompassed by the following claims.

What is claimed is:

1. A method of manufacturing a plug connector, the method comprising:
   providing a printed circuit board having a plurality of contact pads at a first end and a plurality of solder pads at a second end opposing the first end;
   attaching a plurality of contacts to corresponding contact pads;
   inserting the printed circuit board and attached plurality of contacts into a metal frame having an opening and aligning the plurality of contacts with the opening;
   overmolding a dielectric layer around the contacts within the opening of the metal frame leaving an outer surface of each contact in the plurality of contacts exposed;
   soldering a plurality of wires to the plurality of solder pads;
   attaching a metal shield to the metal frame, the metal shield forming an enclosure around the solder pads;
   filling the enclosure with a dielectric material; and
   adhering an outer dielectric shell to the metal shield.

2. The method of manufacturing a plug connector set forth in claim 1 wherein the overmold step comprises an injection molding process using polyoxymethylene (POM).

3. The method of manufacturing a plug connector set forth in claim 1 wherein the dielectric material used in the step of filling the enclosure comprises an elastomer material.

4. The method of manufacturing a plug connector set forth in claim 1 wherein the dielectric material used in the step of filling the enclosure comprises a polyproplylene material.

5. The method of manufacturing a plug connector set forth in claim 1 wherein the outer dielectric shell comprises acrylonitrile butadiene styrene (ABS).

6. The method of manufacturing a plug connector set forth in claim 1 wherein the metal frame comprises a ground ring that includes a tab portion, a base portion and a face that extends between the tab portion and the base portion.

7. The method of manufacturing a plug connector set forth in claim 6 further comprising sliding a dielectric trim piece over the tab portion of the ground ring and attaching the dielectric trim piece to the face of the ground ring.

8. The method of manufacturing a plug connector set forth in claim 1 wherein the plug connector is part of a charging cable.

9. The method of manufacturing a plug connector set forth in claim 1 wherein the plurality of wires are part of a cable bundle and the method further comprising attaching a cable crimp having a metal shield to the cable bundle prior to soldering the plurality of wires to the solder pads.

10. A method of manufacturing a plug connector, the method comprising:
provinding a first printed circuit board having a first plurality of contact pads at a first end and a first plurality of solder pads at a second end opposing the first end;
providing a second printed circuit board having a second plurality of contact pads at a first end;
attaching a first plurality of contacts to the first plurality of contact pads;
attaching a second plurality of contacts to the second plurality of contact pads;
inserting the first and second printed circuit boards into a metal frame having a first opening on a first side of the frame and a second opening on a second side of the frame opposite the first side, and aligning the first plurality of contacts with the first opening and aligning the second plurality of contacts with the second opening;
overmolding a dielectric layer around each of the first and second plurality of contacts within the first and second openings of the metal frame leaving an outer surface of each contact in the first and second pluralities of contacts exposed;
soldering a first plurality of wires to the first plurality of solder pads;
attaching a metal shield to the metal frame, the metal shield forming an enclosure around the first plurality of solder pads;
filling the enclosure with a dielectric material; and
adhering an outer dielectric shell to the metal shield.

11. The method of manufacturing a plug connector set forth in claim 10 wherein the metal frame comprises a ground ring that includes a tab portion, a base portion and a face that extends substantially vertically between the tab portion and the base portion.

12. The method of manufacturing a plug connector set forth in claim 10 wherein the second printed circuit board further includes a second plurality of solder pads at a second end opposing the first end and the method further comprises soldering a second plurality of wires to the second plurality of solder pads.

13. The method of manufacturing a plug connector set forth in claim 10 further comprising attaching a metal ground plate between the first and second printed circuit boards.

14. The method of manufacturing a plug connector set forth in claim 10 wherein the overmold step comprises an injection molding process using polyoxymethylene (POM).

15. The method of manufacturing a plug connector set forth in claim 10 wherein the dielectric material used in the step of filling the enclosure comprises an elastomer material.

16. The method of manufacturing a plug connector set forth in claim 10 wherein the dielectric material used in the step of filling the enclosure comprises a polyproplylene material.

17. The method of manufacturing a plug connector set forth in claim 10 wherein the outer dielectric shell comprises acrylonitrile butadiene styrene (ABS).

18. The method of manufacturing a plug connector set forth in claim 10 wherein the plug connector is part of a charging cable.

19. The method of manufacturing a plug connector set forth in claim 10 wherein the plurality of wires are part of a cable bundle and the method further comprising attaching a cable crimp having a metal shield to the cable bundle prior to soldering the plurality of wires to the solder pads.

20. The method of manufacturing a plug connector set forth in claim 19 wherein the step of filling the enclosure with a dielectric material forms a generally circular end portion that surrounds a portion of the cable bundle and a block portion the completes and fills gaps in the metal enclosure.

* * * * *